US007496781B2

(12) United States Patent
Tamura et al.

(10) Patent No.: US 7,496,781 B2
(45) Date of Patent: Feb. 24, 2009

(54) TIMING SIGNAL GENERATING CIRCUIT WITH A MASTER CIRCUIT AND SLAVE CIRCUITS

(75) Inventors: Hirotaka Tamura, Kawasaki (JP); Hisakatsu Yamaguchi, Kawasaki (JP); Shigetoshi Wakayama, Kawasaki (JP); Kohtaroh Gotoh, Kawasaki (JP); Junji Ogawa, Kawasaki (JP)

(73) Assignee: Fujitsu, Ltd., Kawasaki (JP)

( * ) Notice: Subject to any disclaimer, the term of this patent is extended or adjusted under 35 U.S.C. 154(b) by 206 days.

(21) Appl. No.: 10/278,800

(22) Filed: Oct. 24, 2002

(65) Prior Publication Data

US 2003/0042957 A1 Mar. 6, 2003

Related U.S. Application Data

(62) Division of application No. 09/794,084, filed on Feb. 28, 2001, now Pat. No. 6,484,268, which is a division of application No. 09/093,056, filed on Jun. 8, 1998, now Pat. No. 6,247,138.

(30) Foreign Application Priority Data

| Jun. 12, 1997 | (JP) | ................................... 9-155429 |
| Jan. 8, 1998 | (JP) | ................................ 10-002254 |
| Mar. 26, 1998 | (JP) | ................................ 10-079401 |
| May 18, 1998 | (JP) | ................................ 10-135610 |

(51) Int. Cl.
*G06F 1/04* (2006.01)
*G05F 1/12* (2006.01)
*H03L 7/06* (2006.01)

(52) U.S. Cl. ........................ 713/600; 713/503; 327/156

(58) Field of Classification Search ................. 713/600, 713/503; 327/156
See application file for complete search history.

(56) References Cited

U.S. PATENT DOCUMENTS 3,737,808 A 6/1973 Srivastava (Continued)

FOREIGN PATENT DOCUMENTS

DE 3520301 12/1985

(Continued)

OTHER PUBLICATIONS

John G. Maneatis, "Low-Jitter Process-Independent DLL and PLL Based on Self-Biased Techniques", Nov. 1996, IEEE Journal of Solid-State Circuits, vol. 31, No. 11, pp. 1723-1732.*

(Continued)

*Primary Examiner*—Thomas Lee
*Assistant Examiner*—Ji H Bae
(74) *Attorney, Agent, or Firm*—Arent Fox, LLP

(57) ABSTRACT

A semiconductor integrated circuit device has a command decoder for issuing a control command in accordance with a supplied control signal, a DRAM core, and a timing adjusting circuit for supplying the control command, set active for a predetermined period, as a DRAM control signal to the DRAM core. The timing adjusting circuit generates n different clocks that are respectively shifted in phase with respect to a supplied reference clock, and generates the DRAM control signal by setting the control command active in a prescribed operation cycle for only a period starting at a first predetermined clock pulse of a first clock of the n clocks and ending at a second predetermined clock pulse of a second clock of the n clocks. In this way, timing design with relatively high accuracy of adjustment can be done in a short period.

28 Claims, 72 Drawing Sheets

U.S. PATENT DOCUMENTS

| | | | |
|---|---|---|---|
| 4,128,201 A * | 12/1978 | Barron et al. | 714/811 |
| 4,431,969 A | 2/1984 | Summers et al. | |
| 4,623,805 A | 11/1986 | Flora et al. | 307/602 |
| 5,157,276 A | 10/1992 | Metz | |
| 5,157,277 A | 10/1992 | Tran et al. | 307/269 |
| 5,157,634 A | 10/1992 | Dhong et al. | 365/222 |
| 5,208,833 A | 5/1993 | Erbart et al. | 375/20 |
| 5,258,660 A | 11/1993 | Nelson et al. | 307/269 |
| 5,272,390 A | 12/1993 | Watson, Jr. et al. | |
| 5,287,025 A | 2/1994 | Nishimichi | 307/603 |
| 5,293,170 A * | 3/1994 | Lorenz et al. | 342/352 |
| 5,327,031 A | 7/1994 | Marbot et al. | |
| 5,465,346 A | 11/1995 | Parks et al. | |
| 5,467,040 A | 11/1995 | Nelson et al. | 327/276 |
| 5,481,372 A | 1/1996 | Kouno et al. | 358/433 |
| 5,485,490 A | 1/1996 | Leung et al. | |
| 5,546,355 A | 8/1996 | Raatz et al. | |
| 5,552,726 A * | 9/1996 | Wichman et al. | 327/149 |
| 5,554,945 A | 9/1996 | Lee et al. | |
| 5,554,949 A | 9/1996 | Suwald | 327/276 |
| 5,557,335 A | 9/1996 | Oh | 348/512 |
| 5,615,358 A | 3/1997 | Vogley | 713/501 |
| 5,636,254 A | 6/1997 | Hase et al. | |
| 5,687,202 A * | 11/1997 | Eitrheim | 375/376 |
| 5,783,956 A | 7/1998 | Ooishi | |
| 5,794,020 A | 8/1998 | Tanaka et al. | 713/401 |
| 5,835,401 A | 11/1998 | Green et al. | 365/149 |
| 5,877,641 A * | 3/1999 | Ziegler et al. | 327/156 |
| 5,901,190 A | 5/1999 | Lee | 375/373 |
| 5,944,834 A | 8/1999 | Hathaway | 713/500 |
| 5,944,836 A | 8/1999 | Edahiro | 713/503 |
| 5,953,286 A | 9/1999 | Matsubara et al. | 365/233 |
| 5,966,731 A | 10/1999 | Barth et al. | 711/167 |
| 5,987,630 A | 11/1999 | Yamawaki | 714/701 |
| 6,049,239 A * | 4/2000 | Eto et al. | 327/158 |
| 6,090,150 A | 7/2000 | Tawada | 703/19 |
| 6,127,874 A | 10/2000 | Wakabayashi et al. | 327/292 |
| 6,339,553 B1 * | 1/2002 | Kuge | 365/194 |

FOREIGN PATENT DOCUMENTS

| | | |
|---|---|---|
| DE | 19602845 | 8/1996 |
| EP | 0 306 662 A2 | 7/1988 |
| EP | 0 317 759 A2 | 10/1988 |
| EP | 0 306 662 A2 | 3/1989 |
| EP | 0 317 759 A2 | 5/1989 |
| EP | 0 476 585 A2 | 9/1991 |
| EP | 0 457 310 A2 | 11/1991 |
| EP | 0 476 585 A2 | 3/1992 |
| EP | 0 610 052 A2 | 1/1994 |
| EP | 0 610 052 A2 | 8/1994 |
| JP | 63-009246 A | 1/1988 |
| JP | 4-76610 | 3/1992 |
| JP | 05-048536 A | 2/1993 |
| JP | 05-075542 A | 3/1993 |
| JP | 05-110550 1 A | 4/1993 |
| JP | 8-18414 | 1/1996 |
| JP | 08018414 A | 1/1996 |
| KR | 94-701150 | 4/1994 |
| WO | WO 92/22060 | 12/1992 |

OTHER PUBLICATIONS

Barry Ross et al., "How Do Dallas Semiconductor Delay Lines Work?", Aug. 30, 2002, Dallas Semiconductor, App Note 209, pp. 1-4.*

Zeljko Zilic, "Phase- and Delay-Locked Loop Clock Control in Digital Systems", http://www.techonline.com, pp. 1-4.*

Korean Intellectual Property Office Notice of Preliminary Rejection, 10-2000-0084146.

"Programmable Memory Controller", IBM Technical Disclosure Bulletin, vol. 31, No. 9, Feb. 1989, pp. 351-354.

"Programmable Memory Controller", IBM Technical Disclosure Bulletin, vol. 31, No. 9, Feb. 1, 1989, pp. 351-354.

* cited by examiner

[RECEIVING END]

[RECEIVING END]

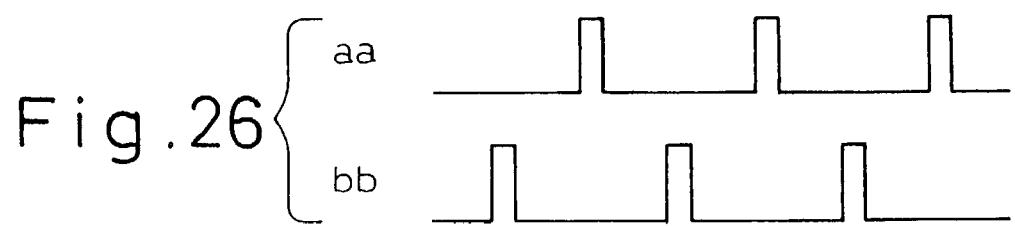
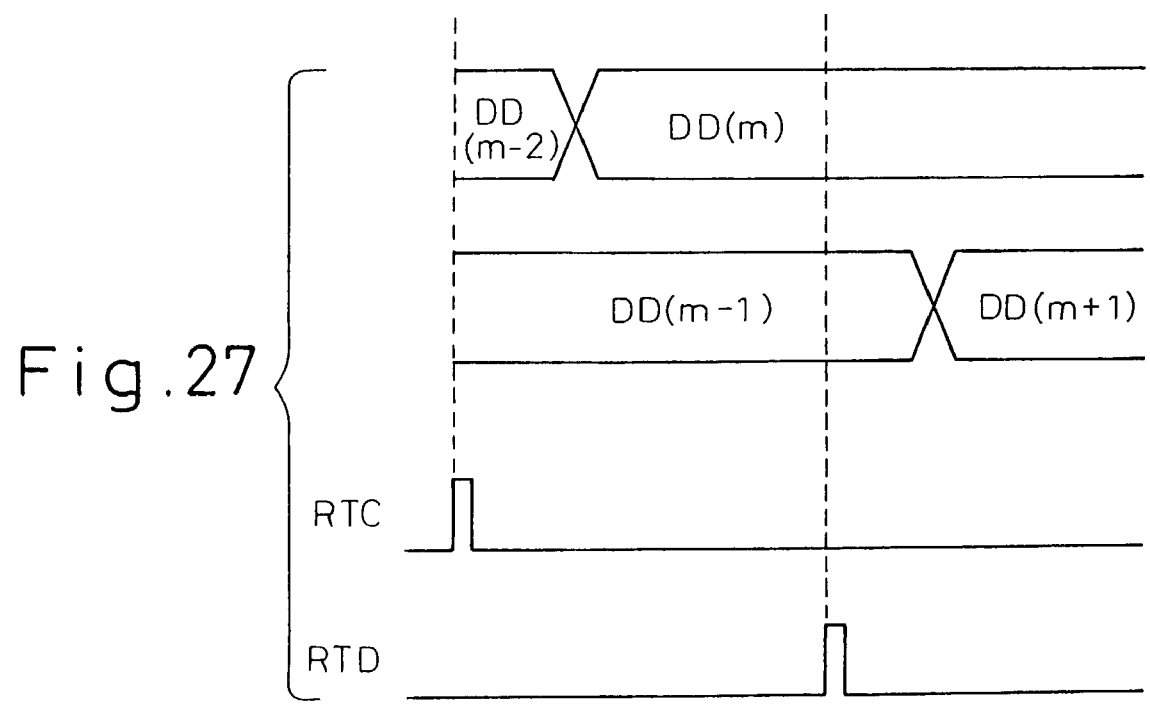

[RECEIVING END]

[RECEIVING END]

| DA | DT | DB | INTERNAL CLOCK STATE |
|---|---|---|---|
| 0 | 0 | 1 | ADVANCED: DN |
| 0 | 1 | 1 | DELAYED: UP |
| 1 | 1 | 0 | ADVANCED: DN |
| 1 | 0 | 0 | DELAYED: UP |

OUTPUT CURRENT

LL1
LL2

0  D/A INPUT CODE
(CONTROL SIGNAL: NUMBER OF TRANSISTORS CONNECTED)

TIMING SIGNAL GENERATING CIRCUIT WITH A MASTER CIRCUIT AND SLAVE CIRCUITS

This is a division of application Ser. No. 09/794,084 filed Feb. 28, 2001 (now U.S. Pat. No. 6,484,268) which is a division of application Ser. No. 09/093,056 filed Jun. 8, 1998 (now U.S. Pat. No. 6,247,138). The disclosures of the prior applications are hereby incorporated by reference herein in their entirety.

BACKGROUND OF THE INVENTION

1. Field of the Invention

The present invention relates to a timing signal generating circuit, a semiconductor integrated circuit device and semiconductor integrated circuit system to which the timing signal generating circuit is applied and a signal transmission system and, more particularly, to a timing signal generating circuit aimed at increasing the speed of signal transmission between LSI (Large Scale Integration Circuit) chips or between a plurality of devices or circuit blocks within one chip.

2. Description of the Related Art

Recently, the performance of components used in computers and other information processing apparatuses has improved rapidly; in particular, the performance of dynamic random access memories (DRAMs) and processors has improved dramatically year by year.

Namely, processor performance has increased dramatically in terms of speed, whereas DRAM performance improvements have been dramatic primarily in terms of storage capacity. However, the improvement in DRAM speed has not been so dramatic as the increase in storage capacity, as a result of which a gap between the speed of DRAMs and that of processors has widened and, in recent years, this speed gap has been becoming a bottleneck in boosting computer performance.

Further, with increasing chip size, not only signal transmission between the chips but also the speed of signal transmission between devices and between constituent circuits (circuit blocks) within one LSI chip (semiconductor integrated circuit device) is becoming a major limiting factor in chip performance.

On the other hand, if the speed of signal transmission between LSI chips is to be extremely increased, for example, it is required that signal receiving circuits be made to operate with correct timing to the signals, and techniques such as DLL (Delay Locked Loop) and PLL (Phase Locked Loop) have been known for addressing this requirement.

In addition, the need has arisen for high-speed signal transmission between LSI chips, for example, between a DRAM and a processor (logic circuit), or between a plurality of devices or circuit blocks within one LSI chip. There is, therefore, a need for a timing signal generating circuit that can generate with simple circuitry and with high accuracy a plurality of timing signals, having prescribed phase differences, synchronous with a reference clock.

Furthermore, with increasing operating speeds of LSIs, there is also a need for a signal transmission system that can perform large-capacity signal transmission at high speed between LSIs and between apparatuses constructed with a plurality of LSIs.

The prior art and the problems associated with the prior art will be described in detail later with reference to drawings.

SUMMARY OF THE INVENTION

An object of a first aspect of the present invention is to provide a semiconductor integrated circuit device that permits timing design with relatively high adjustment accuracy to be done in a short period. An object of a second aspect of the present invention is to provide a signal transmission system capable of high-speed, error-free signal transmission without being affected by skew on each signal line. An object of a third aspect of the present invention is to provide a timing signal generating circuit that can generate with simple circuitry and with high accuracy a plurality of timing signals, having prescribed phase differences, synchronous with a reference clock.

According to the present invention, there is provided a semiconductor integrated circuit device having a command decoder for issuing a control command in accordance with a supplied control signal, a DRAM core, and a timing adjusting circuit for supplying the control command, set active for a predetermined period, as a DRAM control signal to the DRAM core, wherein the timing adjusting circuit generates n different clocks that are respectively shifted in phase with respect to a supplied reference clock, and generates the DRAM control signal by setting the control command active in a prescribed operation cycle only for a period starting at a first predetermined clock pulse of a first clock of the n clocks and ending at a second predetermined clock pulse of a second clock of the n clocks.

The timing adjusting circuit may include a logic gate for enabling the generated DRAM control signal for output only for a period during which the control command is issued. The semiconductor integrated circuit device may include an MPU that accesses the DRAM. The timing adjusting circuit may include a first counter for counting the first clock; a second counter for counting the second clock; and a timing buffer circuit for generating the DRAM control signal by setting the control command active for a period starting from the time that the count value of the first counter reaches a first value and lasting until the time that the count value of the second counter reaches a second value.

The first counter and the second counter may be loop counters. At least, either one of the first and second counters may include a selection circuit for accepting multiple bit outputs from the counter, and for selecting one bit output out of the multiple bit outputs for output in accordance with a selection control input value; and a timing setting section for storing and outputting the selection control input value.

The timing setting section may be a register. The output of the timing setting section may be set before shipment in accordance with production process conditions. The output of the timing setting section may be set before shipment in accordance with required operating speed.

The timing adjusting circuit may include a common counter for counting one of the n clocks, or the reference clock, as a common clock; a first logic gate for enabling one of the n clocks for output only for a period during which the count value of the common counter shows a first value; a second logic gate for enabling one of the n clocks for output only for a period during which the count value of the common counter shows a second value; and a timing buffer circuit for generating the DRAM control signal by setting the control command active for a period starting from the time that the output of the first logic gate becomes active and lasting until the time that the output of the second logic gate becomes active.

The common counter may be a loop counter. The common counter may include a selection circuit for accepting multiple bit outputs from the counter, and for selecting one bit output out of the multiple bit outputs for output in accordance with a selection control input value; and a timing setting section for storing and outputting the selection control input value.

The semiconductor integrated circuit device may include a logic gate for supplying the common clock to the first counter only for a period during which the control command is issued. The command decoder may include a logic gate for enabling the first value indicated as the count value of the first counter for output to the timing buffer circuit only for the period during which the control command is issued.

The semiconductor integrated circuit device may include a selection circuit for selecting one of the n clocks in accordance with a selection control input value and for supplying the selected clock as a clock to the first logic gate or the second logic gate, and a timing setting section for storing and outputting the selection control input value. The timing setting section may be a register. The output of the timing setting section may be set before shipment in accordance with production process conditions. The output of the timing setting section may be set before shipment in accordance with required operating speed.

According to the present invention, there is also provided a timing adjusting circuit for generating n different clocks that are respectively shifted in phase with respect to a supplied reference clock, and for generating a control signal by being set in an active state in a prescribed operation cycle only for a period starting at a first predetermined clock pulse of a first clock of the n clocks and ending at a second predetermined clock pulse of a second clock of the n clocks.

Further, according to the present invention, there is provided a signal transmission system for transmitting and receiving signals using a plurality of signal lines, comprising a timing adjusting unit for adjusting the amount of signal delay caused during the transmission and reception of the signals in accordance with skew on each of the signal lines, thereby adjusting signal latch timing at a receiving circuit provided for each of the signal lines so that the latch timing becomes optimum for the signal line.

The timing adjusting unit may give, in effect, a variable delay to a clock used to drive each of the receiving circuits to latch each of the signals. The timing adjusting unit may include a phase interpolator that generates from a plurality of clocks with different phases a new clock having an intermediate phase. The timing adjusting unit may include a phase interpolator that generates from a plurality of clocks with different delay amounts a new clock having an intermediate delay amount. The timing adjusting unit may give, in effect, a variable delay to each of the signals at transmitting end.

The signal transmission system may further comprise a retiming circuit for retiming the plurality of signals latched at optimum timing from the plurality of signal lines so that all of the plurality of signals change synchronously with a common clock; and a deskew circuit for inserting, in the event of occurrence of a skew greater than or equal to a data cycle, a necessary amount of delay equivalent to an integral multiple of the data cycle.

The timing adjusting unit may include a plurality of latch circuits for latching the signals, and interleaving operations between two or more parts may be performed using the plurality of latch circuits. The plurality of latch circuits that perform the interleaving operations may be each constructed as a circuit employing a PRD method. The clock used to drive each of the receiving circuits to latch each of the signals may be derived from a signal on a dedicated clock line. The clock used to drive each of the receiving circuits to latch each of the signals may be generated internally, based on a phase comparison between a signal on a data line or a dedicated clock line and a reference clock internal to the receiving circuit.

The timing adjusting unit may include, at a receiving end, an optimum timing determining unit for determining an optimum point of the signal latch timing, and the optimum timing determining unit may determine the optimum point of the signal latch timing by using a first clock and a second clock having a predetermined phase difference with respect to the first clock.

The second clock may have a phase difference of approximately 180 degrees with respect to the first clock. The optimum timing determining unit may detect a data transient region by using the first clock and may determine the optimum point of the signal latch timing by using the second clock so that signal latching at the receiving circuit is achieved at optimum timing. The timing adjusting unit may include, at receiving end, an optimum timing determining unit for determining an optimum point of the signal latch timing, and the optimum timing determining unit may determine the optimum point of the signal latch timing by using a clock having a duty cycle of approximately 50%.

The optimum timing determining unit may detect a data transient region by using the clock and may determine the optimum point of the signal latch timing by using the complement of the clock so that signal latching at the receiving circuit is achieved at optimum timing. The timing adjusting unit may include, at transmitting end, an optimum timing determining unit for determining an optimum point of the signal latch timing, and the optimum timing determining unit may transmit data at such timing that a clock, at receiving end, occurs at an optimum point of data.

The optimum timing determining unit may include a calibration mode for transmitting data at first timing and a data transmission mode for transmitting data at timing shifted by a predetermined phase difference with respect to the first timing, and wherein the calibration mode may detect a transient region in the data of the first timing by using the clock at the receiving end, and the data transmission mode may ensure that the data of the timing shifted by the predetermined phase difference with respect to the first timing is latched by the receiving circuit by using the clock at the receiving end. The timing shifted by the predetermined phase difference with respect to the first timing may be timing having a phase difference of approximately 180 degrees with respect to the first timing.

The signal transmission system may further comprise a phase information extracting unit for extracting phase information of a clock on a clock line or a data line; and a storing unit for sending the phase information of the clock to each of the receiving circuits, and for storing for each of the receiving circuits a relative phase value representing the phase difference between the optimum receiving timing required at each of the receiving circuits and the clock actually used and wherein, when performing the signal latching, the optimum receiving timing at each of the receiving circuits is determined by taking a sum of the phase information of the clock and the stored relative phase value for each of the receiving circuits.

The timing adjusting unit may include, at receiving end, a delay circuit for delaying data. The delay circuit may be constructed as a variable delay circuit capable of delaying an analog signal.

Further, according to the present invention, there is also provided a timing signal generating circuit comprising a master circuit for generating by feedback control an internal signal having the same cycle or the same phase as that of an input reference signal; and a slave circuit for generating a timing signal having a prescribed timing relative to the reference signal by receiving the internal signal and a control signal from the master circuit.

A plurality of slave circuits may be provided for one master circuit. The master circuit may contain a circuit corresponding to the slave circuit so that the master circuit may also output a timing signal by itself.

The master circuit may comprise a comparator circuit for comparing the cycle or phase of the internal signal with that of the reference signal, a control signal generating circuit for varying the control signal in accordance with an output of the comparator circuit, and a variable delay line for outputting the internal signal by controlling a delay amount for the reference signal in accordance with the control signal.

The master circuit may be a DLL circuit which comprises a coarse delay control block for performing coarse delay control and a fine delay control block for performing fine delay control, and the slave circuit contains a circuit corresponding to the fine delay control block. The coarse delay control block may take taps off the delay line consisting of a plurality of delay units, and may perform coarse delay control by selecting an output of each of the taps, while the fine delay control block receives a signal for controlling the DLL circuit in the coarse delay control block and a signal subjected to the coarse delay control in the coarse delay control block, and performs fine delay control through an interpolator by using the coarse delay control signal.

The control signal generating circuit may include a charge pump circuit for controlling an output voltage level in accordance with an up signal and a down signal from the comparator circuit. The control signal generating circuit may include an up-down counter for counting an up signal and down signal from the comparator circuit and a D/A converter for performing digital-to-analog conversion on an output of the up-down counter.

The master circuit may comprise a comparator circuit for comparing the cycle or phase of the internal signal with that of the reference signal, a control signal generating circuit for varying the control signal in accordance with an output of the comparator circuit, and a voltage-controlled oscillator for generating an internal signal corresponding to the reference signal in accordance with the control signal.

The slave circuit may include a voltage-controlled oscillator for outputting the timing signal in accordance with the control signal from the master circuit. The control signal generating circuit may include a charge pump circuit for controlling an output voltage level in accordance with an up signal and down signal from the comparator circuit. The control signal generating circuit may include an up-down counter for counting an up signal and a down signal from the comparator circuit and a D/A converter for performing digital-to-analog conversion on an output of the up-down counter.

The slave circuit may include a variable delay line for outputting the timing signal by delaying the internal signal in accordance with the control signal from the master circuit. The slave circuit may include a phase interpolator for accepting input signals of different phases and for outputting a finer timing signal of an intermediate phase.

The input signals of different phases may be three-phase or four-phase clocks. The phase interpolator may include a voltage-to-current converting unit for converting a plurality of input voltage signals respectively to current signals, a current-to-voltage converting unit for converting the converted current signals back to voltage signals by varying voltage conversion factors, and a comparing unit for comparing a sum of the converted current signals with the reference signal.

The control signal sent from the master circuit to the slave circuit may be a control current signal. A control current signal generating circuit for generating the control current signal may be provided in the master circuit, and a current-to-voltage conversion circuit for converting the control current signal to a voltage signal may be provided in the slave circuit. The slave circuit may include an amplifier circuit whose response speed varies in accordance with a signal from the master circuit, and may generate a signal of sinusoidal waveform as the timing signal.

The slave circuit may be used to generate a timing signal for controlling the timing of one-bit or multiple-bit input or output signals, and the timing signal generating circuit may include timing signal adjusting unit, provided common to each of the slave circuits, for adjusting the timing signal so as to increase the S/N ratio of a transmitted and received signal. The timing signal adjusting unit may include a selecting unit for selecting an input or output signal of a circuit controlled by the timing signal from each slave circuit, and a timing signal generating unit for controlling output timing of the timing signal by detecting the level of the input or output signal of the circuit selected by the selecting unit.

The slave circuit may be used to generate a timing signal for controlling the timing of one-bit or multiple-bit input or output signals, and each of the slave circuits may include a timing signal adjusting unit for adjusting the timing signal so as to increase the S/N ratio of a transmitted and received signal.

In addition, according to the present invention, there is provided a semiconductor integrated circuit device employing a timing signal generating circuit comprising a master circuit and at least one slave circuit, the master circuit and the slave circuit being formed on the same semiconductor chip used for the semiconductor integrated circuit device, wherein the master circuit generates an internal signal having the same cycle or the same phase as that of an input reference signal by feedback control; and the slave circuit generates a timing signal having prescribed timing relative to the reference signal by receiving the internal signal and a control signal from the master circuit.

Furthermore, according to the present invention, there is also provided a semiconductor integrated circuit system employing a timing signal generating circuit comprising a master circuit and at least one slave circuit, the semiconductor integrated circuit system having a plurality of semiconductor integrated circuit devices, each of the semiconductor integrated circuit devices having the master circuit and/or the slave circuit and being formed on corresponding one semiconductor chip, wherein the master circuit generates an internal signal having the same cycle or the same phase as that of an input reference signal by feedback control; and the slave circuit generates a timing signal having prescribed timing relative to the reference signal by receiving the internal signal and a control signal from the master circuit.

According to the present invention, there is provided a phase interpolator comprising an analog periodic waveform generating unit for generating an analog periodic waveform, whose value varies in an analog fashion, from a digital periodic signal whose amplitude represents a digital value; a summed waveform generating unit for generating a summed waveform by summing a plurality of analog periodic waveforms obtained by the analog periodic waveform generating unit from digital periodic signals displaced along time axis; a weighting control unit for controlling the weighting of each of the analog periodic waveforms; and an analog/digital converting unit for converting the summed waveform to a digital waveform.

The analog periodic waveform generating unit may include a sine wave generating circuit, and the weighting control unit may include a plurality of transfer gates connected in parallel and controlled for connection. Each transfer gate in the weighting control unit may have a transistor of the same size, and the weighting of the analog periodic waveform may be controlled by controlling the number of transfer gates caused to conduct. Each transfer gate in the weighting control unit may have a transistor of a different size, and the weighting of the analog periodic waveform may be controlled by causing at least one transfer gate having a transistor of a prescribed size to conduct.

The analog periodic waveform generating unit may include a plurality of CMOS inverters, and the weighting control unit may control the number of CMOS inverters to be connected. The analog periodic waveform generating unit may include a plurality of CMOS inverter output stages, and the weighting control unit may control the number of output transistors forming the plurality of CMOS inverter output stages.

The analog periodic waveform generating unit may be a high-frequency attenuation circuit for attenuating high-frequency components of the digital periodic signal, and the weighting control unit may convert an output of the high-frequency attenuation circuit into a current by means of a variable transconductor and apply the converted current to a common terminal. The analog periodic waveform generating unit may be an integrator circuit. The analog periodic waveform generating unit and the summed waveform generating unit may comprise a current polarity switching unit for switching the polarity of a current flowing from a constant current source to a common capacitive load by the digital periodic signal; and a current value control unit for controlling a current value of the current source.

The current value control unit may control the current value of the current source by an output of a D/A converter. The analog/digital converting unit may be a comparator for comparing the summed waveform with a reference level for conversion into a digital waveform. The weighting control unit may include a current-output D/A converter, and an output of the D/A converter may be controlled by being switched for connection to either a capacitive-coupled terminal or its complementary terminal.

The weighting control unit may be configured to vary the number of current sources to be connected to a load capacitance terminal. The weighting control unit may include a clamp circuit for holding a terminal voltage level within a fixed range. The phase interpolator may be configured so that the size of transistors to be switched and the quantization step size of a D/A converter are made variable to provide a desired linearity characteristic to a timing output versus a control signal.

BRIEF DESCRIPTION OF THE DRAWINGS

The present invention will be more clearly understood from the description of the preferred embodiments as set forth below with reference to the accompanying drawings, wherein:

FIG. 26 is a timing diagram (part 1) for explaining one example of operation in the signal transmission system of FIG. 25;

FIG. 27 is a timing diagram (part 2) for explaining one example of operation in the signal transmission system of FIG. 25;

DESCRIPTION OF THE PREFERRED EMBODIMENTS

Before describing embodiments according to each mode of the present invention, a prior art semiconductor integrated circuit device will be described first.

Figure 1:
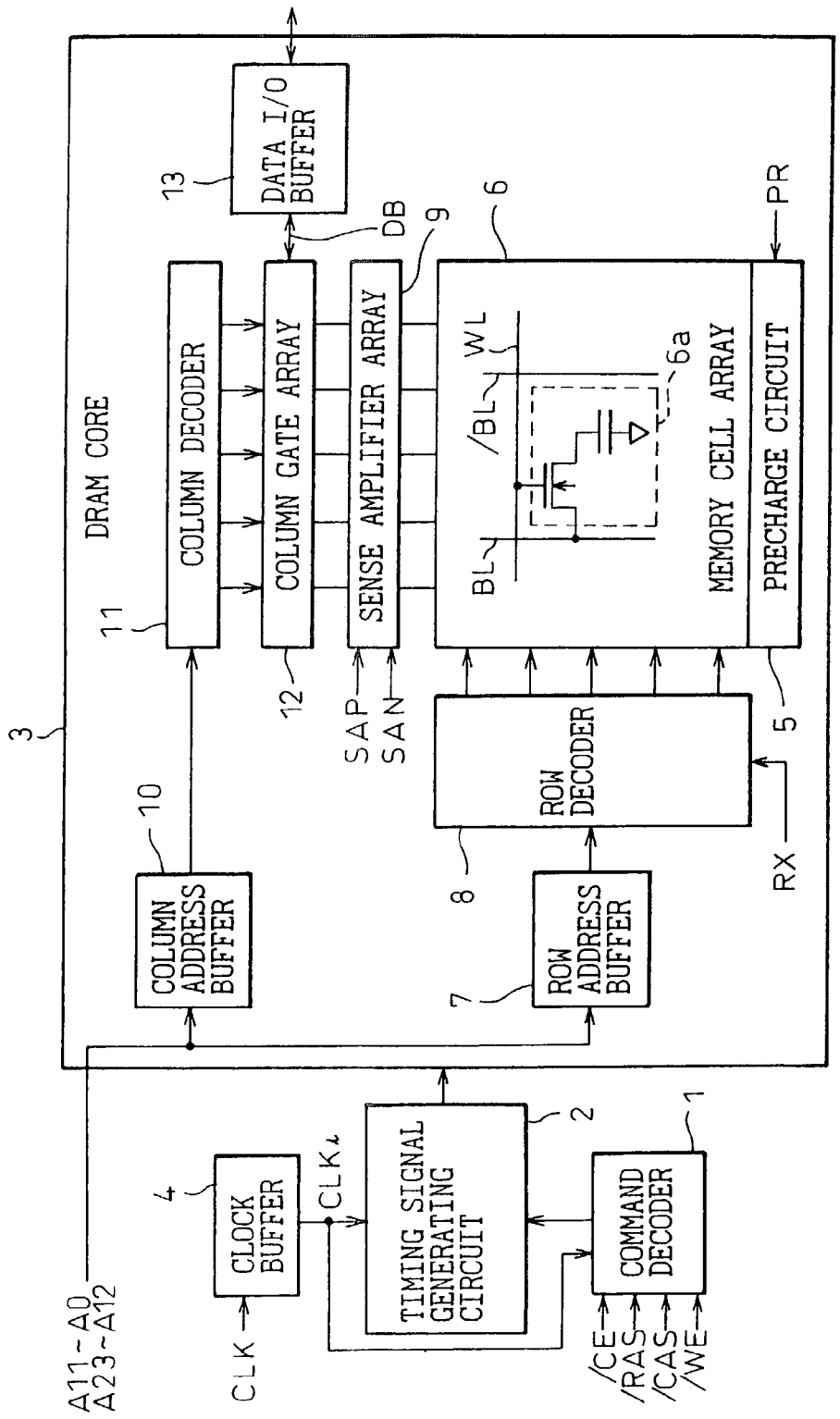
FIG. 1 is a diagram showing the organization of a prior art DRAM in schematic form.

FIG. 1 shows the organization of a prior art DRAM in schematic form. In the following description, signals that take an active state at a low level "L" (active low signals) are generally designated by prefixing a "/".

A chip select signal /CS, a row address strobe signal /RAS, a column address strobe signal /CAS, and a write enable signal /WE are supplied to a command decoder 1; further, signals combining logic values of other signals are supplied to it when necessary. A command signal which is output from the command decoder 1 is supplied to a timing signal generating circuit 2. This command signal is activated or deactivated at predetermined timing and supplied as a DRAM control signal to a DRAM core 3. The predetermined timing here is created by delaying the timing of the command generation or the timing of an edge of a clock CLKi through a delay circuit. The clock CLKi is obtained by supplying an external CLK to a clock buffer circuit 4.

During a high level "H" period of the row address strobe signal /RAS, a control signal PR is output from the timing signal generating circuit 2 and supplied to a precharge circuit 5 so that bit lines BL and /BL in a memory cell array 6 are precharged, for example, to a potential of VDD/2. Precharging of a CAS data bus DB and a data I/O buffer circuit 13 is performed when the column address strobe signal /CAS is at a high level "H".

When the row address strobe signal /RAS makes a transition to a low level "L", the following series of RAS-related operations is performed asynchronously with the clock CLKi. That is, the high-order part of the address, A23-A12, is latched into a row address buffer register 7 by a signal from the timing signal generating circuit 2 and is decoded by a row decoder 8. Selected word line WL is raised to a high voltage by a signal RX from the timing signal generating circuit 2, and charge in a cell 6a is read out onto the bit line BL. By control signals SAP (for turning on or off a pMOS transistor in a sense amplifier array 9) and SAN (for turning on or off an nMOS transistor in the sense amplifier array 9) from the timing signal generating circuit 2, the sense amplifier array 9 is activated and a very small potential difference developed between the bit lines BL and /BL is amplified. If the activation is initiated prematurely, the potential difference between the bit lines BL and /BL may not be adequate and may be amplified in the opposite direction due to noise.

When the column address strobe signal /CAS makes a transition to a low level "L", a series of CAS-related operations is initiated. At the rising of the column address strobe signal /CAS, if the write enable signal /WE is at a high level "H", a read operation is initiated, and if it is at a low level "L", a write operation is initiated. The low-order part of the address, A11-A0, is latched into a column address buffer register 10 by a signal from the timing signal generating circuit 2 and is decoded by a column decoder 11 to select one column gate in a column gate array 12, thus connecting the bit lines BL and /BL to the data bus DB. In a read operation, data on the bit lines BL and /BL is read out via the data I/O buffer circuit 13, and in a write operation, data on the data bus DB is written into the cell 6a through the bit lines BL and /BL. Next, the word line WL is driven to the low level, and the control signals SAP and SAN are deactivated to turn off the sense amplifier array 9.

In clock synchronous DRAMs such as synchronous DRAMs (SDRAMS) and Rambus DRAMs (DRAMs compliant with the Rambus specification), higher speeds are achieved by pipelining the CAS-related operations synchronously with a clock. For the RAS-related operations, however, timings for signal activation and deactivation are adjusting in the timing signal generating circuit 2 by utilizing signal delays through loads such as transistors, capacitors, wiring, etc. regardless of whether the DRAM is a clock synchronous DRAM or asynchronous DRAM. The design for such timing adjustments is performed using simulation, to accomplish the timing adjustments with high accuracy, but since variations in manufacturing process, fluctuations in supply voltage, etc. must be considered, the design time becomes longer and the cost increases accordingly.

In the case of general-purpose DRAMs which are produced in large quantities per item, this will be less of a problem since a long design time is allowed, but in the case of DRAM/logic mixed chips such as ASICs which require a short delivery time and are produced in small quantities, this does present a problem. This problem becomes more pronounced as the operating clock frequency increases. To shorten the chip design time, a method is proposed in which the RAS-related operations are also performed synchronously with the same clock as the operating clock of logic circuitry.

However, when the clock frequency is, for example, 100 MHz, timing is designed in units of 10 ns; even if both the rising and falling clock edges are utilized, timing adjustments are possible only in units of 5 ns, and the need for higher DRAM operating speeds cannot be satisfied.

Next, embodiments according to a first aspect of the present invention will be described with reference to FIGS. 2 to 9.

Figure 2:
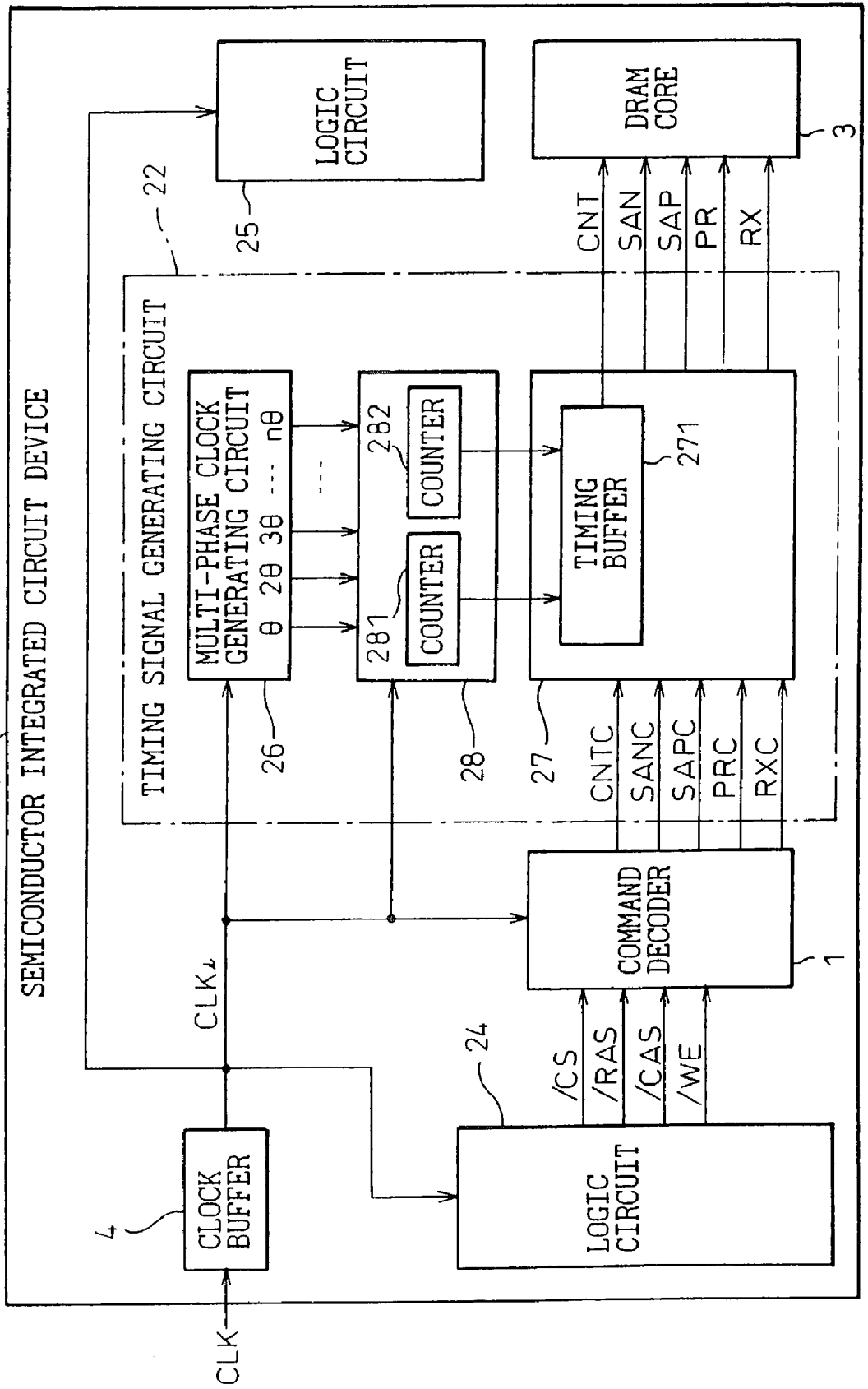
FIG. 2 is a block diagram showing in schematic form a semiconductor integrated circuit device as a first embodiment according to a first aspect of the present invention.

FIG. 2 is a block diagram showing in schematic form a semiconductor integrated circuit device 20 as a first embodiment according to the first aspect of the present invention. The same parts as those in FIG. 1 are designated by the same reference numerals.

As shown in FIG. 2, the semiconductor integrated circuit device 20 is an ASIC containing: a DRAM comprising a command decoder 1, a DRAM core 3, a clock buffer circuit 4, and a timing signal generating circuit 22; a logic circuit 24 such as a CPU or memory controller; and other logic circuits 25.

The logic circuits 24 and 25 operate synchronously with the clock CLKi. The logic circuit 24 supplies a chip select signal /CS, a row address strobe signal /RAS, a column address strobe signal /CAS, and a write enable signal /WE to the command decoder 1, and a command appropriate to the combination of the logic values of these signals at the rising of the clock CLKi, for example, is issued from the command decoder 1. The command is SANC, SAPC, PRC, or PXC corresponding to the earlier mentioned SAN, SAP, PR, or PX, respectively. In the following description, an arbitrary one of these commands is designated CNTC and the DRAM control signal corresponding to the command CNTC is designated CNT.

Figure 4:
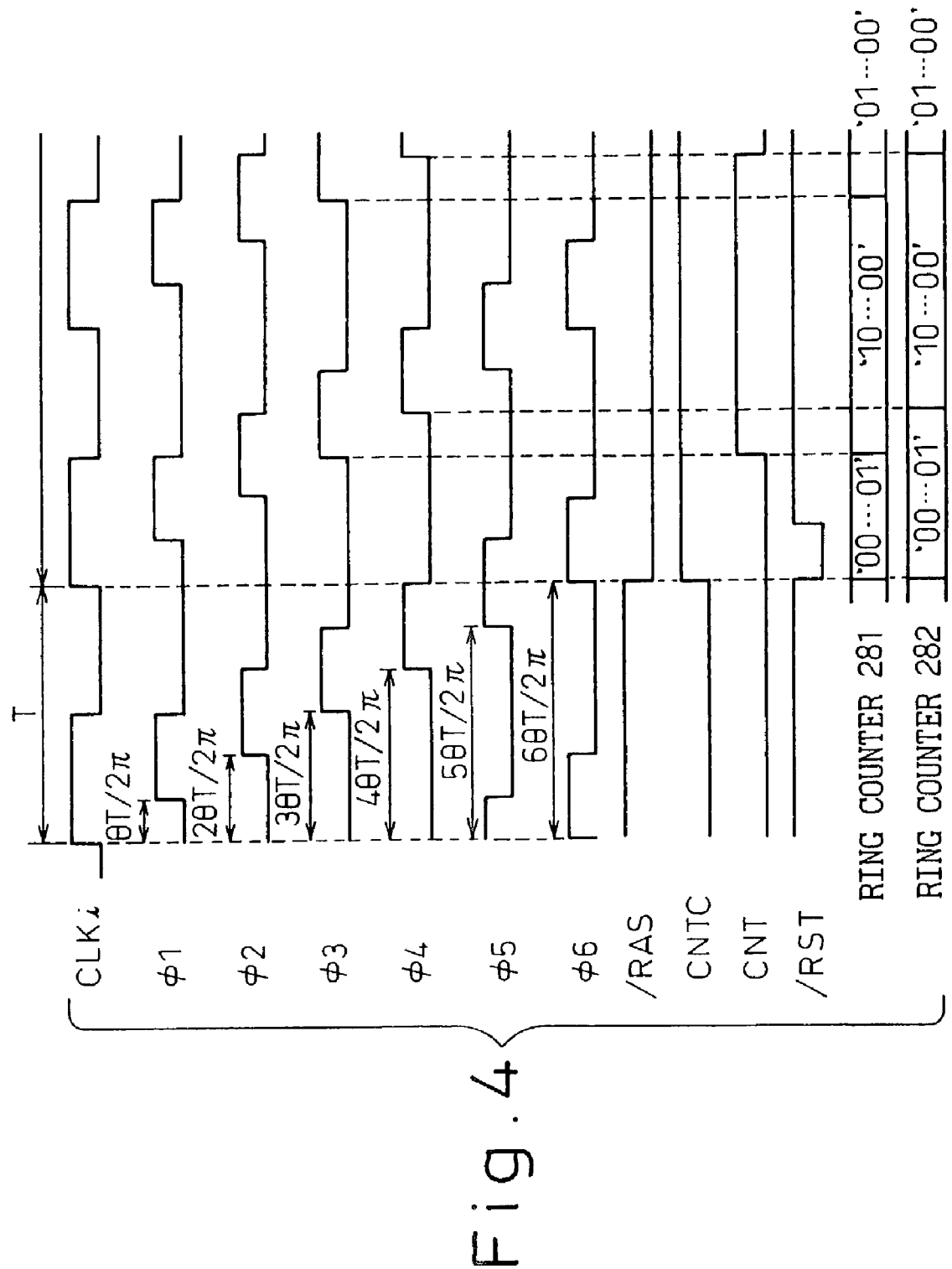
FIG. 4 is a timing chart illustrating one example of operation of the circuits of FIGS. 2 and 3.

A multi-phase clock generating circuit 26 generates clocks $\phi 1$ to $\phi n$ that are shifted in phase by $\theta$ to $n\theta$ with respect to the clock CLKi by delaying the clock CLKi, for example, through 2 m, 4 m, 6 m, ..., 2(n−1)m, and 2 nm inverters, respectively. Here, m is a natural number. The multi-phase clock generating circuit 26 may be constructed from a DLL circuit that matches the phase of the clock $\phi n$ to the phase of the clock CLKi. In that case, adjustments are made automatically so that $n\theta=2\pi$. Clocks $\phi 1$ to $\phi 6$ for the case of n=6 and $n\theta=2\pi$ are shown in FIG. 4 together with the clock CLKi. The clock cycle T is the same for the clocks $\phi 1$ to $\phi 6$ as for the clock CLKi.

In the timing signal generating circuit 22 in FIG. 2, a counter circuit 28 counts the clocks $\phi 1$ to $\phi 6$ generated by the multi-phase clock generating circuit 26 and determines the timing for the activation and deactivation of the control signal CNT; the resulting signal is supplied to a timing buffer circuit 27 which then creates the control signal CNT of that timing and supplies it to the DRAM core 3. A timing buffer circuit 271, which forms part of the timing buffer circuit 27, is controlled by counters 281 and 282 which form part of the counter circuit 28.

Figure 3:
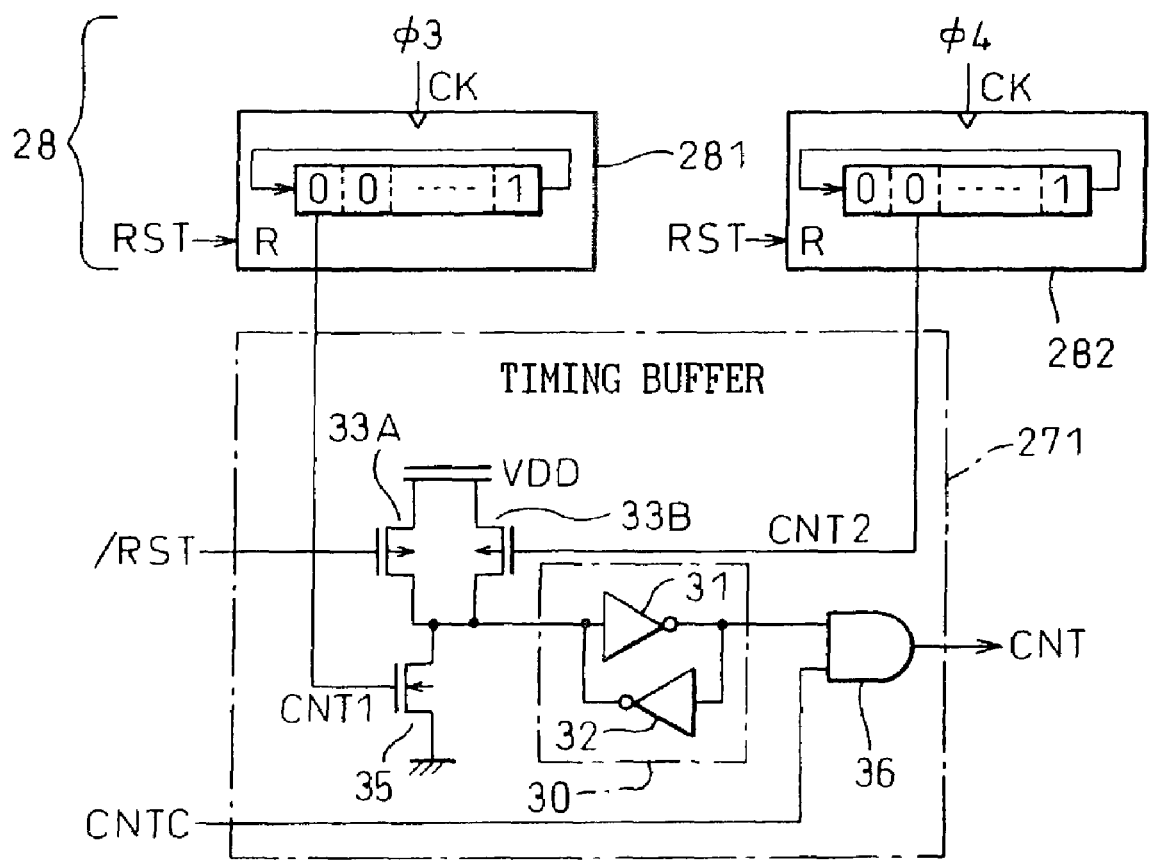
FIG. 3 is a block circuit diagram showing a portion of a timing signal generating circuit in the semiconductor integrated circuit device of FIG. 2.

FIG. 3 is a block circuit diagram showing a portion of the timing signal generating circuit 22 in the semiconductor integrated circuit device of FIG. 2, and FIG. 4 is a timing chart illustrating one example of operation of the circuits shown in FIGS. 2 and 3.

The timing buffer circuit 271 includes a flip-flop 30 which is constructed using inverters 31 and 32 with the output of each inverter connected to the input of the other. The input end of the flip-flop 30 is connected to the drains of pMOS transistors 33A and 33B and an nMOS transistor 35; the sources of the pMOS transistors 33A and 33B are connected to power supply line VDD, while the source of the nMOS transistor 35 is connected to ground line. The output of the flip-flop 30 is supplied to one input of an AND gate 36 whose other input is supplied with the control command CNTC.

The contents of each of the loop counters 281 and 282 are so set that only one bit is different in value from the others, and are initialized, for example, to "00 . . . 1" by a reset pulse RST, as shown. Clocks $\phi 3$ and $\phi 4$ are supplied to the clock input terminals CK of the loop counters 281 and 282, respectively.

A negative reset pulse /RST is supplied to the gate of the pMOS transistor 33A, and the output of the flip-flop 30 is thus initialized to the low level "L". The first bit output of the loop counter 281 is supplied as an activation timing signal CNT1 to the gate of the nMOS transistor 35. After being initialized by the reset pulse RST, the loop counter 281 is set to "10 . . . 0" by the first pulse of the clock $\phi 3$, which causes the nMOS transistor 35 to turn on, and the output of the flip-flop 30 thus goes to the high level "H". The output of the second bit of the loop counter 282 is supplied as a deactivation timing signal CNT2 to the gate of the pMOS transistor 33B. After being initialized by the reset pulse RST, the loop counter 282 is set to "01 . . . 0" by application of two pulses of the clock $\phi 4$, which causes the pMOS transistor 33B to turn on, and the output of the flip-flop 30 thus goes to the low level "L".

The control command CNTC, as shown in FIG. 4, for example, rises synchronously with the falling of the row address strobe signal /RAS which defines the initiation of a memory operation cycle, upon which the AND gate 36 is opened and the output of the flip-flop 30 is passed through the AND gate 36 and delivered as the control signal CNT. The control command CNTC goes to the low level "L" at the next falling edge of the row address strobe signal /RAS, for example, when the control command PRC is issued from the command decoder 1.

Timing adjustments for the other commands are also performed using circuitry similar to the one shown in FIG. 3.

According to the first embodiment, since clocks with prescribed phases output from the multi-phase clock generating circuit 26 are counted by the counters to adjust the timing for the activation and deactivation of the control command CNTC, that is, since the timing is adjusted (in a digital manner) in units of integral multiples of the number of delay stages in the multi-phase clock generating circuit 26, there is no need to strictly consider manufacturing process variations and supply voltage fluctuations in timing design. Furthermore, when the clock CLKi is 100 MHz and n=6, for example, the design for timing adjustments can be done in units of 10/6=1.7 nsec, so that the adjustment of the command activation and deactivation timings can be accomplished With relatively high accuracy.

Figure 5:
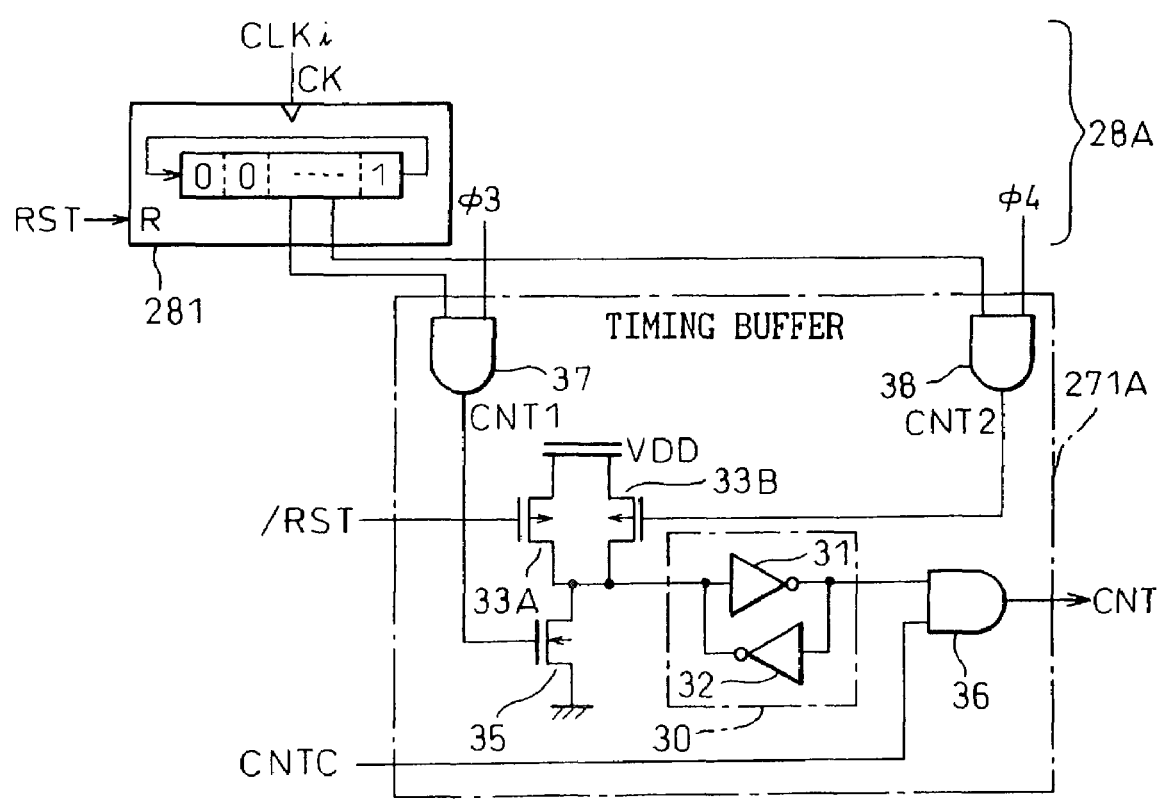
FIG. 5 is a block circuit diagram showing a portion of the timing signal generating circuit as a second embodiment according to the first aspect of the present invention.

FIG. 5 is a block circuit diagram showing a portion of the timing signal generating circuit as a second embodiment according to the first aspect of the present invention.

In the foregoing first embodiment according to the first aspect of the present invention, the bit length must be made long enough that the contents of the loop counters 281 and 282 do not make a complete cycle around the loop within a RAS cycle that starts at the fall of the row address strobe signal /RAS and ends at the next fall thereof.

In view of this, in the counter circuit 28A of the second embodiment, as shown in FIG. 5, the loop counter 281 counts the clock CLKi, and the clock $\phi 3$ and a predetermined bit output of the loop counter 281 are supplied to an AND gate 37 to create the activation timing signal CNT1, while the clock φ4 and a predetermined bit output of the loop counter 281 are supplied to an AND gate 38 to create the deactivation timing signal CNT2.

By so doing, the outputs of the loop counter 281 can also be used in common for the adjustment of all other commands, which serves to simplify the configuration of the counter circuit 28A. In other respects, the configuration is the same as that shown in FIG. 3.

Figure 6:
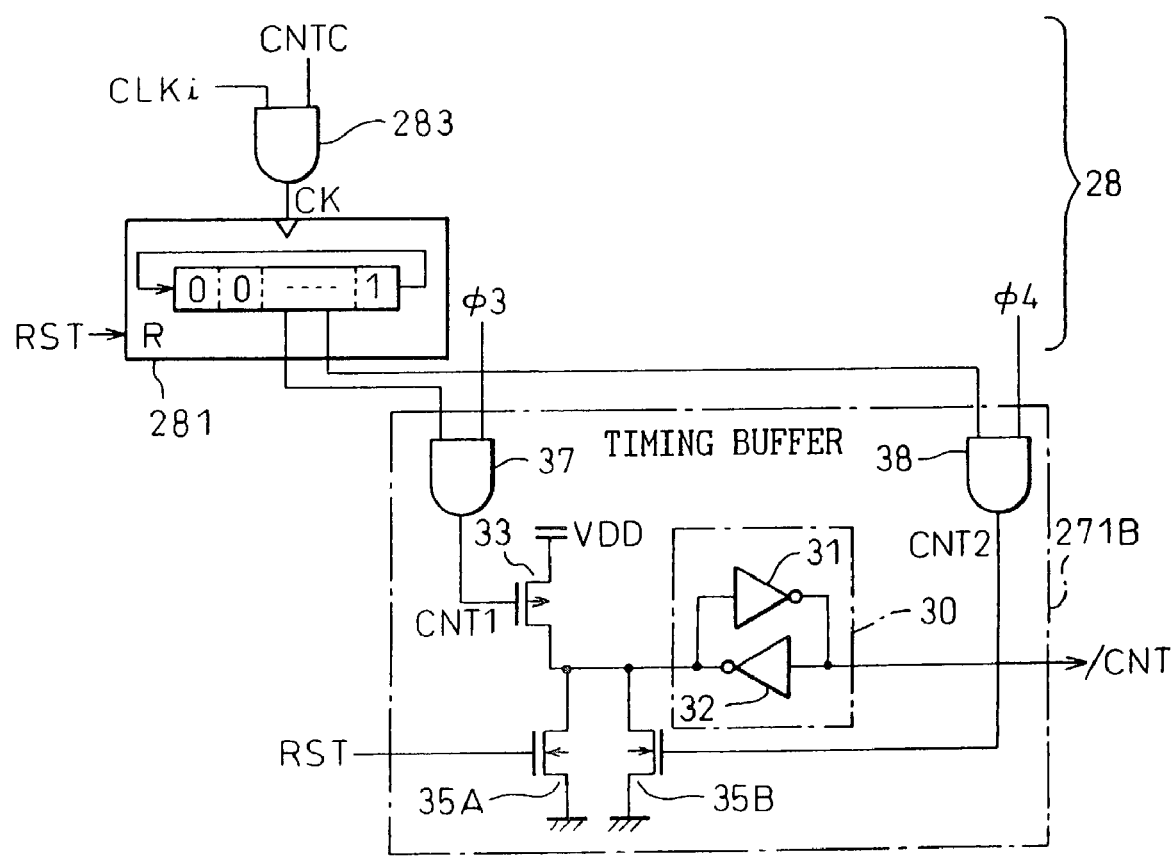
FIG. 6 is a block circuit diagram showing a portion of the timing signal generating circuit as a third embodiment according to the first aspect of the present invention.

FIG. 6 is a block circuit diagram showing a portion of the timing signal generating circuit 22 as a third embodiment according to the first aspect of the present invention.

As shown in FIG. 6, in the circuit of the third embodiment, the AND gate 36 in FIG. 5 is eliminated and, instead, an AND gate 283 is used in the counter circuit 28B, and the clock CLKi and the control command CNTC are supplied to the AND gate 283 whose output is then counted by the loop counter 281.

According to this configuration, the output of the flip-flop 30 can be used directly as the control signal CNT, and there is no need to consider the delay associated with the AND gate 36 in FIG. 5. Furthermore, since the CLKi is passed through the AND gate 283 and counted by the loop counter 281 only when the control command CNTC is at a high level "H", the power consumption of the counter circuit 28B can be reduced.

Further, the pMOS transistors 33A and 33B and nMOS transistor 35 in FIG. 5 are replaced by nMOS transistors 35A and 35B and pMOS transistor 33, respectively, and the power supply wiring is reversed, so that a negative logic control signal /CNT is output from the flip-flop 30. In other respects, the configuration is the same as that shown in FIG. 5.

Figure 7:
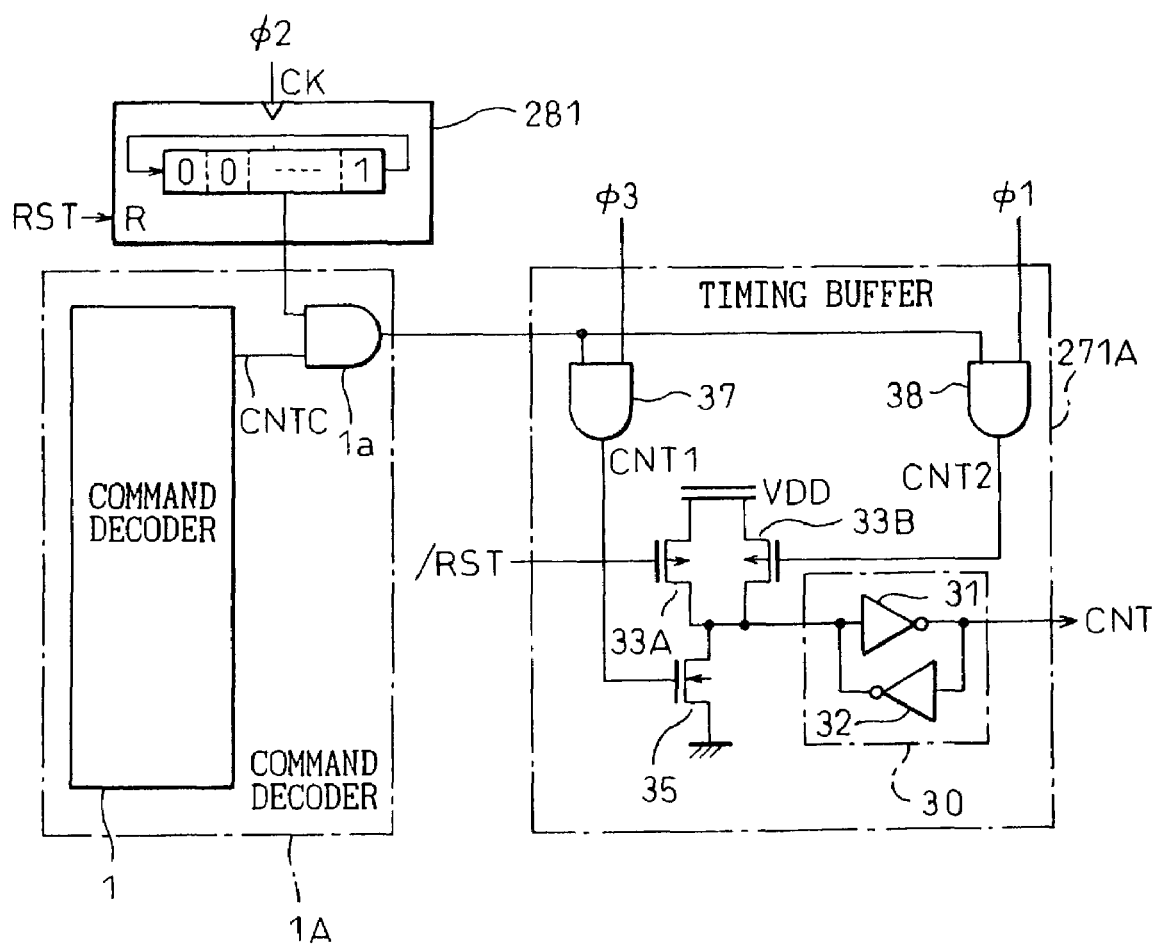
FIG. 7 is a block circuit diagram showing a portion of a DRAM control circuit as a fourth embodiment according to the first aspect of the present invention.

FIG. 7 is a block circuit diagram showing a portion of a DRAM control circuit as a fourth embodiment according to the first aspect of the present invention.

As shown in FIG. 7, in the DRAM control circuit of the fourth embodiment according to the first aspect of the present invention, the AND gate 36 in FIG. 5 is eliminated, and instead, an AND gate 1a is provided in the command decoder 1A, and an output of the loop counter 281 and the control command CNTC are supplied to the AND gate 1a. In this case, the AND gate 1a and the command decoder 1 in FIG. 2 together constitute the command decoder 1A.

When the activation period of the control signal CTN is shorter than or equal to one cycle of the clock CLKi, the output of the AND gate 1a can be shared by the AND gates 37 and 38.

Further, the loop counter 281 need only count the clock CLKi or one of the clocks φ1 to φ6; in FIG. 7, the clock φ2 is counted and, in a prescribed one cycle of it, the control signal CNT is activated for a period starting at the rising of the clock φ3 and ending at the rising of the clock φ1 in the next cycle of the clock CLKi.

In the fourth embodiment also, the output of the flip-flop 30 can be used directly as the control signal CNT, and there is no need to consider the delay associated with the AND gate 36 in FIG. 5.

Figure 8:
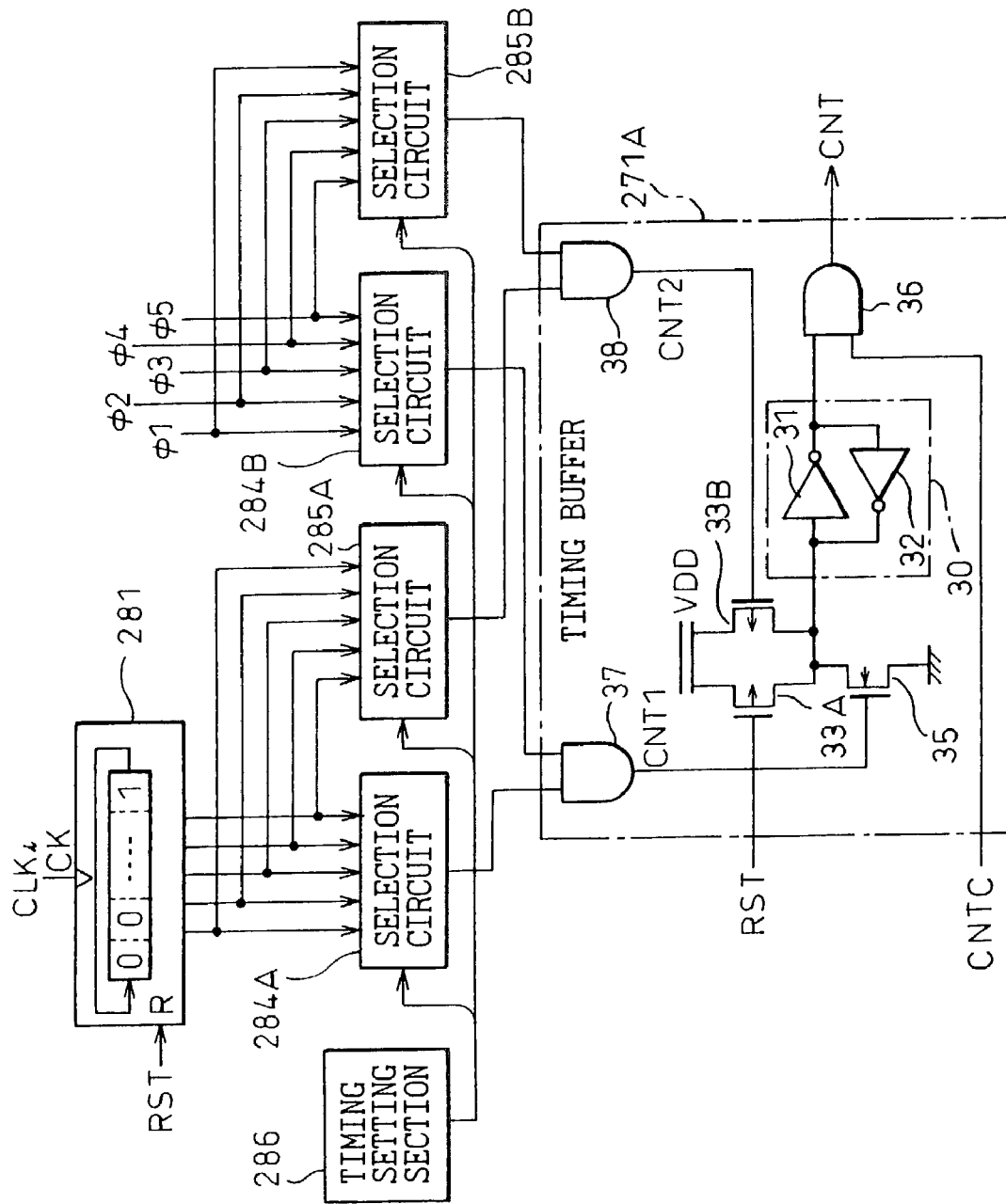
FIG. 8 is a block circuit diagram showing a portion of the timing signal generating circuit as a fifth embodiment according to the first aspect of the present invention.

FIG. 8 is a block circuit diagram showing a portion of the timing signal generating circuit as a fifth embodiment according to the first aspect of the present invention.

In applications where low DRAM operating speeds are allowed, production yields of semiconductor integrated circuits can be improved by designing the circuitry so as to allow a greater timing margin in the timing signal generating circuit 22. It is, however, cumbersome to change the design according to the application.

In view of this, in the fifth embodiment according to the first aspect of the present invention, selection circuits 284A, 284B, 285A, and 285B and a timing setting section 286 are provided in the counter circuit 28D, as shown in FIG. 8. Here, the respective output bits from the loop counter 281 are supplied in common to the selection circuits 284A and 285A, and the clocks φ1 to φ6 to the selection circuits 284B and 285B, and provisions are made so that the desired one input can be selected in each of the selection circuits 284A, 284B, 285A, and 285B by the output of the timing setting section 286.

The output of the timing setting section 286 can be set as desired, for example, by selectively blowing fuses using a laser beam. By setting the output before packaging each semiconductor chip according to the application or according to production process conditions, production yields of semiconductor integrated circuit devices can be increased without having to change the circuit design. In other respects, the configuration is the same as that shown in FIG. 5.

Figure 9:
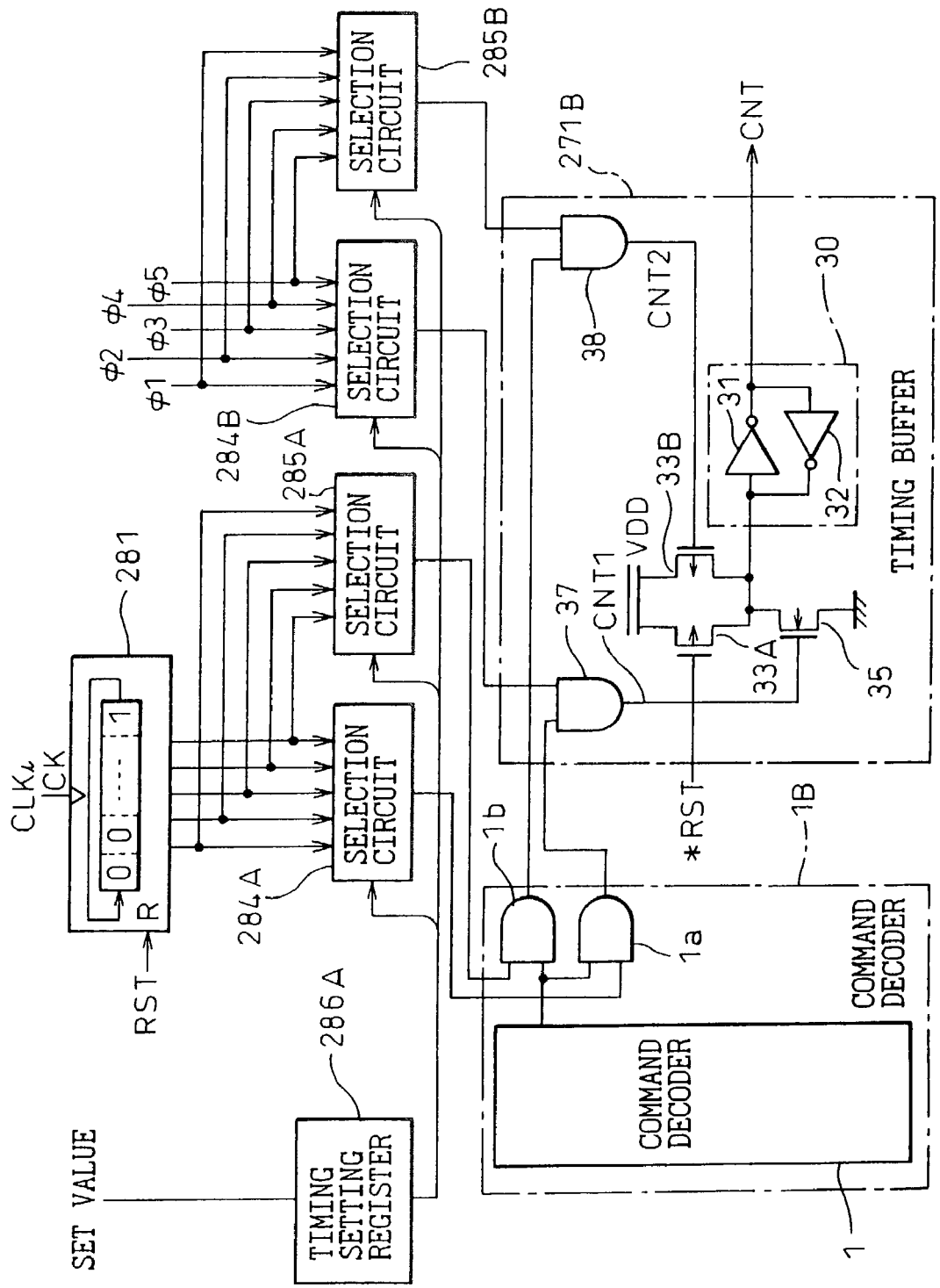
FIG. 9 is a block circuit diagram showing a portion of the DRAM control circuit as a sixth embodiment according to the first aspect of the present invention.

FIG. 9 is a block circuit diagram showing a portion of the DRAM control circuit as a sixth embodiment according to the first aspect of the present invention.

In the DRAM control circuit of the sixth embodiment according to the first aspect of the present invention, the concept of FIG. 7 is applied to the circuit of FIG. 8, and a timing setting register 286A is used as one form of the timing setting section 286 in FIG. 8.

According to the sixth embodiment, settings and changes can be made easily to the timing setting register 286A.

In FIG. 9, CNT1 and CNT2A output from AND gates 261A and 261B in the command decoder 1B are activation coarse timing signals.

In addition to the above-described embodiments, various modifications are also embraced in the first aspect of the present invention. For example, the configuration may be such that the timing signal generating circuit 22 is used only for the /RAS related operations. In that case, the "prescribed operation cycle" stated in claim 1 is not a /RAS cycle, but refers to a low level period of the /RAS, and by setting the reset signal RST active during the period when /RAS is at the high level "H", the bit length of the loop counter can be reduced.

In recent years, the performance of components used in computers and other information processing apparatuses has improved greatly, and with this, there has arisen a need for high-speed signal transmission and reception between LSIs (LSI chips) or between devices constructed with a plurality of LSIs.

Next, a description will be given of a signal transmission system according to a second aspect of the present invention, but before that, one example of a prior art signal transmission system will be described with reference to FIG. 10.

Figure 10:
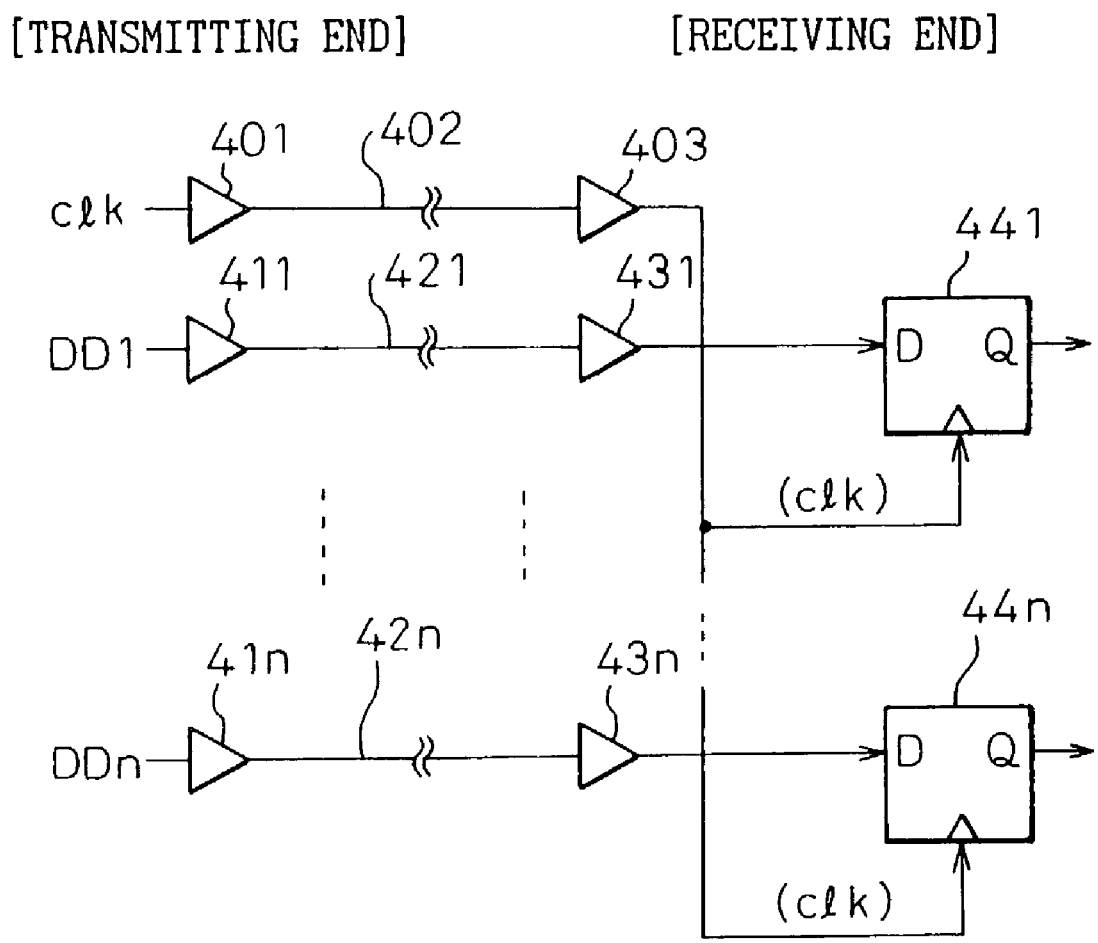
FIG. 10 is a block circuit diagram showing in schematic form one example of a prior art signal transmission system.

FIG. 10 is a block circuit diagram showing in schematic form one example of the prior art signal transmission system. In FIG. 10, reference numeral 401 is a drive circuit (buffer) for a clock clk at the transmitting end, 411 to 41n are drive circuits for data DD1 to DDn at the transmitting end, 402 is a clock line (clock signal line), 421 to 42n are data lines (data signal lines), 403 is a drive circuit for the clock at the receiving end, 431 to 43n are drive circuits for the data at the receiving end, and 441 to 44n are data latch circuits (input latches).

As shown in FIG. 10, in the prior art signal transmission system for handling large amounts of data, signals are transmitted using the plurality of signal lines 402 and 421 to 42n. That is, the clock clk is transmitted to the receiving buffer (clock buffer) 403, for example, via the transmitting buffer

401 and the clock signal line 402, and is then supplied to a clock terminal (latch timing control terminal) on each of the input latches 441 to 44n.

On the other hand, the data (signals) DD1 to DDn are transmitted to the receiving buffers 431 to 43n via the transmitting buffers 411 to 41n and data signal lines 421 to 42n, respectively, and are then supplied to the input latches 441 to 44n whose latch timing is controlled by the clock (strobe signal) supplied from the clock buffer 403.

In the prior art signal transmission system shown in FIG. 10, because of the use of the plurality of signal lines 402 and 421 to 42n and buffers 401, 411 to 41n, 403, and 431 to 43n, the signals transmitting via the respective signal lines experience different delays. This means that optimum latch timing is different for each of the signals (data) transmitted via the respective signal lines (data signal lines 421 to 42n). This delay difference (skew) on each signal line becomes a major concern, for example, as the frequency of the clock clk increases for faster operating speeds (transmission speeds).

Accordingly, if the signals (data) are latched by supplying a common strobe signal (clock clk) to the input latches 441 to 44n provided one for one for the signal lines 421 to 42n, as in the prior art signal transmission system shown in FIG. 10, the skew between the signal lines cannot be addressed.

More specifically, if the difference in optimum signal latch timing becomes excessively large between the input latches 441 to 44n for the respective signal lines, all the signals cannot be latched (received) correctly by using the common timing (clock clk), as a result of which the distance and transmission speed for correct signal transmission are limited. Otherwise, to stretch the signal transmission distance or to increase the transmission speed (for increased bit rate), expensive cables specially tuned for reduced skew must be used, but this not only increases the cost, but cannot achieve substantial improvements in the transmission distance and transmission speed; this, therefore, cannot be said to be a fundamental solution.

First, the basic functional configuration of the second aspect of the present invention will be described with reference to FIGS. 11 to 13.

Figure 11:
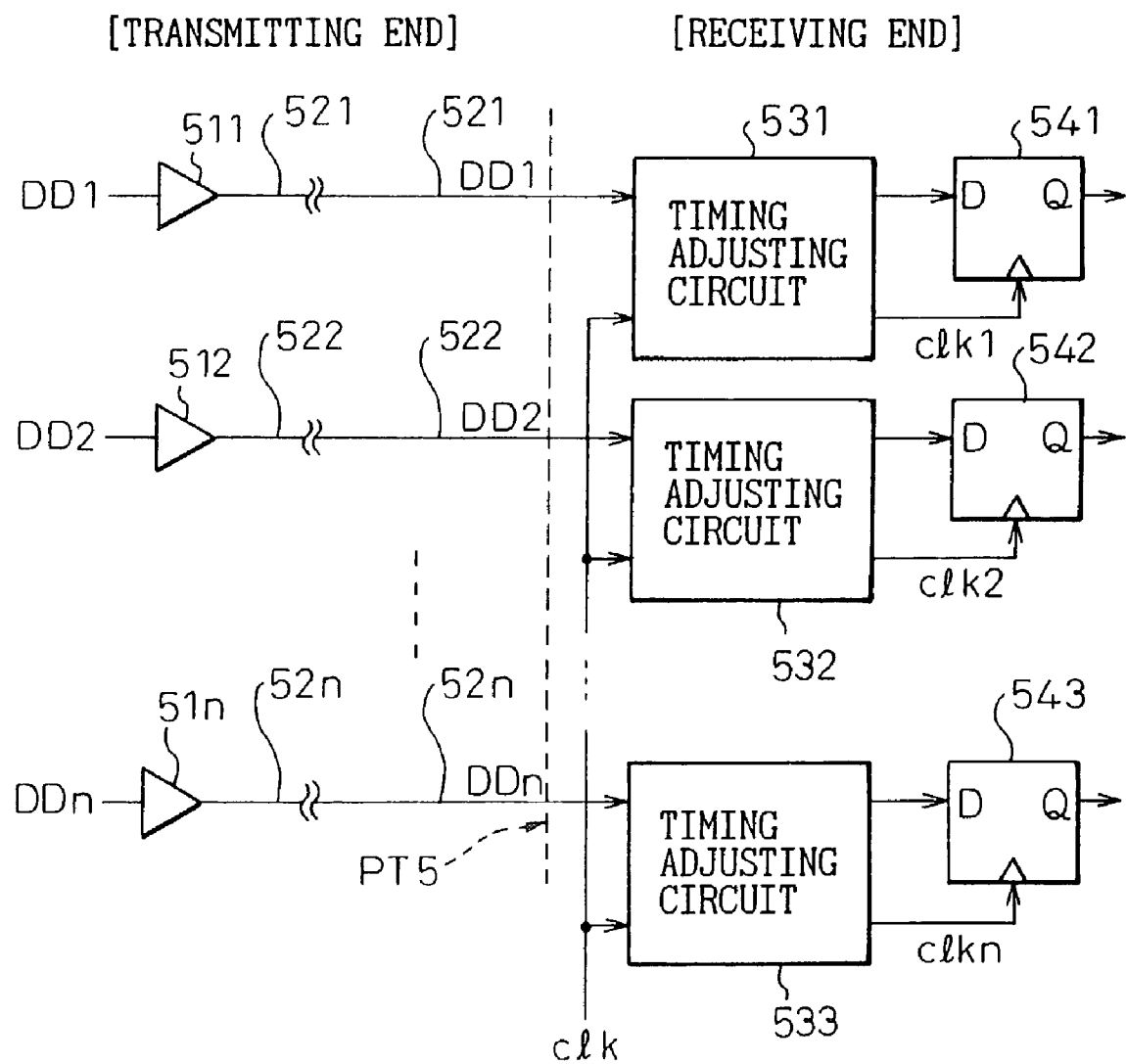
FIG. 11 is a block circuit diagram showing in schematic form the basic functional configuration of a signal transmission system according to a second aspect of the present invention.
Figure 12:
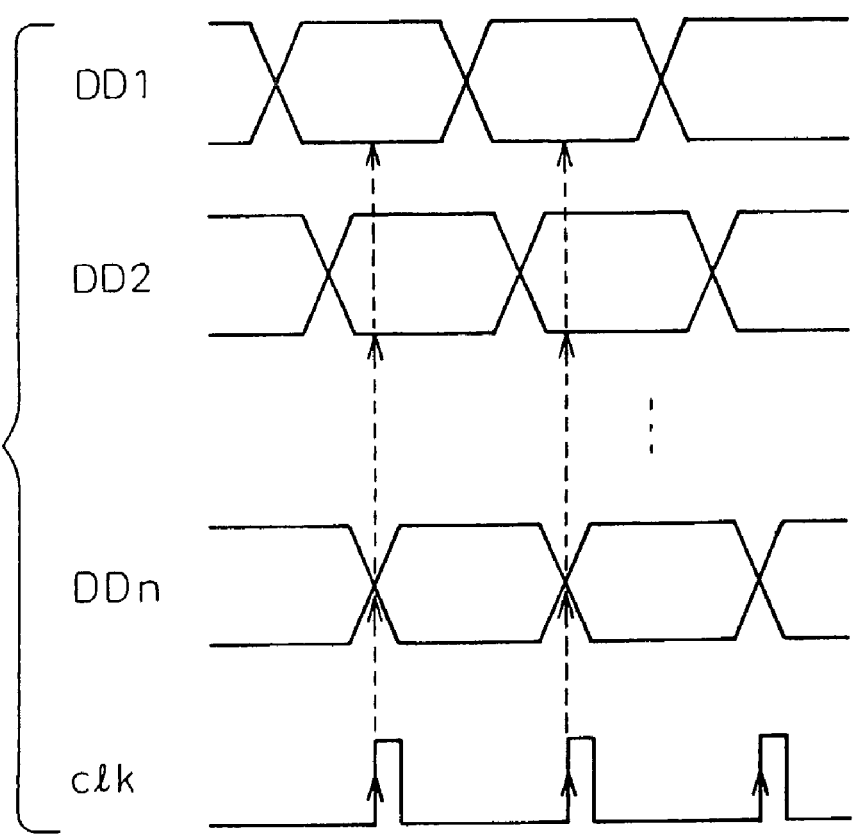
FIG. 12 is a timing diagram (part 1) for explaining one example of operation in the signal transmission system of FIG. 11.
Figure 13:
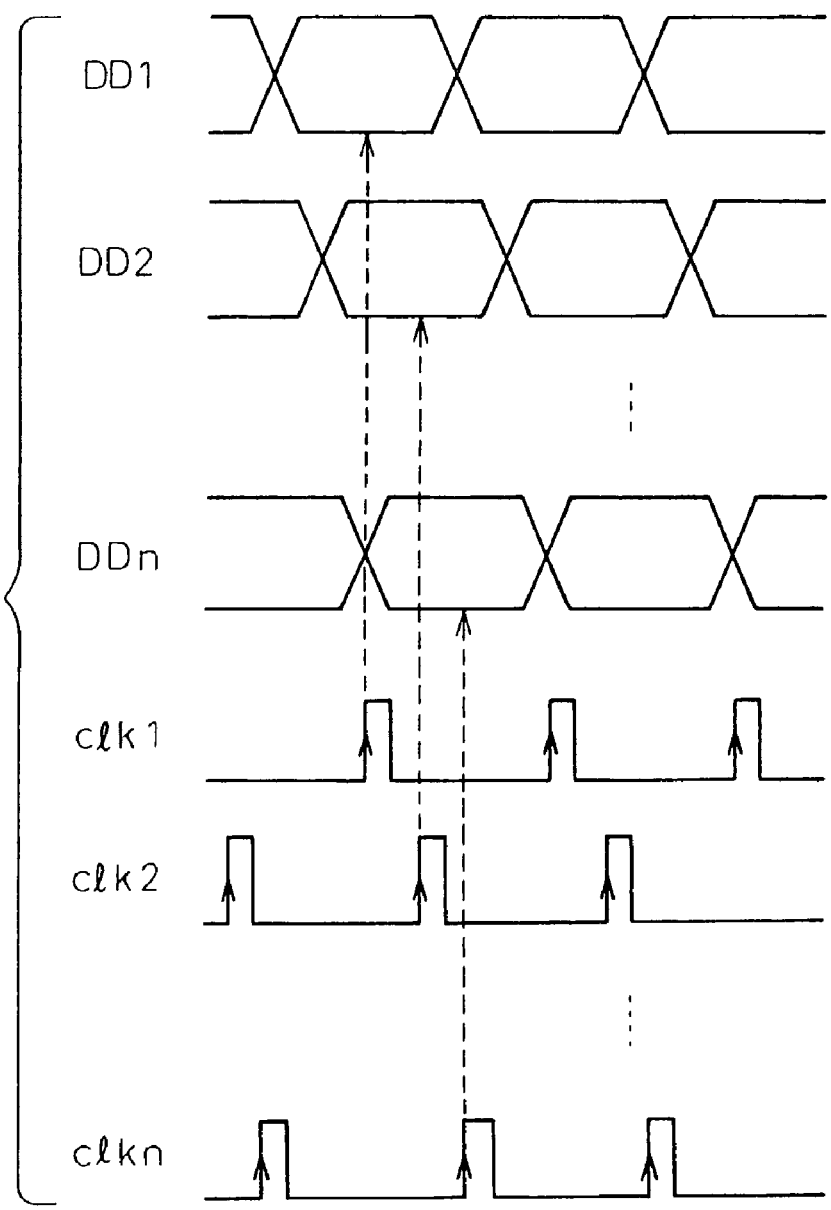
FIG. 13 is a timing diagram (part 2) for explaining one example of operation in the signal transmission system of FIG. 11.

FIG. 11 is a block circuit diagram showing in schematic form the basic functional configuration of the signal transmission system according to the second aspect of the present invention, and FIGS. 12 and 13 are timing diagrams for explaining one example of operation in the signal transmission system of FIG. 11.

In FIG. 11, reference numerals 511 to 51n are drive circuits (drivers) for data DD1 to DDn at the transmitting end, 521 to 52n are data lines (data signal lines), 531 to 53n are timing adjusting circuits (optimum timing determining means), and 541 to 54n are data latch circuits (input latches).

As shown in FIG. 11, in the signal transmission system according to the second aspect of the present invention, signals are transmitted using the plurality of signal lines (data signal lines) 521 to 52n; that is, the data (signals) DD1 to DDn are supplied to the timing adjusting circuits (timing adjusting means) 531 to 53n at the receiving end via the respective transmitting drivers 511 to 51n and data signal lines 521 to 52n.

The timing adjusting circuits 531 to 53n are also supplied with the clock clk, and the signal latch timing at each of the input latches (receiving circuits) 541 to 54n is optimized according to the skew on each of the signal lines 521 to 52n. Here, the timing adjusting circuits 531 to 53n are configured to output strobe signals (clocks), clk1 to clkn, near the center of the period (data window) during which the data DD1 to DDn are valid.

More specifically, as shown in FIG. 12, skew due to the signal lines, etc. exists between the data (signals) DD1 to DDn at the position indicated by PT5 on the signal lines 521 to 52n in the signal transmission system shown in FIG. 11 Accordingly, with the clock clk optimum for latching the data DD1 transmitted via the signal line 521 (the strobe signal at the timing near the center of the period during which the data DD1 is valid), for example, the data DDn transmitted via the signal line 52n cannot be latched since the clock timing coincides with the transition timing of the data DDn.

To address this, in the signal transmission system according to the second aspect of the present invention, the timing adjusting circuits 531 to 53n optimize the signal latch timing at the respective input latches 541 to 54n according to the skew on each of the signal lines 521 to 52n, as shown in FIG. 13. More specifically, the strobe signal (clock) clk1 whose timing is adjusted by the timing adjusting circuit 531 by considering the skew due to the signal line 521, etc. is supplied to the input latch 541 that latches the data DD1; the strobe signal clk2 whose timing is adjusted by the timing adjusting circuit 532 by considering the skew due to the signal line 522, etc. is supplied to the input latch 542 that latches the data DD2; and the strobe signal clkn whose timing is adjusted by the timing adjusting circuit 53n by considering the skew due to the signal line 52n, etc. is supplied to the input latch 54n that latches the data DDn. Here, the rise timing of the strobe signal clk1 substantially coincides with the center of the period during which the data DD1 is valid; the rise timing of the strobe signal clk2 substantially coincides with the center of the period during which the data DD2 is valid; and the rise timing of the strobe signal clkn substantially coincides with the center of the period during which the data DDn is valid.

In this way, high-speed, error-free signal transmission can be achieved without being affected by the skew on each signal line.

In the signal transmission system according to the second aspect of the present invention, the timing adjusting circuits 531 to 53n are not limited to the illustrated configuration where the timing of the strobe signals clk1 to clkn supplied to the respective timing adjusting circuits 531 to 53n is adjusted at the receiving end; for example, the configuration may be such that the timing of the data DD1 to DDn is adjusted at the transmitting end.

Referring now to FIGS. 14 to 41, embodiments of the signal transmission system according to the second aspect of the present invention will be described in detail below.

Figure 14:
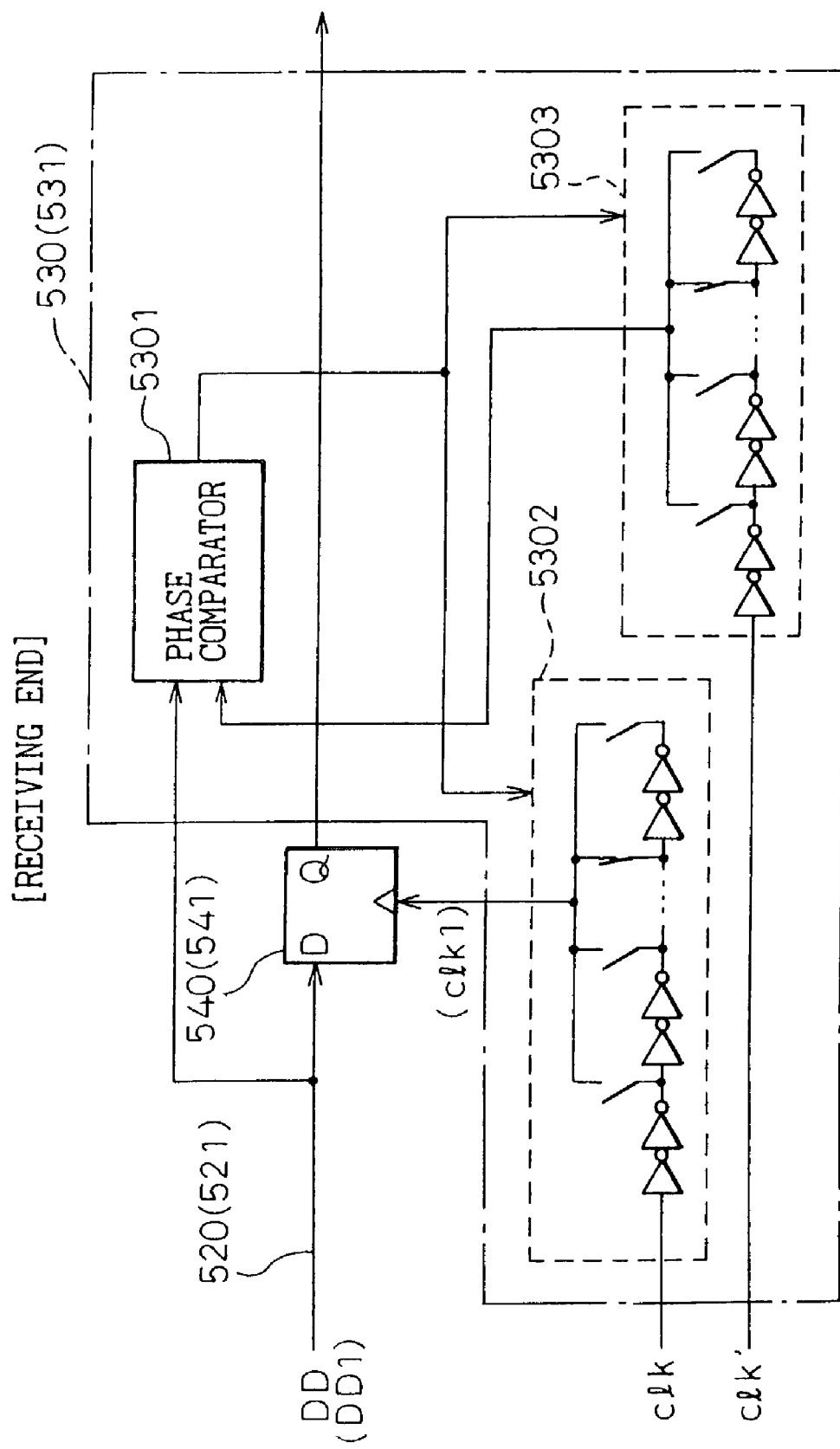
FIG. 14 is a block circuit diagram showing in schematic form a first embodiment of the signal transmission system according to the second aspect of the present invention.
Figure 15:
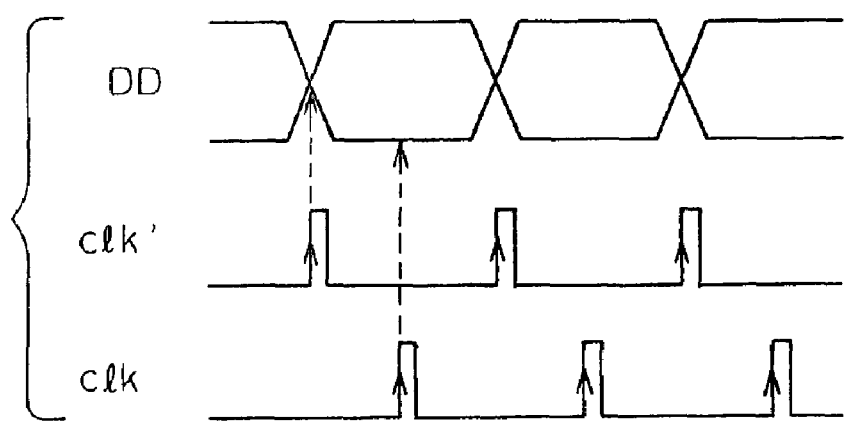
FIG. 15 is a timing diagram for explaining one example of operation in the signal transmission system of FIG. 14.

FIG. 14 is a block circuit diagram showing in schematic form a first embodiment of the signal transmission system according to the second aspect of the present invention, and FIG. 15 is a timing diagram for explaining one example of an operation in the signal transmission system of FIG. 14.

In FIG. 14, reference numeral 530 is a timing adjusting circuit (optimum timing determining means), 5301 is a phase comparator circuit, 5302 and 5303 are variable delay circuits, 540 is a data latch circuit (input latch), and 520 is a signal line (data signal line). Here, the variable delay circuits 5302 and 5303 are identical in configuration, and provide the same amount of delay in accordance with an output from the phase comparator circuit 5301. The data DD, signal line 520, timing adjusting circuit 530, and input latch 540 in the first embodiment correspond, for example, to the data DD1, signal line 521, timing adjusting circuit 531, and input latch 541 in FIG. 11; therefore, the circuit block shown here is provided for each of the data (DD1 to DDn).

In the signal transmission system of the first embodiment, the timing adjusting circuit 530 for adjusting the relative timing relationship between the received signal (data) DD and the clock clk (clk') is provided at the receiving end so that the input latch 540 latches the data DD at the optimum timing (the timing near the center of the period during which the data DD is valid). More specifically, as shown in FIG. 14, the timing adjusting circuit 530 comprises the first variable delay circuit 5302 which provides a delay to the first clock clk, the second variable delay circuit 5303 which provides a delay to the second clock clk', and the phase comparator circuit 5301 which compares the phase of the data DD with the phase of the second clock clk' supplied via the second variable delay circuit 5303. Here, the second clock clk' is a signal shifted in phase by 180 degrees with respect to the first clock clk. The second embodiment uses the two-phase clocks clk and clk' having a 180-degree phase difference with respect to each other.

Here, as shown in FIG. 15, the phase comparator circuit 5301 compares the phase of the DD with that of the second clock clk' and controls the amount of delay in the second variable delay circuit 5303 so as to make the rise timing of the second clock clk' coincide with the transition timing of the data DD. Further, the phase comparator circuit 5301 also controls the delay in the first variable delay circuit 5302 in the same way that it controls the delay in the second variable delay circuit 5303, and gives the first clock (strobe signal) clk the same amount of delay as that in the second variable delay circuit 5303. As a result, the rise timing of the first clock clk having a 180-degree phase difference relative to the second clock clk' is made to substantially coincide with the timing at the center of the period (data window) during the data DD is valid, thus achieving data reception with low error rates.

The timing adjusting circuit 530 is provided for each of the signal lines (521 to 52n), so that data can be received correctly for all data lines. In FIG. 14, the variable delay circuits 5302 and 5303 are constructed from multi-stage inverters and the amount of delay is varied by varying the number of inverter stages, but it will be appreciated that various other configurations are possible.

Figure 16:
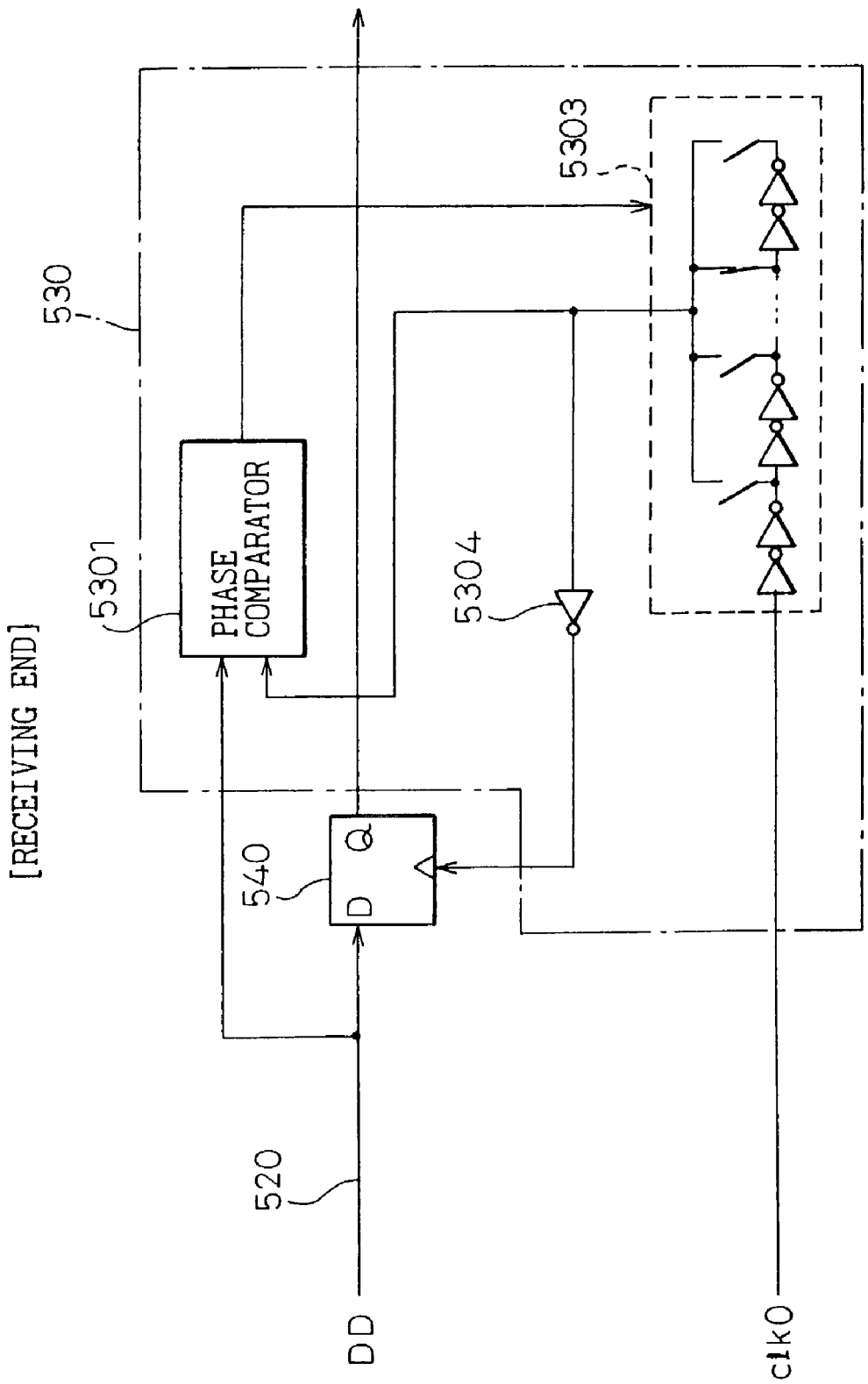
FIG. 16 is a block circuit diagram showing in schematic form a modified example of the signal transmission system shown in FIG. 14.
Figure 17:
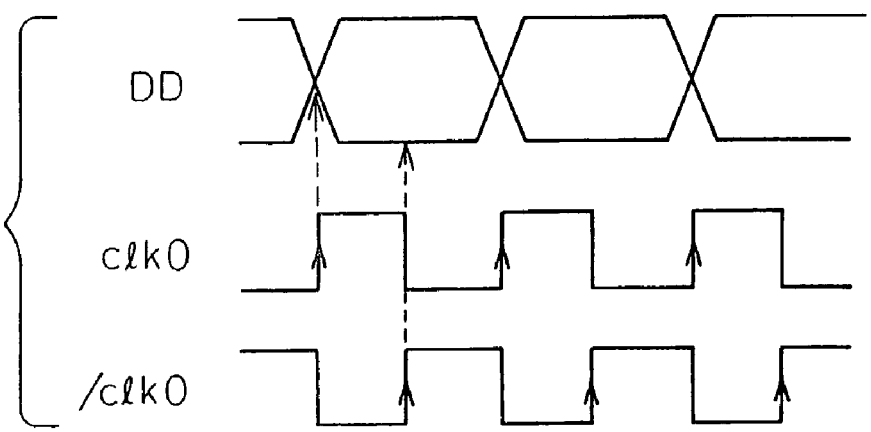
FIG. 17 is a timing diagram for explaining one example of operation in the signal transmission system of the modified example shown in FIG. 16.

FIG. 16 is a block circuit diagram showing in schematic form a modified example of the signal transmission system shown in FIG. 14, and FIG. 17 is a timing diagram for explaining one example of operation in the signal transmission system of FIG. 16.

As can be seen from the comparison between FIG. 13 and FIG. 16, and also from FIG. 17, the modified example (timing adjusting circuit 530') of the first embodiment can be applied when the clock (clk0) has a duty cycle of about 50%, that is, the high level period of the clock clk0 is approximately equal in length to the low level period thereof. The clock clk0 is used as the second clock clk' in FIG. 14, and the first clock clk and the first variable delay circuit 5302 in FIG. 14 can be eliminated.

As shown in FIGS. 16 and 17, in the modified example of the first embodiment, the amount of delay in the variable delay circuit 5303 is controlled so that the timing of the clock clk0 coincides with the timing of the data DD, and the data latch timing at the input latch 540 is controlled by a signal (/clk0) produced by inverting the clock clk0 through an inverter 5304.

More specifically, the rise timing of the clock clk0 is made to coincide with the transition timing of the data DD by means of the phase comparator circuit 5301 and the variable delay circuit 5303. At this time, the rise timing of the strobe signal (clock) /clk0, the complement of the clock clk0, substantially coincides with the timing at the center of the period during which the data DD is valid; therefore, by using this signal /clk0, the input latch 540 latches the data. In this way, according to the modified example, by using a single-phase clock having a duty cycle of about 50%, high-speed, error-free signal transmission can be achieved without being affected by skew.

Figure 18:
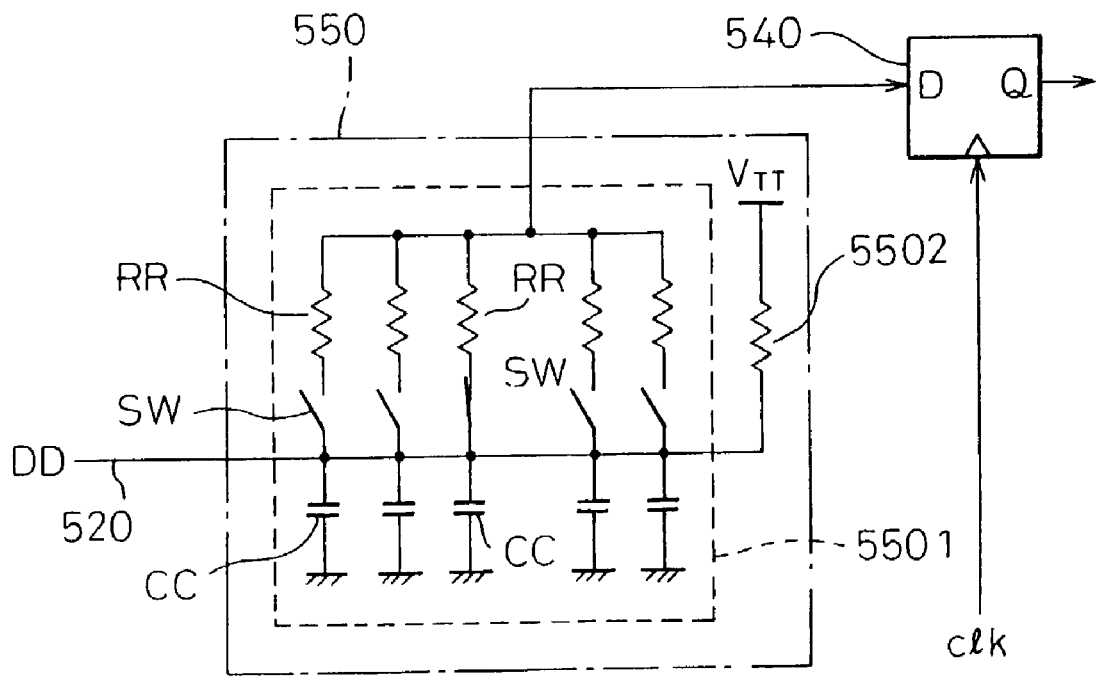
FIG. 18 is a block circuit diagram showing in schematic form a second embodiment of the signal transmission system according to the second aspect of the present invention.

FIG. 18 is a block circuit diagram showing in schematic form a second embodiment of the signal transmission system according to the second aspect of the present invention. In FIG. 18, reference numeral 550 is a timing adjusting circuit, 5501 is a tapped delay circuit, and 5502 is a terminating resistor.

As shown in FIG. 18, in the signal transmission system of the second embodiment, the clock clk is used directly as the strobe signal to the input latch 540, and instead, the tapped delay circuit 5501 is inserted in the path of the data DD to adjust the timing. Here, the tapped delay circuit 5501 is a tapped transmission line formed, for example, from a thin-film circuit or an interconnection pattern on a printed circuit board; a plurality of tappings each including a capacitor CC, a switch SW, and a resistor RR are provided along the transmission line, and the amount of delay to be introduced in the data DD is controlled in a variable manner by turning the desired switch on. A transmission line having a transmission distance of about 5 cm and a maximum delay of about 1 nsec., for example, can be used as the tapped delay circuit 5501. It will, however, be appreciated that other configurations can also be used for the tapped delay circuit 5501 provided that it is a variable delay circuit capable of delaying an analog signal (data DD).

Though it requires the provision of an external delay line (the tapped delay circuit 5501), the signal transmission system of the second embodiment can achieve faster signal transmission because it is highly stable over temperature, etc. and is capable of delay control with an excellent frequency characteristic.

Figure 19:
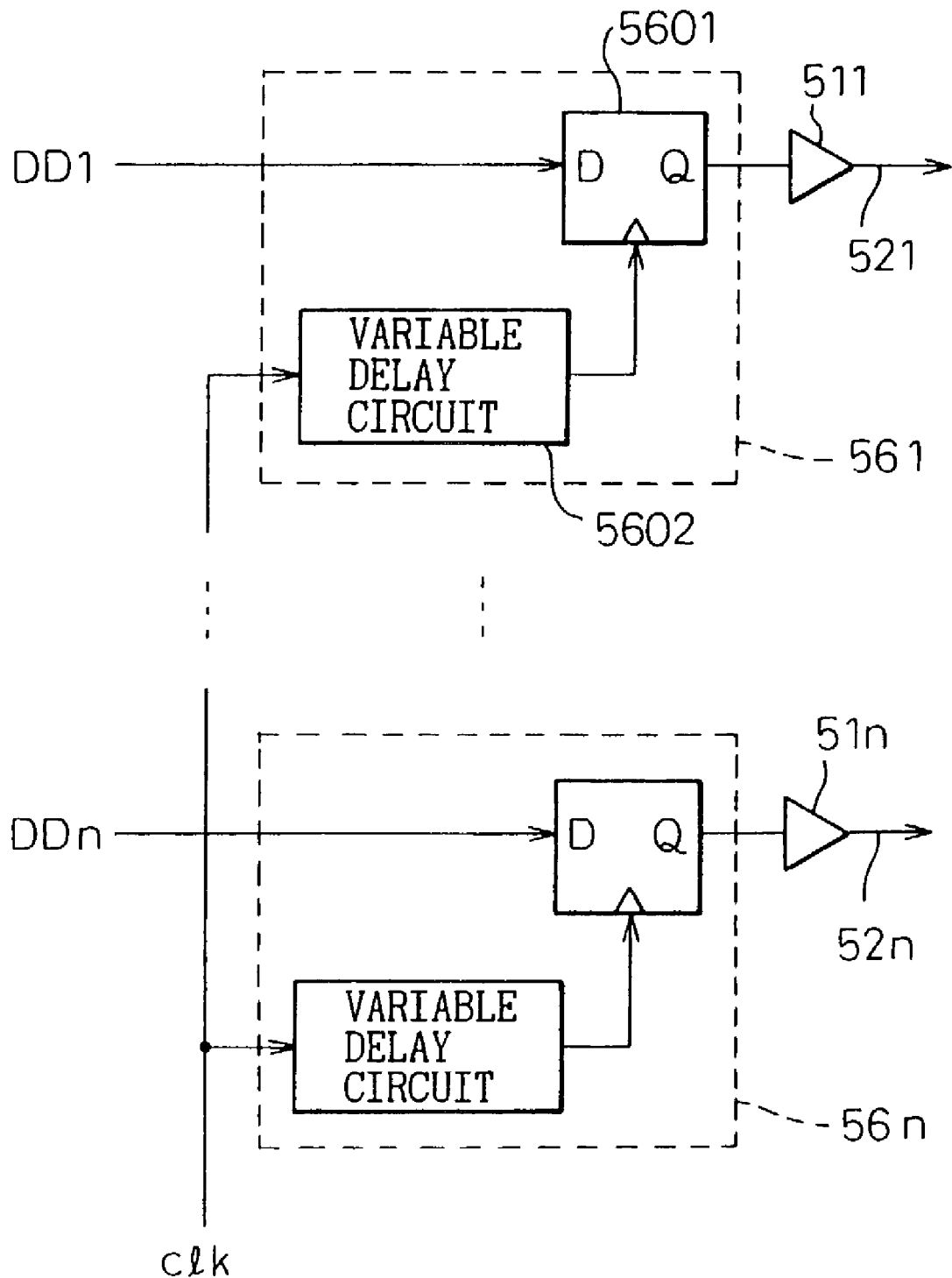
FIG. 19 is a block diagram showing in schematic form a third embodiment of the signal transmission system according to the second aspect of the present invention.

FIG. 19 is a block diagram showing in schematic form a third embodiment of the signal transmission system according to the second aspect of the present invention. In FIG. 19, reference numerals 561 to 56n are timing adjusting circuits (optimum timing determining means), 5601 is a data latch circuit (output latch), and 5602 is a variable delay circuit.

As shown in FIG. 19, the signal transmission system of the third embodiment accomplishes timing adjustments at the signal transmitting end by making transmission timing variable. The output latch 5601 is provided in front of each of the transmitting drive circuits (drivers) 511 to 51n, and the clock clk delayed through the variable delay circuit 5602 is used as the strobe signal to the output latch 5601. That is, the timing of each of the drivers 511 to 51n is adjusted by the output of the variable delay circuit 5602 whose amount of delay is controlled in a variable manner.

More specifically, the timing adjusting circuit 561, for example, controls the driver 511 so that the data DD1 is transmitted at such a timing that the clock at the receiving end occurs at the optimum point of the data DD1 (the timing that substantially coincides with the center of the period during which the data DD is valid). In the signal transmission system of the third embodiment, the transmission timing of the data (DD1 to DDn) is adjusted by the timing adjusting circuit (561 to 56n) at the transmitting end, and this timing adjustment is performed using a communication protocol, for example, when power is turned on. More specifically, when power is turned on, for example, prescribed signals (data) are transmitted over the respective signal lines 521 to 52n with their timing sequentially varied by the respective timing adjusting circuits 561 to 56n, and the timing optimum for data latching at the receiving end is determined by feeding it back to the respective timing adjusting circuits 561 to 56n.

The signal transmission system of the third embodiment can simplify the circuit configuration at the receiving end, and is preferred, for example, when cost reductions of receiving devices are strongly desired.

Figure 20:
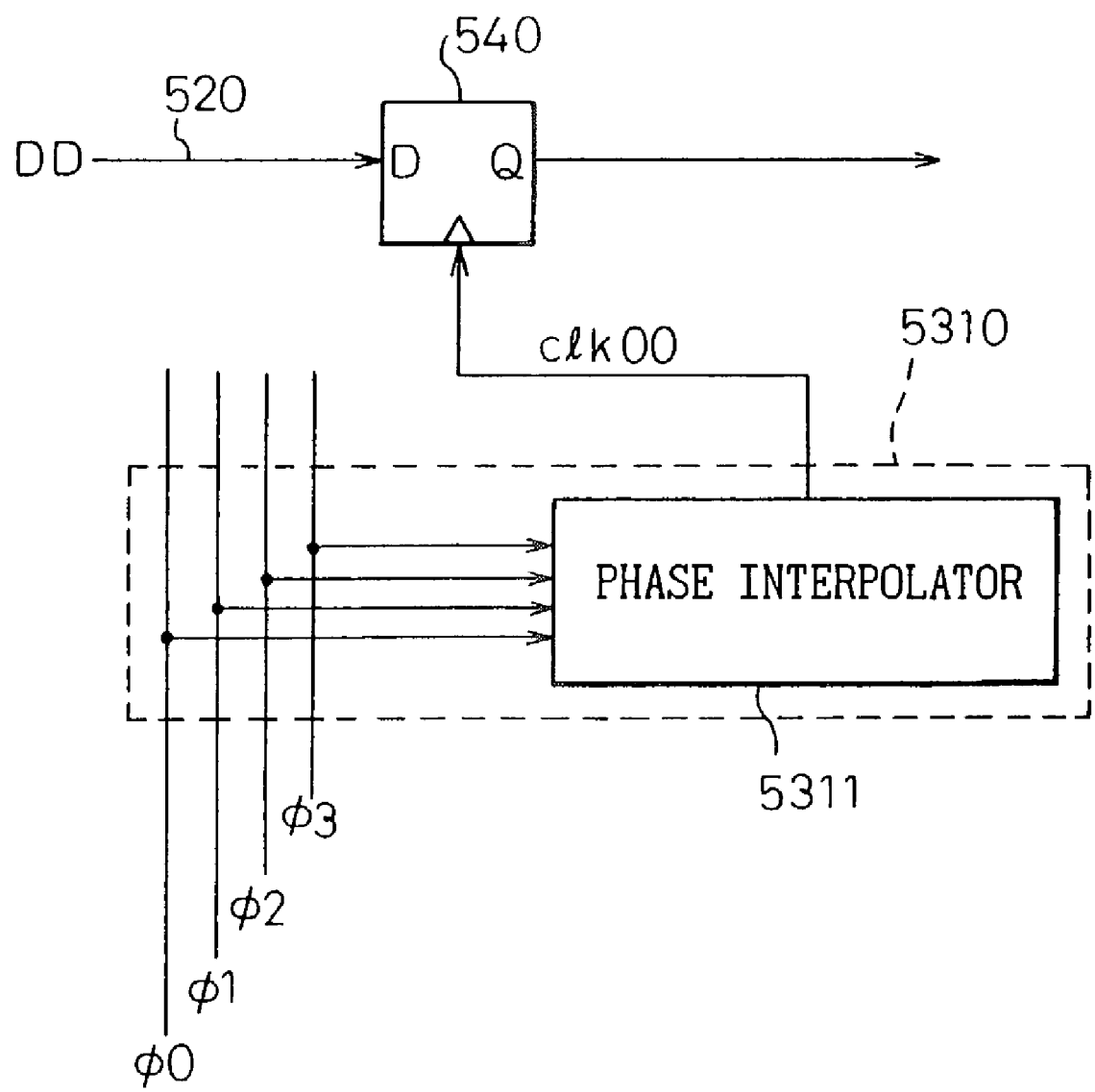
FIG. 20 is a block circuit diagram showing in schematic form a fourth embodiment of the signal transmission system according to the second aspect of the present invention.

FIG. 20 is a block circuit diagram showing in schematic form a fourth embodiment of the signal transmission system according to the second aspect of the present invention. In FIG. 20, reference numeral 5310 is a timing adjusting circuit, and 5311 is a phase interpolator.

As shown in FIG. 20, in the signal transmission system of the fourth embodiment, the timing adjusting circuit 5130 comprises the phase interpolator 5311 which generates from a plurality of clocks with different phases a new clock having an intermediate phase. More specifically, four-phase clocks $\phi 0$ to $\phi 3$ are supplied to the phase interpolator 5311 and, based on these four-phase clocks, an intermediate phase is generated and the resulting strobe signal (clk00) is supplied to the input buffer 540. Needless to say, this phase interpolator 5311 is provided for each input latch 540 (541 to 54n) which latches the data DD (DD1 to DDn) transmitted via each signal line 520 (521 to 52n).

Figure 21:
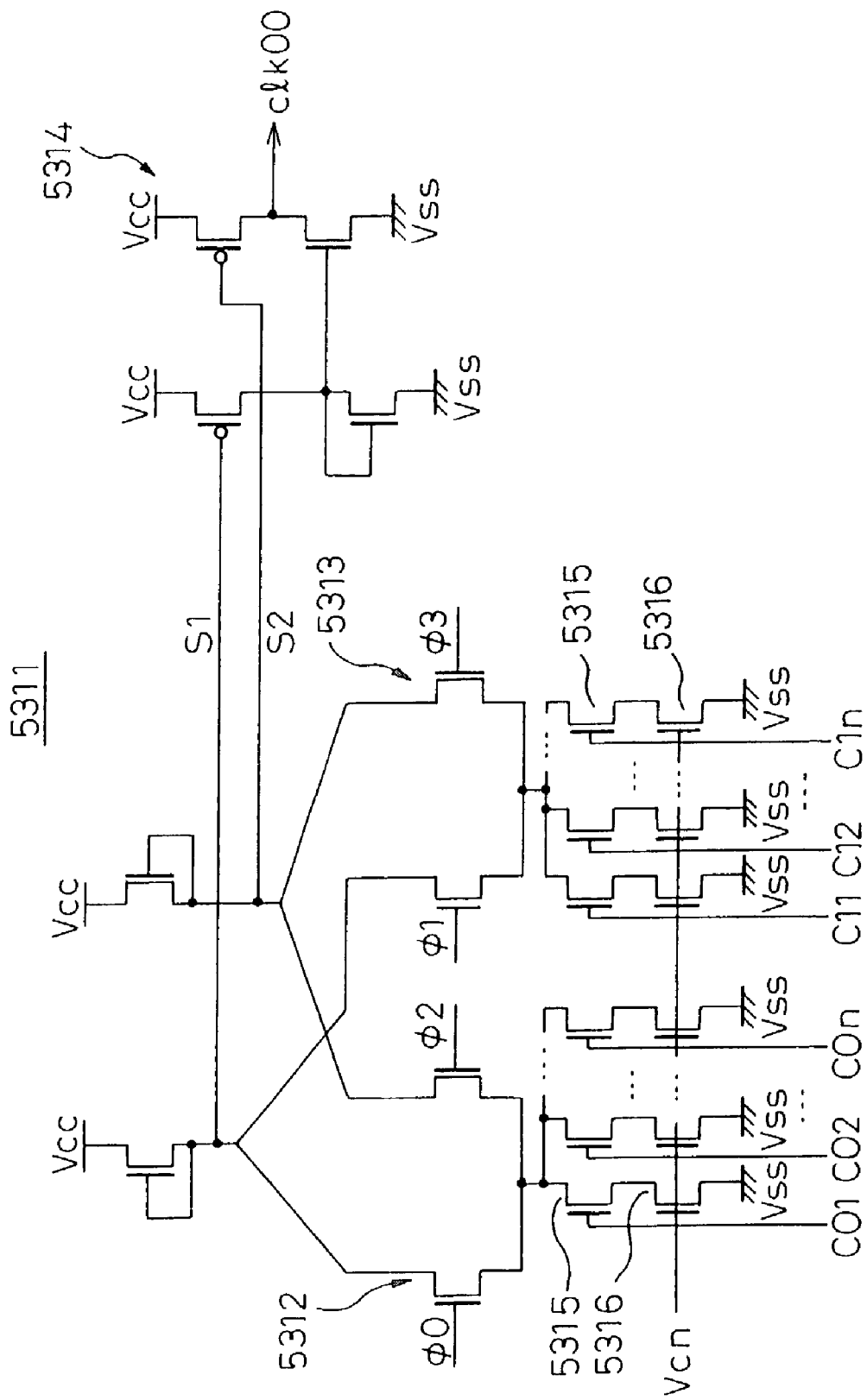
FIG. 21 is a circuit diagram showing one example of a phase interpolator in the signal transmission system of FIG. 20.

FIG. 21 is a circuit diagram showing one example of the phase interpolator in the signal transmission system of FIG. 20.

As shown in FIG. 21, the phase interpolator 5311 takes a weighted sum of the four-phase input clocks $\phi 0$ to $\phi 3$ by varying the tail current of a pair of differential amplifier stages 5312 and 5313, and supplies signals S1 and S2 from the two differential amplifier stages 5312 and 5313 to a comparator 5313 to obtain an output (strobe signal clk00) having a phase intermediate between the phases of these two signals S1 and S2. Here, weighting of the input clocks $\phi 0$ to $\phi 3$ in the differential amplifier stages 5312 and 5313 is done using a plurality of control transistor pairs each consisting, for example, of two nMOS transistors connected in series. One transistor (5315) in each pair is supplied at its gate with a control code (C01, C02, . . . , C0n; C11, C12, C1n), while the gates of the other transistors in the respective pairs are connected in common and supplied with a control voltage (Vcn). Using the phase interpolator 5311 of such configuration offers the advantage that the timing of the output signal (strobe signal clk00) can be adjusted in a digital manner with a resolution higher than that of one delay unit stage. Highly accurate timing adjustments can thus be achieved.

Figure 22:
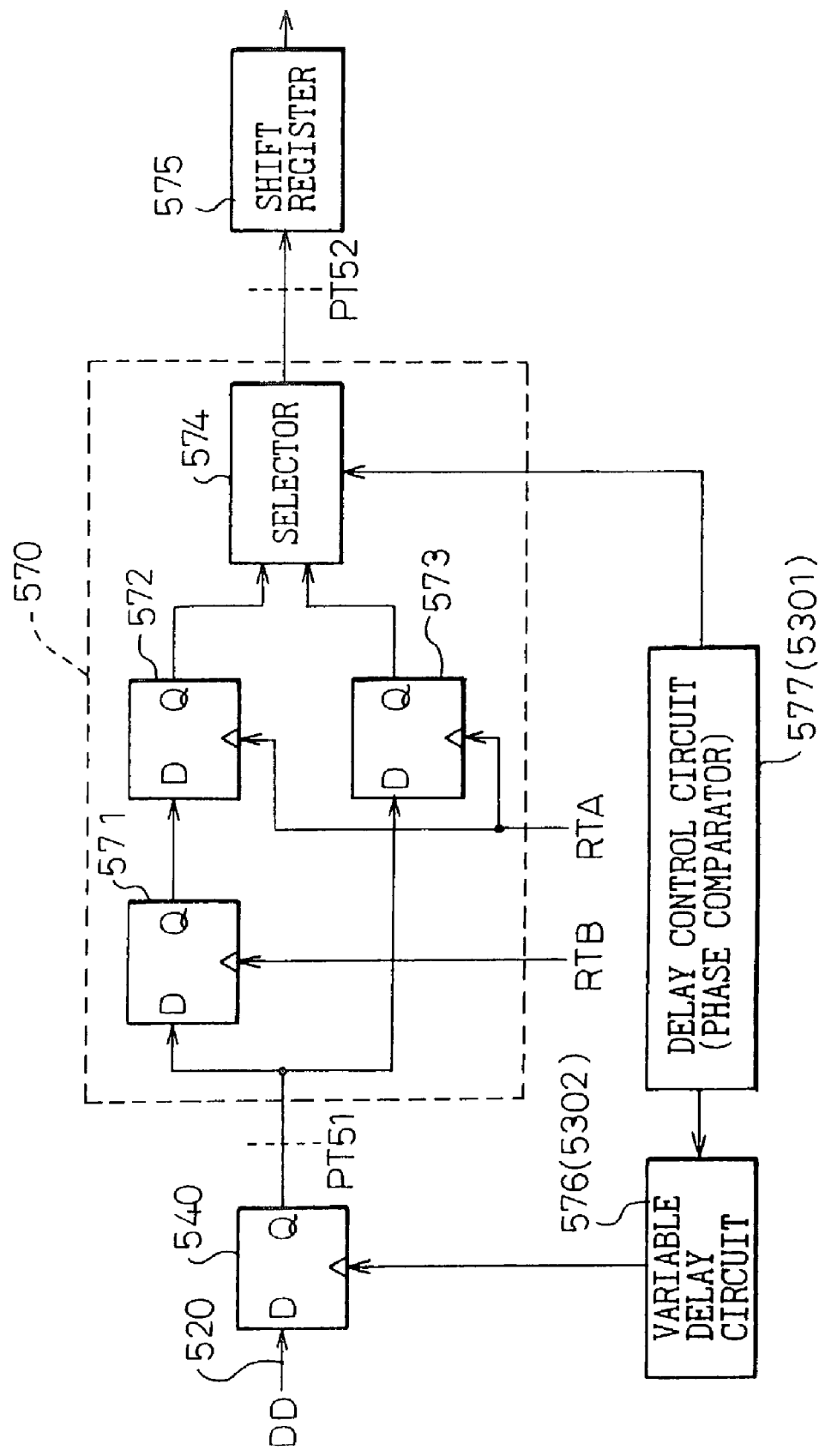
FIG. 22 is a block circuit diagram showing in schematic form a fifth embodiment of the signal transmission system according to the second aspect of the present invention.

FIG. 22 is a block circuit diagram showing in schematic form a fifth embodiment of the signal transmission system according to the second aspect of the present invention. In FIG. 22, reference numeral 570 is a retiming circuit, 571 to 573 are latch circuits, 574 is a selector, 575 is a shift register, 576 is a variable delay circuit, and 577 is a delay control circuit. The fifth embodiment is applied to the case where the variable delay circuit 576 is inserted in the path of the clock (strobe signal) used to drive the input latch 540 at the receiving end. The variable delay circuit 576 and delay control circuit 577 shown here correspond, for example, to the variable delay circuit 5302 and phase comparator circuit 5301 in the first embodiment shown in FIG. 14.

In the signal transmission system of the previously described first embodiment, for example, the variable delay circuit 576 (5302) is inserted in the path of the clock to the input latch 540 to enable the data DD to be latched at the optimum timing, but as for the signal passed through the input latch 540, though the signal level is digitized, the data change timing is different for each signal line (data line) 520 because of the skew on the cable.

In view of this, in the signal transmission system of the fifth embodiment, the input latch 540 is followed by the retiming circuit 570 to latch the data again so that all data will change at the same timing; furthermore, a one-bit or longer-than-one-bit delay between each data is adjusted by the shift register 575.

As shown in FIG. 22, the retiming circuit 570 comprises the latch circuits 571 to 573 and selector 574; either the output of the two-stage cascaded latch circuits 571 and 572 or the output of the latch circuit 573 is selected by the selector 574. Here, a strobe signal RTB is supplied to the latch circuit 571, and a strobe signal RTA to the latch circuits 572 and 573. The strobe signal RTA has a phase difference of 180 degrees with respect to the strobe signal RTB.

Figure 23:
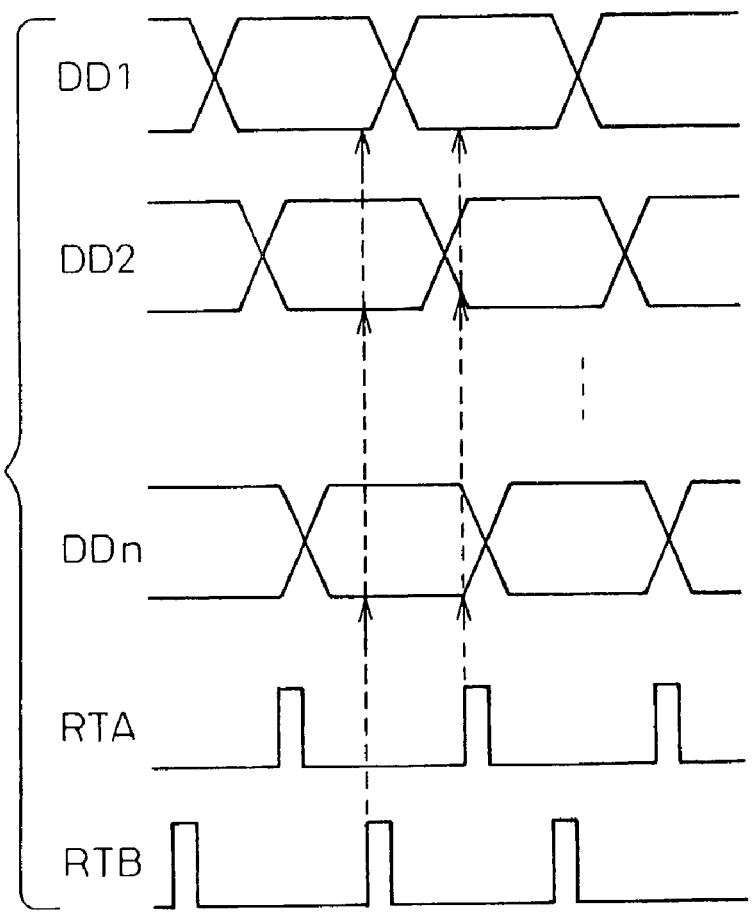
FIG. 23 is a timing diagram (part 1) for explaining one example of operation in the signal transmission system of FIG. 22.
Figure 24:
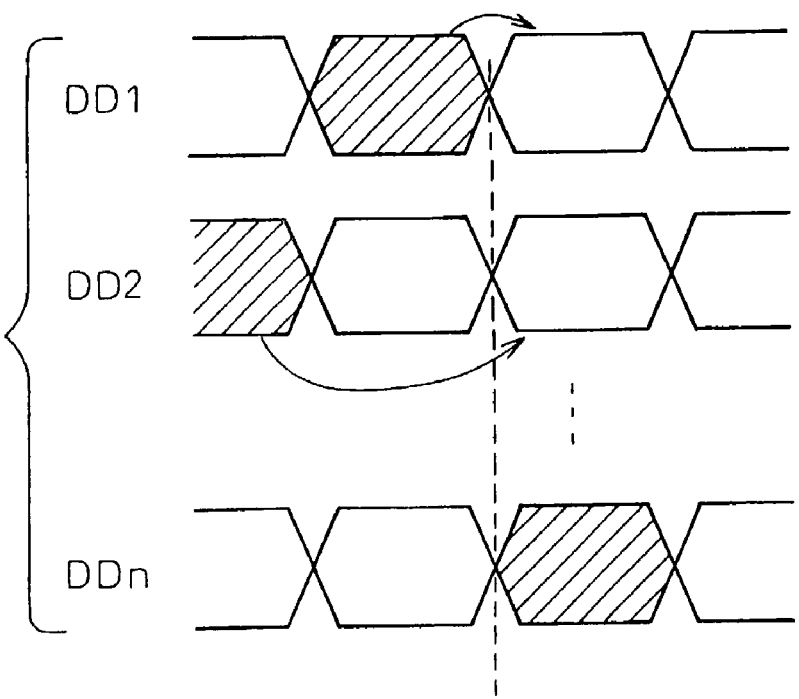
FIG. 24 is a timing diagram (part 2) for explaining one example of operation in the signal transmission system of FIG. 22.

FIGS. 23 and 24 are timing diagrams for explaining one example of operation in the signal transmission system of FIG. 22.

As shown in FIG. 23, though each data (signal) DD (DD1 to DDn) is latched at the optimum timing at the output position of the input latch 540 (541 to 54n) indicated by PT51 in FIG. 22, the data change timing is different for each data DD (DD1 to DDn) because of the skew due to the signal line, etc.

However, at whatever position each data changes, data latching is possible with the timing (rise timing) of at least one of the two signals (strobe signals), RTA and RTB, that are 180 degrees out of phase with respect to each other. More specifically, when the rise timing of one strobe signal RTA occurs in the transition region of the data DD2 and DDn, for example, the rise timing of the other strobe signal RTB, which is 180 degrees out of phase with respect to the signal RTA, invariably occurs during the period when the data DD2 and DDn are valid, and the data can thus be latched.

In the retiming circuit 570 of the fifth embodiment, the output of the input latch 540 is latched both by the latch circuit 571, to which the strobe signal RTB is supplied, and by the latch circuit 573, to which the strobe signal RTA is supplied, so that at least either one of the latch circuits can latch the correct data; further, with the provision of the latch circuit 572 following the latch circuit 571, the outputs of the latch circuits 571 (572) and 573 can be supplied to the selector 574 at the timing defined by the strobe signal RTA. Here, the output of the delay control circuit 577 is supplied to the selector 574 to determine which of the two outputs, the latch circuit 572 or 573, is to be selected.

As a result, as shown in FIG. 24, the data DD1 to DDn change at the same timing (the data are retimed) at the output position of the selector 574 indicated by PT52 in FIG. 22. There is, however, a possibility that a one-bit or a longer-than-one-bit delay may exist between the data DD1 to DDn.

For example, there can occur a case where the data DD1 is delayed by one bit with respect to the data DD2 and the data DDn is delayed by two bits with respect to the data DD2, as shown in FIG. 24. To address this, in the signal transmission system of the fifth embodiment, the shift register 575 is provided following the selector 574 to match (deskew) the output timing of all data to the timing of the data having the greatest delay (for example, the data DDn).

Figure 25:
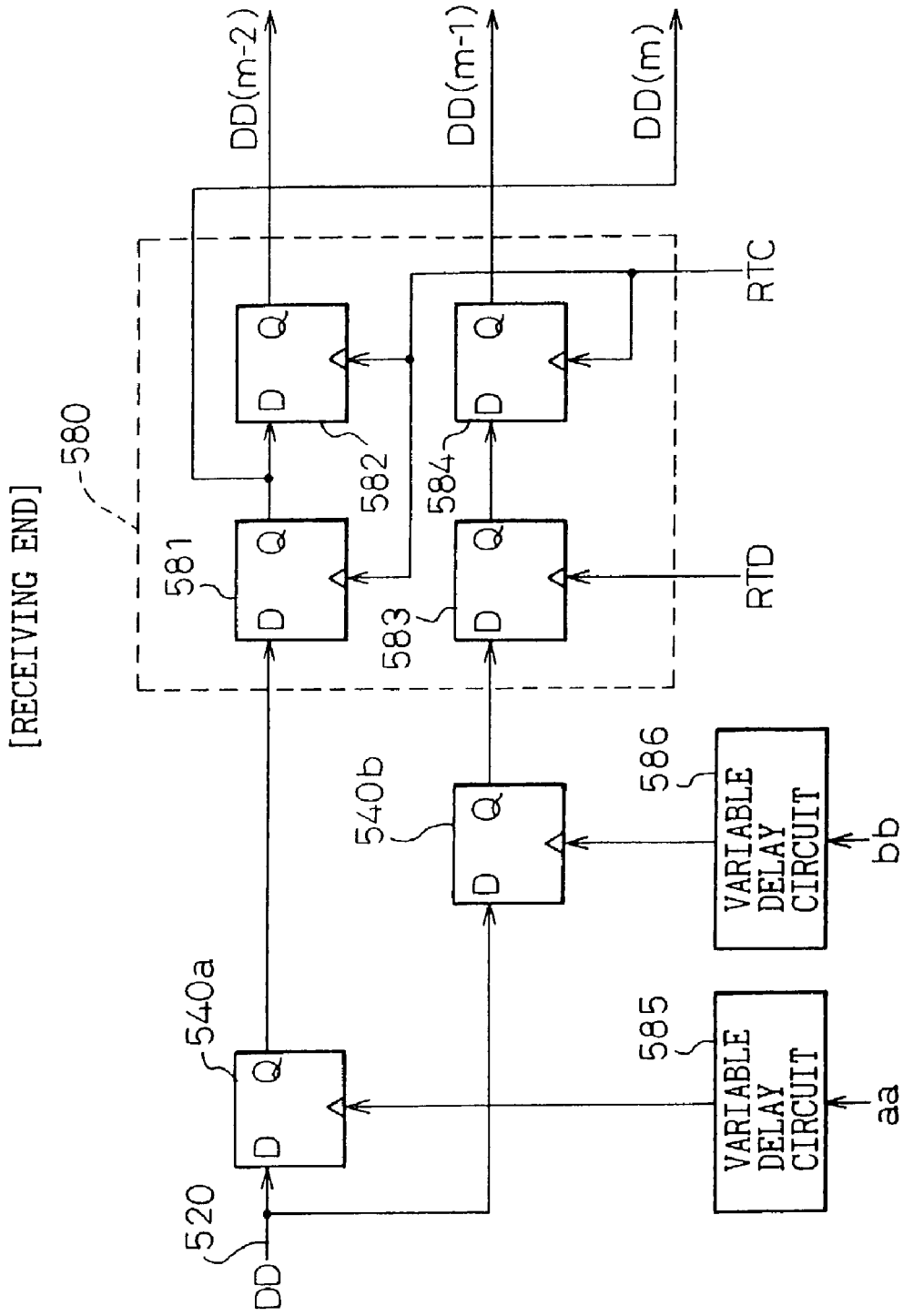
FIG. 25 is block circuit diagram showing in schematic form a sixth embodiment of the signal transmission system according to the second aspect of the present invention.

FIG. 25 is block circuit diagram showing in schematic form a sixth embodiment of the signal transmission system according to the second aspect of the present invention, and FIGS. 26 and 27 are timing diagrams for explaining one example of an operation in the signal transmission system of FIG. 25. In FIG. 25, reference numeral 580 is a retiming circuit, 581 to 584 are latch circuits, 585 and 586 are variable delay circuits, and 540a and 540b are input latches.

As shown in FIG. 25, in the signal transmission system of the sixth embodiment, the input latch 540 in the foregoing fifth embodiment is replaced by the two input latches 540a and 540b which operate in an interleaving fashion. More specifically, two clocks (strobe signals) aa and bb 180 degrees out of phase with respect to each other, as shown in FIG. 26, are supplied to the input latches 540a and 540b via the variable delay circuits 585 and 586, respectively, so that data are latched alternately by the two input latches 540a and 540b. Here, the frequency of the strobe signals aa and bb is twice the frequency of, for example, the signals RTA and RTB in the foregoing fifth embodiment, and the data DD ( . . . , DD(m−2), DD(m−1), DD(m), DD(m+1), DD(m+2), . . . ) sequentially transmitted over the signal line 520 are latched alternately by the input latches 540a and 540b. Accordingly, the input latches 540a and 540b need only operate at half the speed of the actual data rate (the transmitted signal rate). The above interleaving operation is not limited to interleaving between two parts, but the interleaving may be performed between three or more parts.

The retiming circuit 580 comprises a two-stage cascade of the latch circuits 581 and 582, which receives the output of the input latch 540a, and a two-stage cascade of the latch circuits 583 and 584, which receives the output of the other input latch 540b; a strobe signal RTC is supplied to the latch circuits 581, 582, and 584, and a strobe signal RTD is supplied to the latch circuit 583.

As shown in FIG. 27, the strobe signals RTC and RTD are 180 degrees out of phase with respect to each other and, using these signals as the strobe signals, the data DD ( . . . , DD(m−2), DD(m−1), DD(m), DD(m+1), DD(m+2), . . . ) sequentially transmitted over the signal line 520 can be received in the form of the outputs of the latch circuits 581, 582, and 584.

In this way, since the circuitry from the input latches (540a and 540b) onward can be operated at half the transmission rate of the signal line by virtue of the interleaving operation, the signal transmission system of the sixth embodiment is suitable for high-speed transmission of signals. This also offers the advantage of simplifying the circuit design because time constrains are eased for latch operations in the retiming circuit 580.

Figure 28:
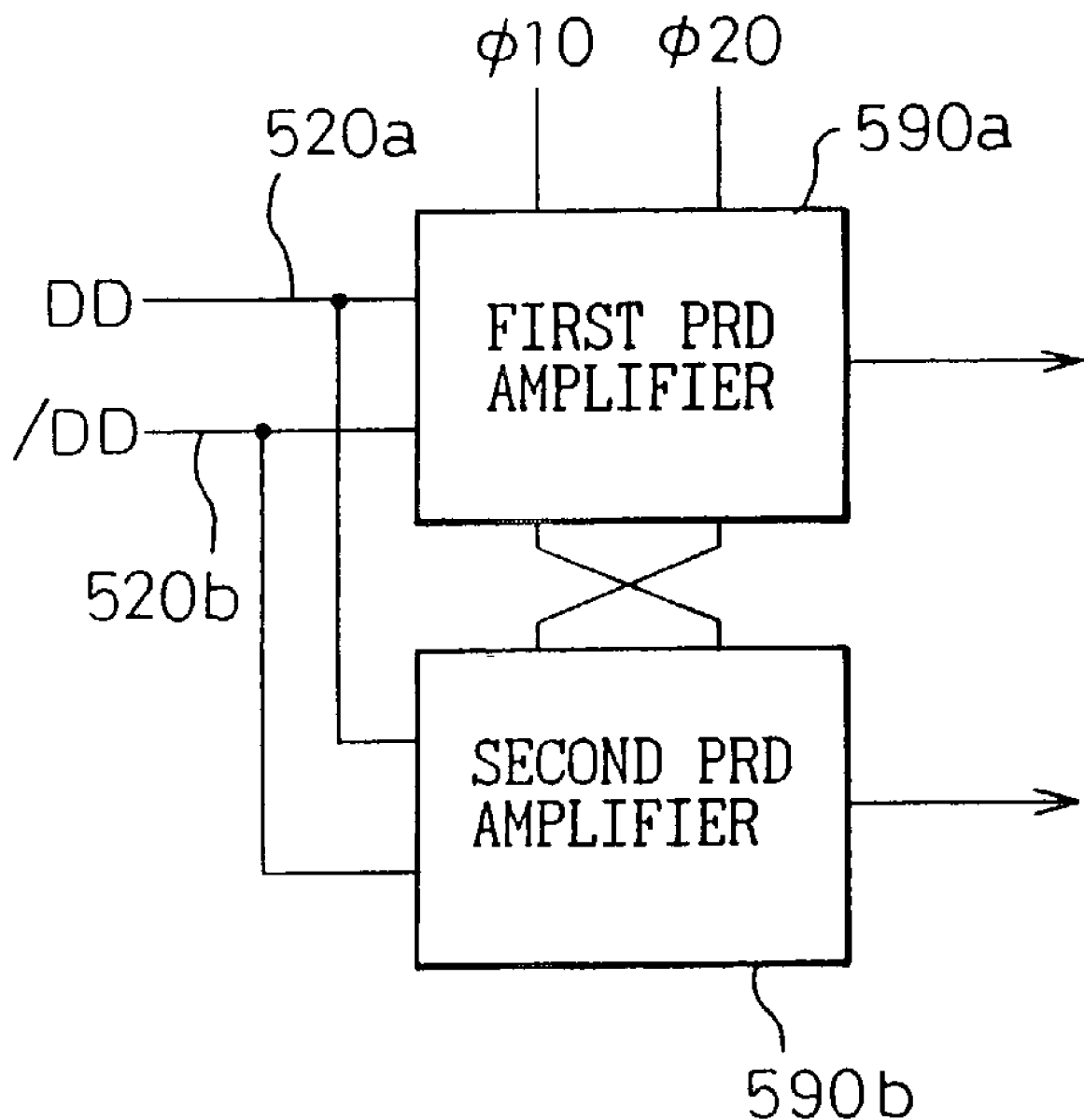
FIG. 28 is a block diagram showing in schematic form a seventh embodiment of the signal transmission system according to the second aspect of the present invention.

FIG. 28 is a block diagram showing in schematic form a seventh embodiment of the signal transmission system according to the second aspect of the present invention, in which a so-called PRD (Partial Response Detection) type latch (differential PRD receiver) is used as the interleaving latch. In FIG. 28, reference numerals 520a and 520b are signal lines for transmitting complementary signals (data) DD and /DD, and 590a and 590b are PRD amplifiers which operate in an interleaving fashion. In the seventh embodiment, the two signal lines 520a and 520b are provided for one data DD which is thus transmitted as complementary data DD and /DD. It will be appreciated that in other embodiments also, either a single line or differential (complementary) lines may be used for signal transmission.

As shown in FIG. 28, the receiver circuit (input latch) of the seventh embodiment comprises the first PRD amplifier 590a and second PRD amplifier 590b to which the complementary data DD and /DD are supplied, and which operate in interleaving fashion by being controlled by control signals φ10 and φ20. Here, output signals from the first and second PRD amplifiers 590a and 590b are processed, for example, via a serial-parallel conversion circuit or the like, for a lower operating frequency at the subsequent stage.

Figure 29:
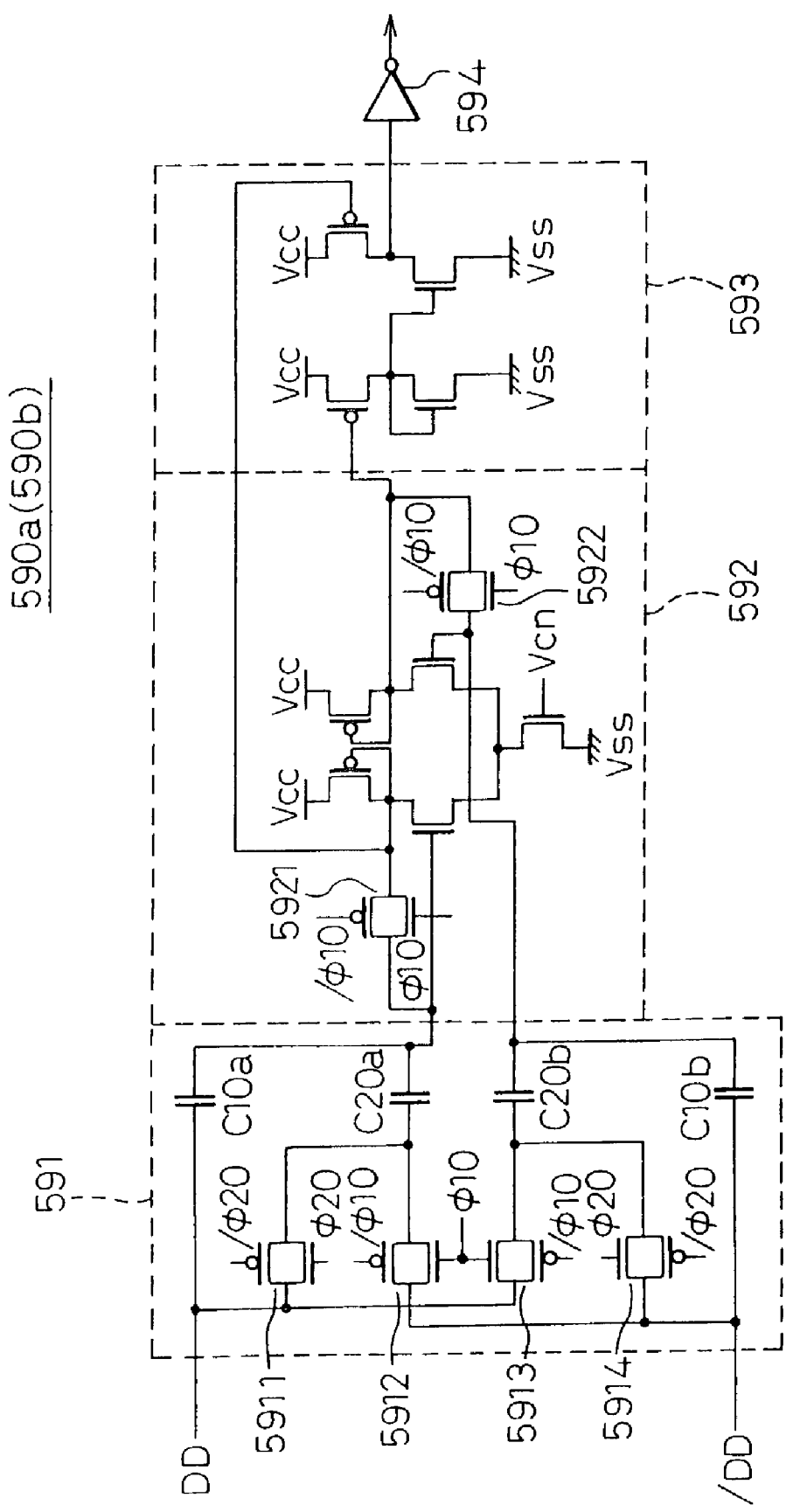
FIG. 29 is a circuit diagram showing one example of a PRD amplifier in the signal transmission system of FIG. 28.

FIG. 29 is a circuit diagram showing one example of the PRD amplifier in the signal transmission system of FIG. 28. In FIG. 29, reference numeral 591 is a PRD functional block, 592 is a differential amplifier block having a precharge function, and 593 and 594 are a waveform shaping differential amplifier and inverter.

Figure 31:
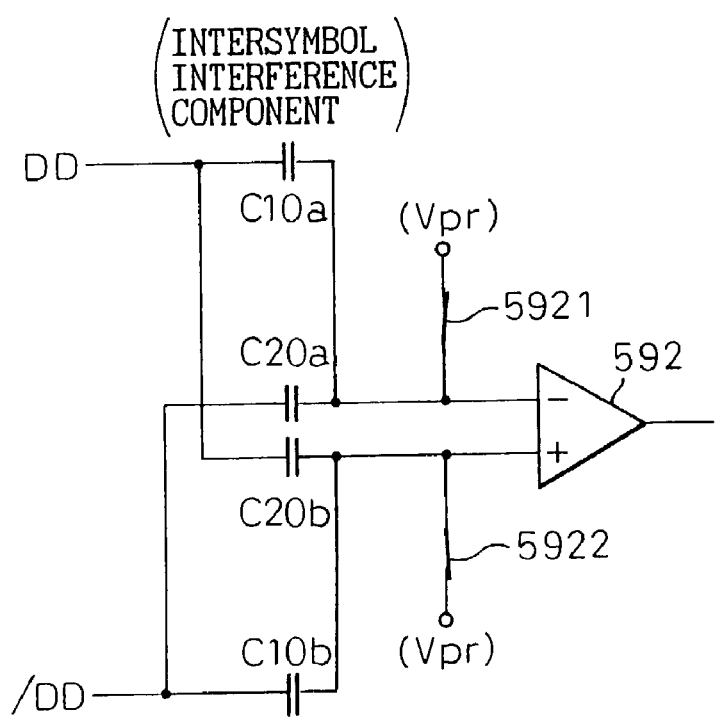
FIG. 31 is a diagram (part 1) for explaining one example of operation in the signal transmission system of FIG. 28.
Figure 32:
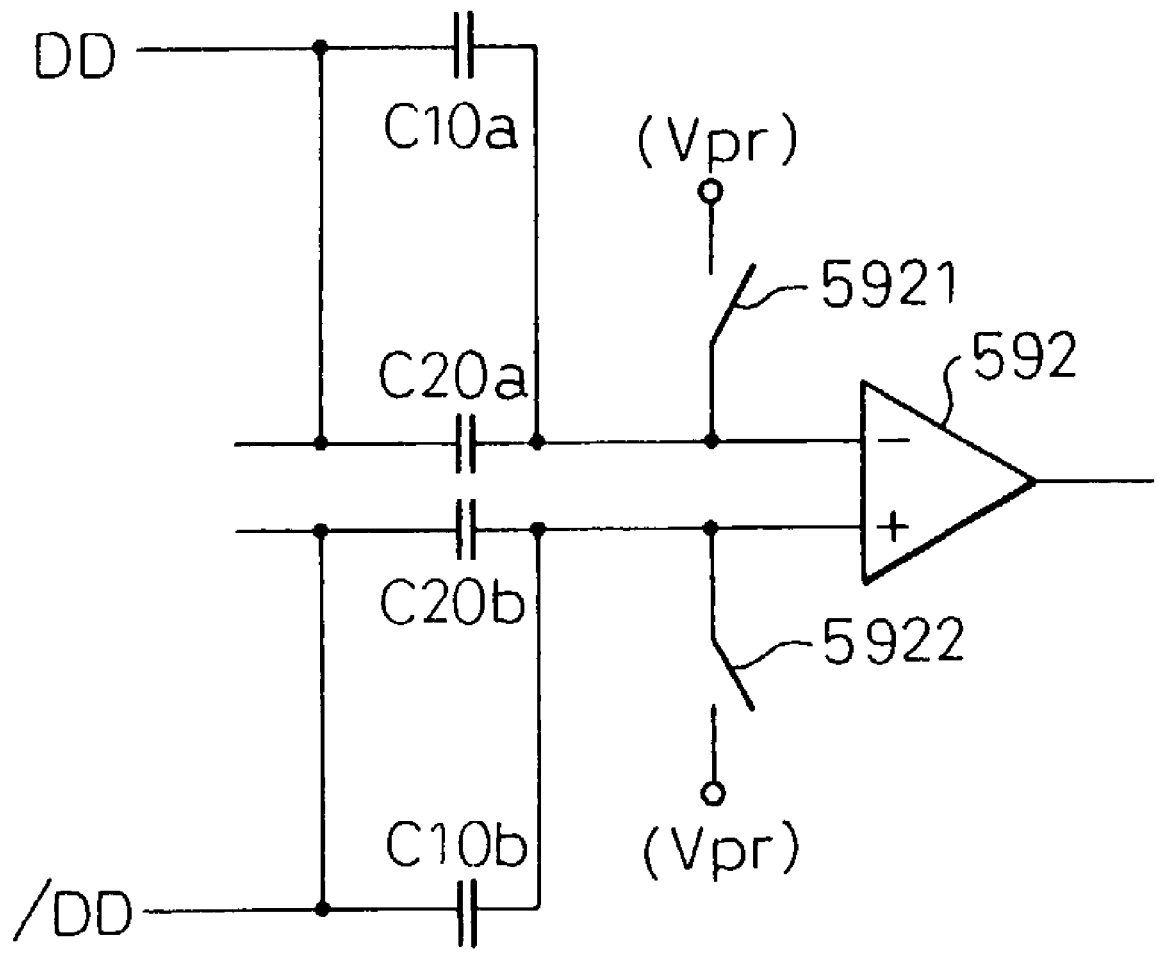
FIG. 32 is a diagram (part 2) for explaining one example of operation in the signal transmission system of FIG. 28.

As shown in FIG. 29, the PRD functional block 591 comprises four capacitors C10a, C10b, C20a, and C20b, and four transfer gates (switch means) 5911, 5912, 5913, and 5914, and the connections of the capacitors are controlled by the control signals φ10 (/φ10) and φ20 (/φ20) so that the intersymbol interference component elimination operation and signal decision operation shown in FIGS. 31 and 32 are performed alternately.

When using the circuit shown in FIG. 29 as a differential PRD receiver, the relation C20=⅓·C10 must hold between the capacitance C10 of the capacitors C10a and C10b and the capacitance C20 of the capacitors C20a and C20b. When using the circuit as an auto-zero receiver, not as a PRD receiver, C10 should be made equal to C20.

The differential amplifier block 592 differentially amplifies the input signals and makes a decision on the data. Further, the differential amplifier block 592 includes transfer gates 5921 and 5922 so that a precharge operation is performed during the intersymbol interference component estimation operation.

The differential amplifier 593 and inverter 594 are provided to amplify the output level of the differential amplifier block 592 and output a waveshaped signal. In the circuit of FIG. 29, complementary transfer gates are used as the switch devices, but other devices having switching functions can also be used; for example, the switch devices may be constructed using only NMOS transistors or only PMOS transfer gates. Further, the differential amplifier block 592 is configured as an NMOS gate-receiving type, but whether it should be configured as an NMOS gate-receiving type or PMOS gate-receiving type depends on technology, etc., and whichever is suitable can be chosen.

Figure 30:
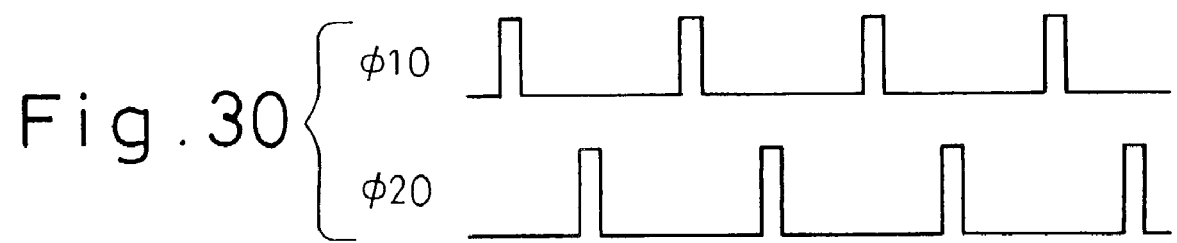
FIG. 30 is a diagram for explaining timing signals used in the signal transmission system of FIG. 28.

FIG. 30 is a diagram for explaining the timing signals (control signals φ10 and φ20) used in the signal transmission system of FIG. 28, and FIGS. 31 and 32 are diagrams for explaining one example of operation in the signal transmission system of FIG. 28.

The receiver circuit of the seventh embodiment shown in FIG. 28 performs interleaving operations such that, at one timing, one PRD amplifier (the first PRD amplifier 590a) performs an intersymbol interference component estimation operation while the other PRD amplifier (the second PRD amplifier 590b) is performing a data decision operation, and at the next timing, the one PRD amplifier (the first PRD amplifier 590a) performs a data decision operation while the other PRD amplifier (the second PRD amplifier 590b) is performing an intersymbol interference component estimation operation.

Here, in the PRD amplifier that is performing the intersymbol interference component estimation operation, precharging of the same PRD amplifier is being performed at the same time, and the input level is precharged to a prescribed voltage (precharge voltage Vpr) through the transfer gates 5921 and 5922. Since this precharging is performed in the background during the interleave data read period, the precharge time does not affect the data transfer cycle.

According to the signal transmission system of the seventh embodiment, since the component associated with the first-order response of the signal transmission system is eliminated from the intersymbol interference contained in the input signal (data DD, /DD), stable reception unaffected by signal DC drift becomes possible. Further, in an auto-zero receiver also, where the relation between the capacitance C10 of the capacitors C10a and C10b and the capacitance C20 of the capacitors C20a and C20b is set to C10=C20, phase noise, etc. can be eliminated, and a greatly improved phase noise withstanding characteristic is obtained.

Figure 33:
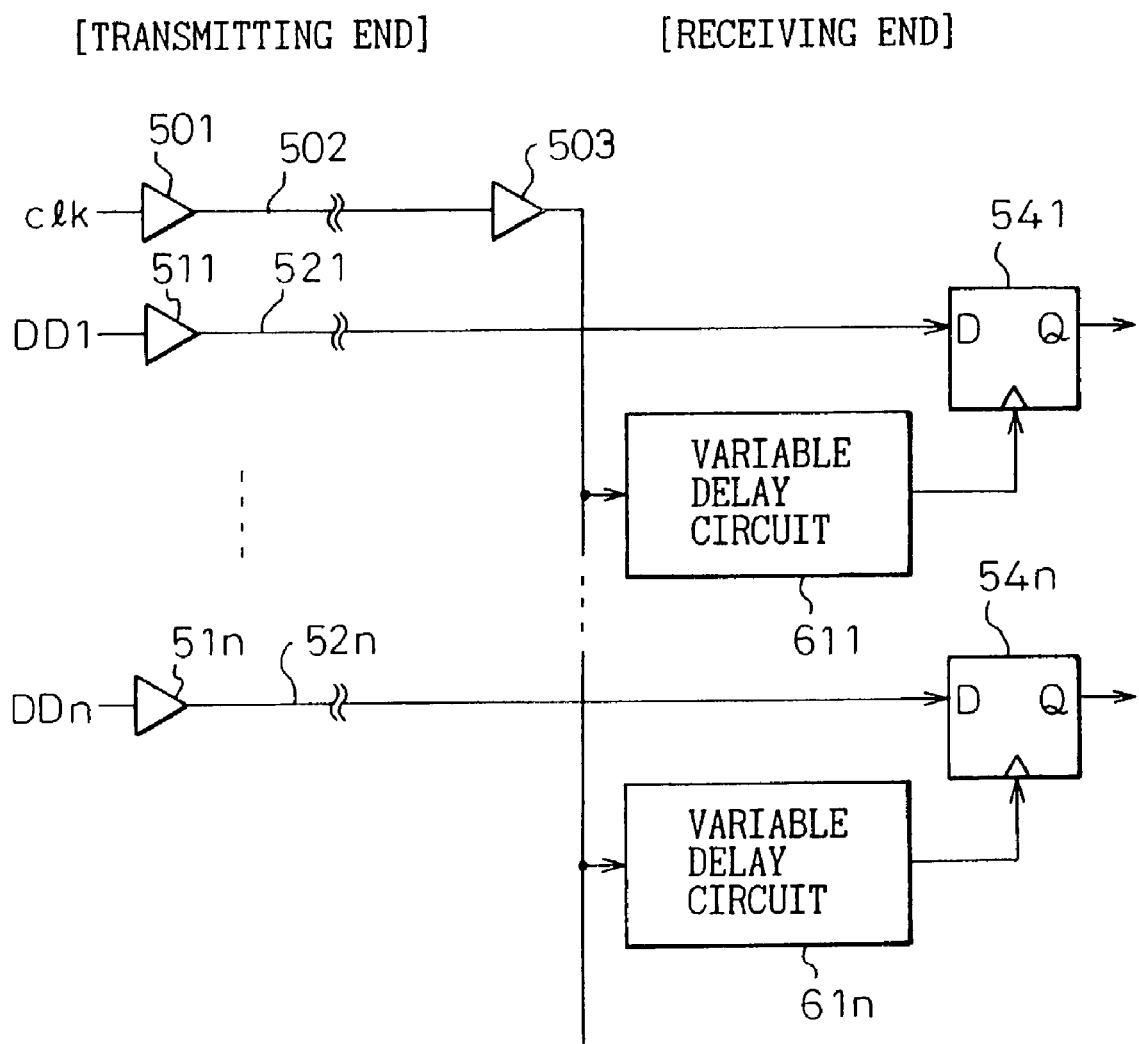
FIG. 33 is a block circuit diagram showing in schematic form an eighth embodiment of the signal transmission system according to the second aspect of the present invention.

FIG. 33 is a block circuit diagram showing in schematic form an eighth embodiment of the signal transmission system according to the second aspect of the present invention. In FIG. 33, reference numeral 501 is a drive circuit (clock driver) for the clock clk at the transmitting end, 502 is a clock line, 503 is a clock receiver, and 611 to 61n are variable delay circuits (clock timing adjusting circuits).

As shown in FIG. 33, in the signal transmission system of the eighth embodiment, the timing of the transmitted clock clk is adjusted at the receiving end by the variable delay circuits 611 to 61n provided for the input latches 541 to 54n, to optimize data latching timing at the input latches 541 to 54n.

Here, the clock clk is sent from the transmitting end together with the data DD1 to DDn (the clock is sent as special data of a bit pattern repeating as "0101 . . . "); if there is jitter in the clock generating circuit at the transmitting end, the jitter is common to all transmitted data and clock clk. Accordingly, in the signal transmission system of the eighth embodiment, jitter causes no ill effect as long as the data are latched using this clock clk.

Figure 34:
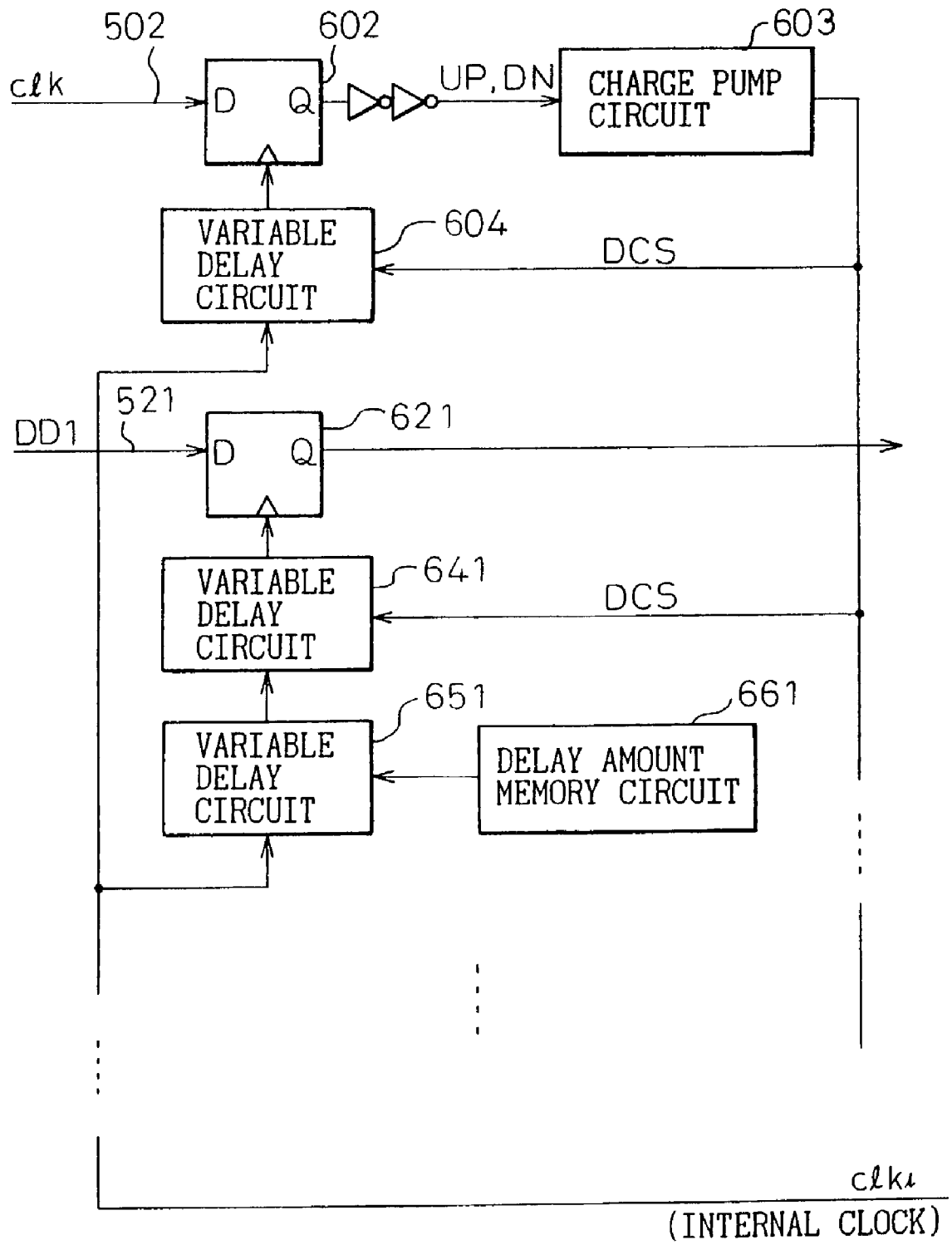
FIG. 34 is a block circuit diagram showing in schematic form a ninth embodiment of the signal transmission system according to the second aspect of the present invention.

FIG. 34 is a block circuit diagram showing in schematic form a ninth embodiment of the signal transmission system according to the second aspect of the present invention. In FIG. 34, reference numerals 602 and 621 are latch circuits, 603 is a charge pump circuit, 604, 641, and 651 are variable delay circuits, and 661 is a delay amount memory circuit. Here, the output of the latch circuit 602 is supplied to the charge pump circuit 603 via two stages of inverters.

As shown in FIG. 34, in the signal transmission system of the ninth embodiment, as in the foregoing eighth embodiment, the clock clk is sent from the transmitting end together with the data DD1 (DD1 to DDn). This clock clk is latched by the input latch (latch) 602 identical in configuration to other data receiving latches; here, an internal clock clki passed through the variable delay circuit 604 is used as the strobe signal to latch the clock clk in the latch 602. That is, the clock used to drive the latch 602 is obtained by passing the reference clock (internal clock clki) at the receiving end through a variable delay stage (the variable delay circuit 604).

In the above configuration, if a delay is given to the internal clock clki by issuing a signal to increase the delay (Down: DN) when the output of the input latch 602 is "0" (low level "L") and a signal to decrease the delay (up: UP) when the output is "1" (high level "H"), the timing with which to latch the clock clk can be locked onto the rising of the internal clock clki. Then, using the UP/DN signal, the charge pump circuit 603 is operated, and a delay control signal DCS from the charge pump circuit 603 is supplied to the variable delay circuit 604 to control the delay. Further, the delay control signal DCS is also supplied to the variable delay circuit 641 to likewise control the clock timing of the input latch 621 for another data line in a variable manner; in this way, the jitter component simultaneously impressed on the clock clk and data DD1 can be eliminated, as in the foregoing eighth embodiment, preventing an ill effect from being caused to the output. In addition to the advantage of the foregoing eighth embodiment, the signal transmission system of the ninth embodiment has the advantages that the noise superimposed on the clock clk can be eliminated, and that there is no need to make special provision to match the phase shift at the clock receiving system with the phase at the data receiving system, since exactly the same laches 602 and 621 can be used for the reception of the clock clk and the data DD1 (DD1 to DDn).

Figure 35:
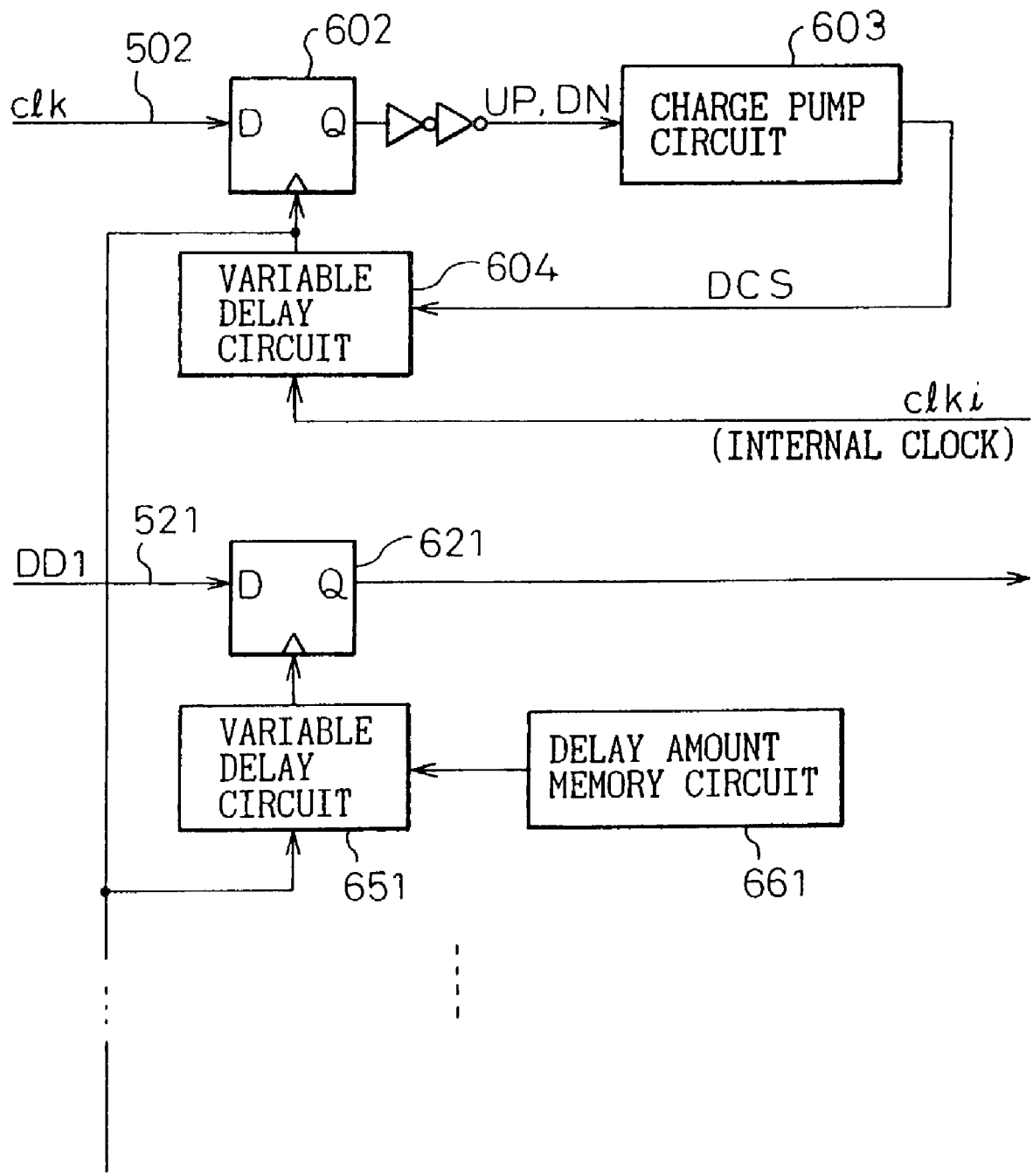
FIG. 35 is a block circuit diagram showing in schematic form a modified example of the signal transmission system of FIG. 34.

FIG. 35 is a block circuit diagram showing in schematic form a modified example of the signal transmission system of FIG. 34.

As can be seen from the comparison between FIGS. 34 and 35, in the modified example, the variable delay circuit (641), provided for each data DD1 (DD1 to DDn), for delaying the internal clock clki is removed, and the output of the variable delay circuit 604 supplied as the strobe signal to the clock latch 602 is also supplied to the variable delay circuit 651 provided for each data DD1.

Figure 36:
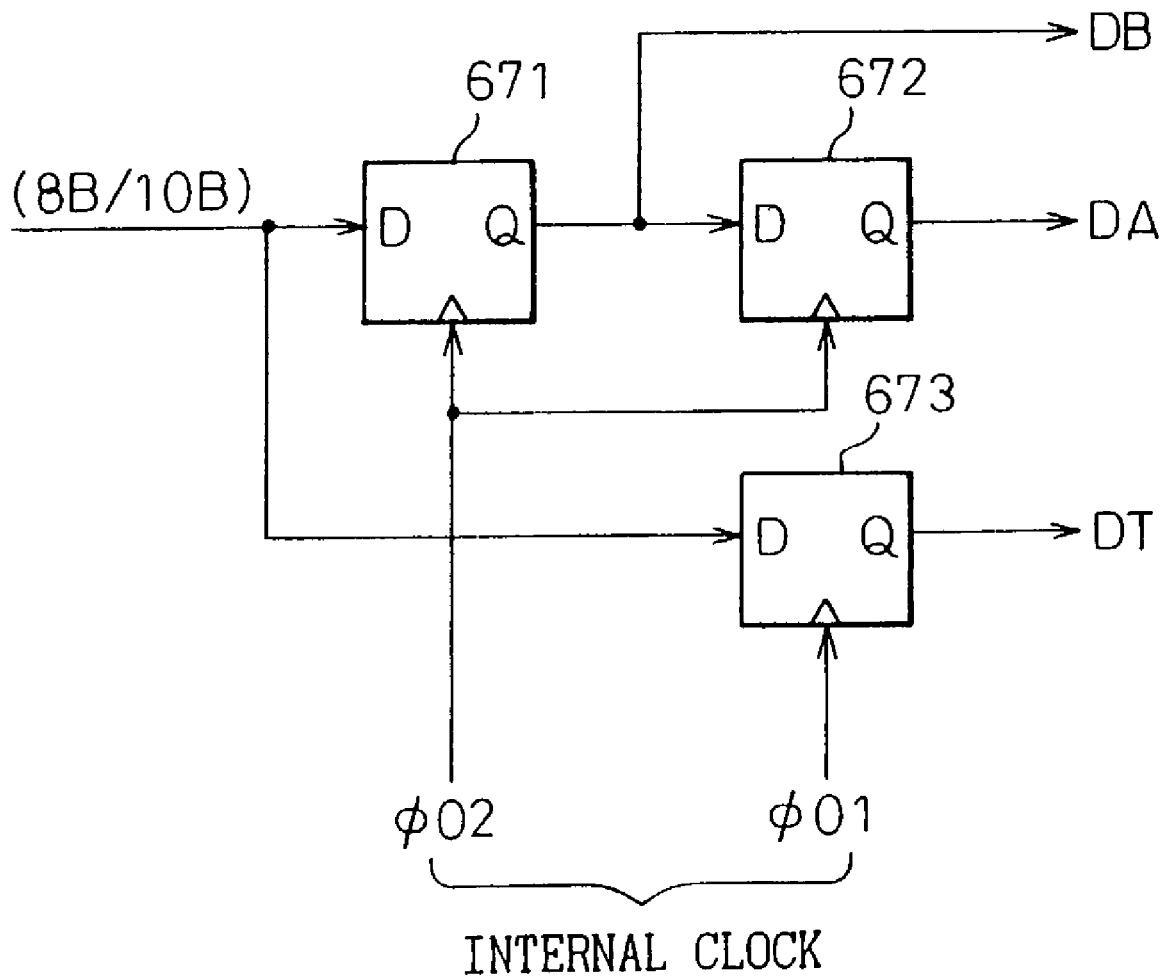
FIG. 36 is a block circuit diagram showing in schematic form a 10th embodiment of the signal transmission system according to the second aspect of the present invention.

FIG. 36 is a block circuit diagram showing in schematic form a 10th embodiment of the signal transmission system according to the second aspect of the present invention. This embodiment is applicable, for example, to a coding scheme, such as 8B/10B, where the existence of a clock component in a data sequence is guaranteed. In FIG. 36, reference numerals 671 to 673 are latch circuits.

As shown in FIG. 36, in the signal transmission system of the 10th embodiment, a signal carrying data and clock coded using, for example, 8B/10B code is latched by the three latches 671, 672, and 673. That is, a strobe signal (internal clock) φ02 is supplied to the latches 671 and 672, and a strobe signal (internal clock) φ01 to the latch 673. Here, the strobe signals φ01 and φ02 are 180 degrees out of phase with respect to each other.

Figures 37, 38:
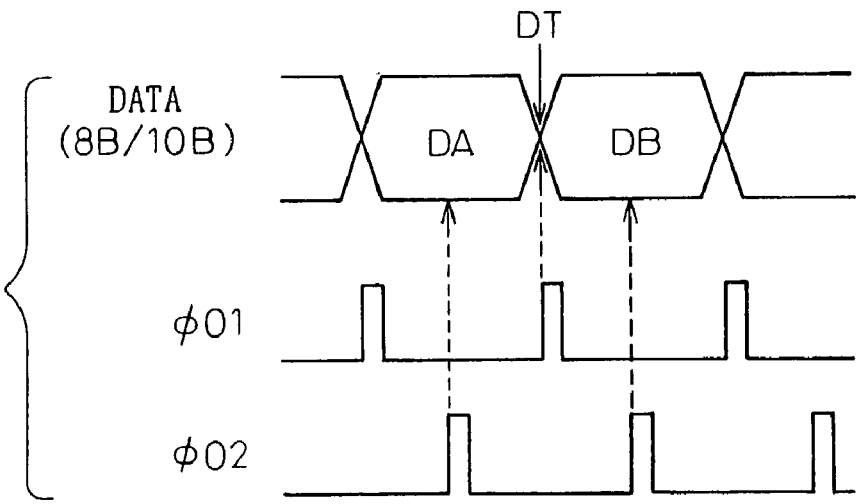
FIG. 37 is a timing diagram for explaining one example of operation in the signal transmission system of FIG. 36.
FIG. 38 is a diagram showing the relationship between the internal clock state and the output of each latch in the signal transmission system of FIG. 36.

FIG. 37 is a timing diagram for explaining one example of operation in the signal transmission system of FIG. 36, and FIG. 38 is a diagram showing the relationship between the internal clock state and the output of each latch in the signal transmission system of FIG. 36.

As shown in FIG. 37, the strobe signals φ01 and φ02 are shifted in phase by 180 degrees with respect to each other; for example, when the rise timing of the strobe signal φ01 occurs in the transient region (DT) of data (for example, a signal coded by 8B/10B code), the rise timing of the strobe signal φ02 occurs near the center of the period during which the data is valid. Here, since the latches 671 and 672 are supplied with the strobe signal φ02, the data DB currently being received, for example, is the output of the latch 671 and the data DA immediately preceding the data DB is the output of the latch 672. That is, if the output of the latch 673 that latched the data by the strobe signal φ01 coincides with the transient region (a data window boundary) DT of the data, the data can be output correctly by the latch 671 that latched the data by the strobe signal φ02 which is shifted in phase by 180 degrees with respect to the strobe signal φ01.

FIG. 38 shows the relationship of the output of the latch 671 (current data DB), the output of the latch 672 (immediately preceding data DA), and the output of the latch 673 (transient region data DT), relative to the internal clocks (strobe signals φ01 and φ02). That is, when DA, DT, DB are "0, 0, 1" or "1, 1, 0", this indicates that the internal clock φ01, φ02) is advanced, in which case the internal clock (φ01, φ02) is delayed using, for example, the signal DN. On the other hand, when DA, DT, DB are "0, 1, 1" or "1, 0, 0", this indicates that the internal clock φ01, φ02) is delayed, in which case the internal clock φ01, φ02) is advanced using, for example, the signal UP. Here, the internal clock adjustment using the signal UP or DN can be accomplished using the charge pump circuit and variable delay circuit, or other known circuits.

In the signal transmission system of the 10th embodiment, a special period (calibration mode) is provided to adjust the latch timing for normal data; if the data is coded using 8B/10B code, for example, and the existence of a clock component in the data sequence is thus guaranteed, the adjustment work can be performed at all times during data reception (data transmission mode).

Figure 39:
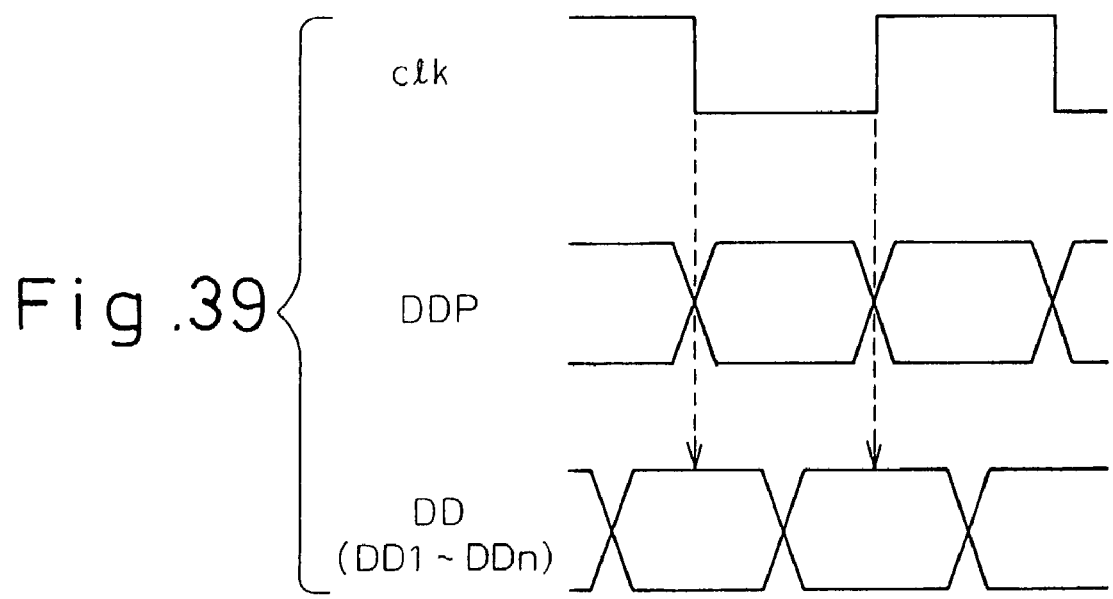
FIG. 39 is a timing diagram for explaining an 11th embodiment of the signal transmission system according to the second aspect of the present invention.

FIG. 39 is a timing diagram for explaining an 11th embodiment of the signal transmission system according to the second aspect of the present invention. The signal transmission system of the 11th embodiment employs, for example, a configuration similar to that of the eighth embodiment shown in FIG. 33, and transmits from the transmitting end phase-adjusting data DDP (a bit sequence of 0101 . . . ) 180 degrees out of phase with respect to normal data and, at the receiving end, the clock clk is synchronized to the phase-adjusting data DDP. For example, the amount of delay in the variable delay circuit is controlled so that the rise and fall timings of the clock clk each coincide with a data window boundary. FIG. 39 shows the case of DDR (Double Data Rate), that is, an example of the case where data are latched at both the rise and fall timings of the clock clk. It will be appreciated that in other embodiments of the signal transmission system of the present invention, DDR can be applied so that data can be latched at both the rise and fall timings of the clock.

After the clock clk has been synchronized to the phase-adjusting data DDP, actual data DD (DD1 to DDn) is transmitted. Since the actual data is shifted in phase by 180 degrees with respect to the phase-adjusting data DDP, the rise and fall timings of the clock clk synchronized to the phase-adjusting data DDP occur at the center of the data window (the center of the period during which the data is valid).

Since there is no need to provide a circuit, etc. at the receiving end for shifting the clock phase by 180 degrees, the signal transmission system of the 11th embodiment can simplify the receiver circuit, and can reduce, for example, the power consumption at the receiving end.

Figure 40:
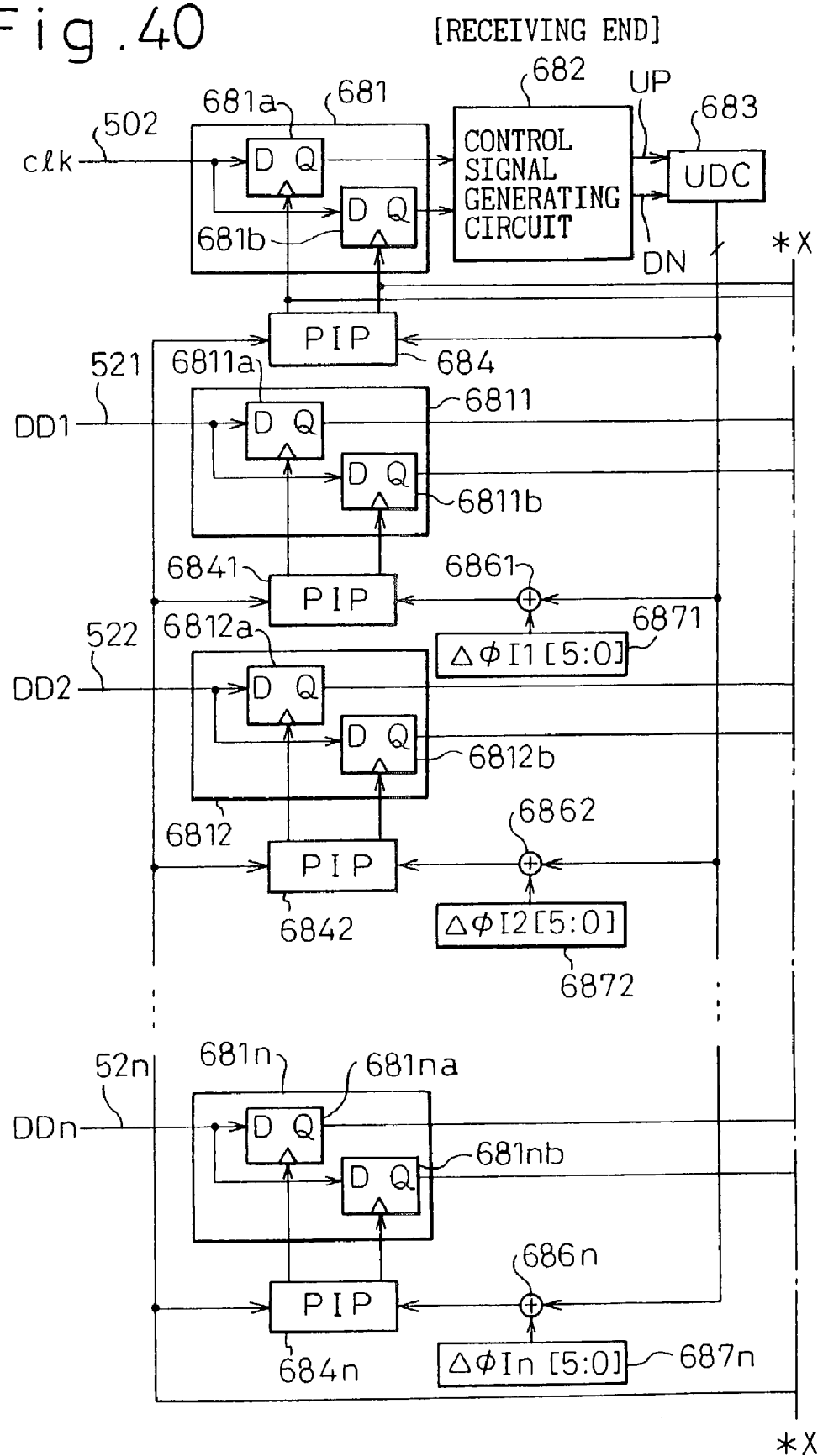
FIG. 40 is a block circuit diagram (part 1) showing a 12th embodiment of the signal transmission system according to the second aspect of the present invention.
Figure 41:
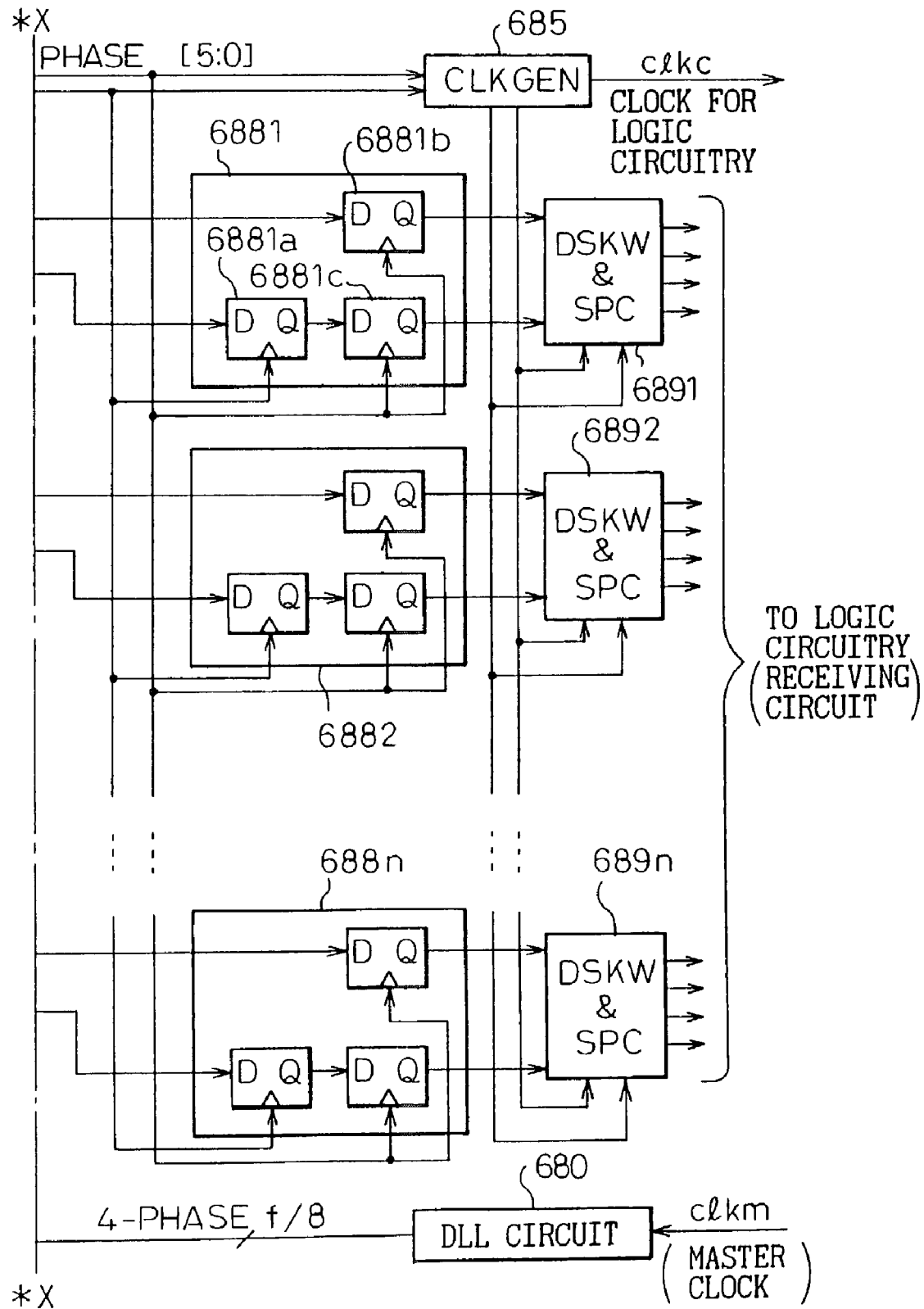
FIG. 41 is a block circuit diagram (part 2) showing the 12th embodiment of the signal transmission system according to the second aspect of the present invention.

FIGS. 40 and 41 are block circuit diagrams showing a 12th embodiment of the signal transmission system according to the second aspect of the present invention. In FIGS. 40 and 41, reference numeral 680 is a DLL (Delay Locked Loop) circuit, 681 is a latch block for the clock clk, 682 is a control signal generating circuit, 683 is an up-down counter (UDC), 684 is a phase interpolator (PIP), and 685 is a clock generating circuit (CLKGE). Further, reference numerals 6811 to 681n are latch blocks for the data DD1 to DDn, respectively, 6841 to 684n are phase interpolators (PIP), 6861 to 686n are adder circuits, 6871 to 687n are initial value setting circuits for the respective data lines (521 to 52n), 6881 to 688n are retiming circuits, and 6891 to 689n are deskew and serial-to-parallel conversion circuits (DSKW & SPC).

As shown in FIGS. 40 and 41, in the signal transmission system of the 12th embodiment, the clock clk transmitted over the clock signal line 502 is latched by the clock latch block 681. The clock latch block 681 comprises two latch circuits 681a and 681b which are supplied with the clock clk and operate in interleaving fashion. The latch circuits 681a and 681b are each configured to latch the clock clk at prescribed timing by a signal (strobe signal) from the phase interpolator 684.

The control signal generating circuit 682 outputs an up signal UP and down signal DN to the up-down counter 683 in accordance with the outputs of the latch circuits 681a and 681b, and the up-down counter 683 counts the up signal UP and down signal DN for feedback control of the phase interpolator 684, thereby controlling the timing of the strobe signals to the latch circuits 681a and 681b. The output of the up-down counter 683 is also supplied to the phase interpolators 6841 to 684n for the respective data DD1 to DDn, to control the latch timing at the latch circuits 6811a, 6811b to 681na, 681nb in the respective latch blocks 6811 to 681n.

Here, the initial value setting circuits 6871 to 687n, provided for the respective data lines 521 to 52n, perform a phase adjusting test as a calibration mode, for example, when power is turned on, and store delay amounts for the respective signal lines; then, their initial values and the output of the up-down counter 683 are added together by the respective adder circuits 6861 to 686n, and the results are supplied to the respective phase interpolators 6841 to 684n which absorb phase variations between the respective signal lines at the initial condition to ensure that the data are latched correctly in the normal data transmission mode. Further, a master clock (receiving clock) clkm is processed by the DLL circuit 680, and a four-phase clock obtained by dividing the frequency f of the clock clkm by 8 is supplied to each of the phase interpolators 684 and 6841 to 684n. The signal supplied from the up-down counter 683 to the phase interpolators 684 and 6841 to 684n and the initial values stored in the initial value setting circuits 6871 to 687n are, for example, 6-bit signals. The up-down counter 683 here corresponds, for example, to the charge pump 603 in the ninth embodiment shown in FIG. 34. However, while the charge pump 603 in the ninth embodiment processes the phase information of the clock in an analog manner, the up-down counter 683 in the 12th embodiment differs in that the clock phase information is processed as a digital value.

The outputs of the phase interpolator 684 are supplied to the retiming circuits 6881 to 688n as well as to the clock generating circuit 685 which generates a clock clkc for logic circuitry. The retiming circuit 6881 (6881 to 688n) comprises three latch circuits 6881a, 6881b, and 6881c; the same strobe signal as supplied to the latch circuit 681a in the clock latch block 681 is supplied to the latch circuit 6881a, while the same strobe signal as supplied to the latch circuit 681b in the clock latch block 681 is supplied to the latch circuits 6881b and 6881c.

From the retiming circuits 6881 to 688n, signals changing with the same timing, such as the data DD1 to DDn shown, for example, in FIG. 24, are obtained. However, as previously explained with reference to FIG. 24, there is a possibility that a one-bit or a longer-than-one-bit delay may exist between these data DD1 to DDn. To address this, the outputs of the retiming circuits 6881 to 688n are supplied to the deskew and serial-to-parallel conversion circuits (DSKW & SPC) 6891 to 689n where processing is performed so that the output timing of all data is adjusted to match the timing of the data having the greatest delay. Further, the deskew and serial-to-parallel conversion circuits 6891 to 689n perform serial-to-parallel conversion of data, thereby lowering the operating frequency in the logic circuits (the receiving circuit).

In this way, according to the signal transmission system of the 12th embodiment, since the distribution of the clock phase information is performed using digital signals, there is no concern of the occurrence of jitter during the transmission process, and stable transmission and reception of multi-bit signals can thus be achieved.

As described above, according to the embodiments of the second aspect of the present invention, signals can be received correctly, for example, even when there exists a skew many times greater than the data period, and furthermore, since signal latch timing is optimized for each data line, high-speed, error-free signal transmission can be achieved.

As described in detail above, according to the signal transmission system of the second aspect of the present invention, large-capacity, error-free signal transmission can be performed at high speed without being affected by skew.

Next, a description will be given of a timing signal generating circuit according to a third aspect of the present invention, but before that, one example of a prior art timing signal generating circuit will be described with reference to FIG. 42.

Figure 42:
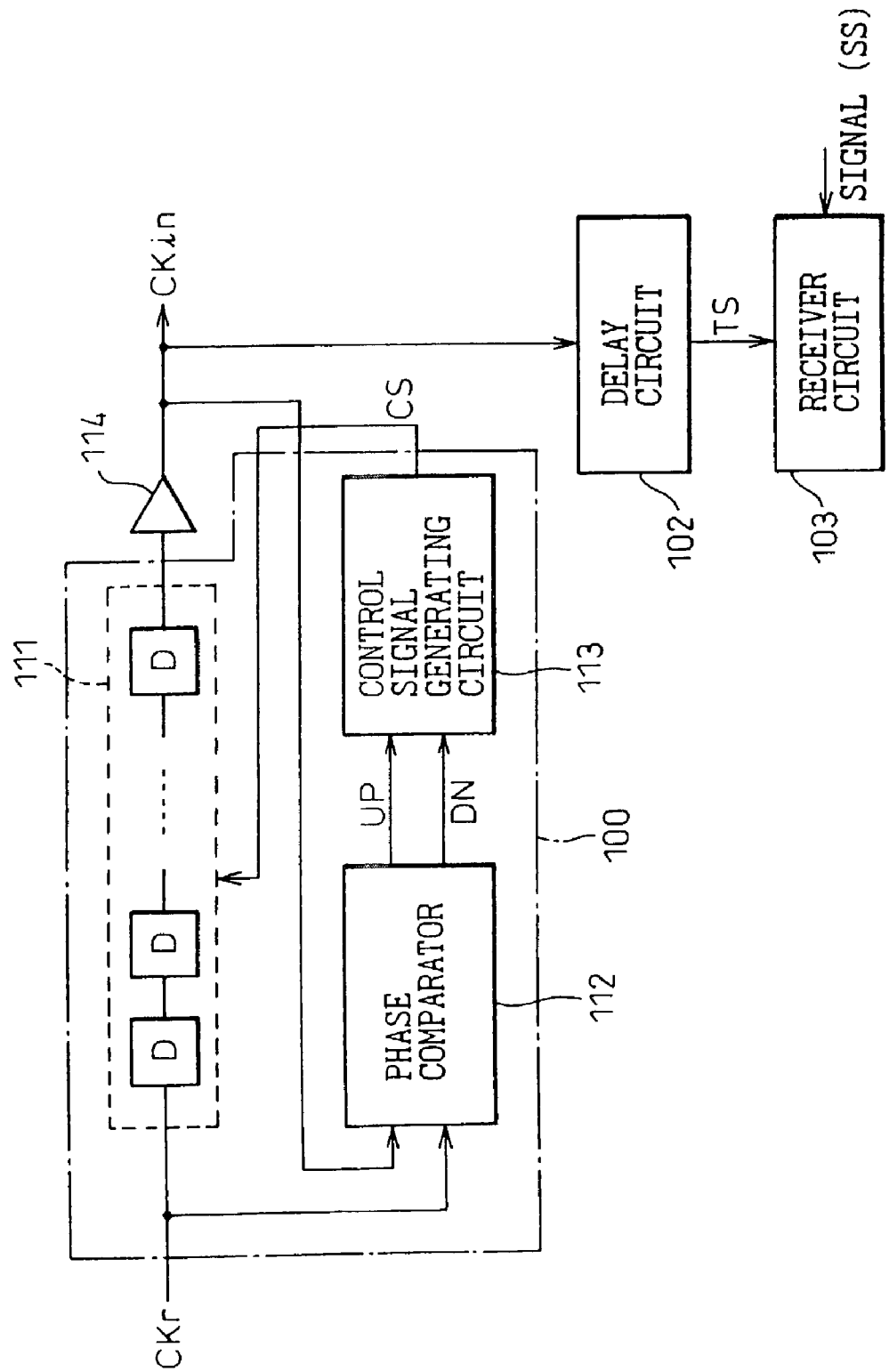
FIG. 42 is a block diagram showing one example of a prior art timing signal generating circuit.

FIG. 42 is a block diagram showing one example of a prior art timing signal generating circuit which uses a DLL circuit.

In FIG. 42, reference numeral 100 is the DLL circuit, 111 is a variable delay line, 112 is a phase comparator circuit, 113 is a control signal generating circuit, 114 is a drive circuit (clock driver), 102 is a delay circuit, and 103 is a receiver circuit.

The DLL circuit 100 comprises the variable delay line 111, phase comparator circuit 112, and control signal generating circuit 113. Reference clock CKr and the output of the clock driver 114 (internal clock CKin) are supplied as inputs to the phase comparator circuit 112, and the amount of delay (the number of stages of delay units D) in the variable delay line 111 is controlled in such a manner as to minimize the phase difference between the clocks CKr and CKin. More specifically, the phase comparator circuit 112 supplies an up signal UP or down signal DN to the control signal generating circuit 113 depending on the phase difference between the reference clock CKr and the internal clock CKin, and the control signal generating circuit 113 controls the amount of delay in the variable delay line 111 by issuing a control signal (a signal for selecting the number of stages of the delay units D) CS in accordance with the up signal UP or down signal DN. In this way, the internal clock CKin, phase-synchronized to the reference clock CKr, is generated.

The output of the clock driver 114 is supplied as the internal clock CKin of the LSI chip (semiconductor integrated circuit device); the internal clock CKin is supplied via the delay circuit (with an appropriate number of delay stages) 102 and used, for example, as a timing signal TS in the receiver circuit 103. That is, the receiver circuit 103 latches, for example, a transmitted signal SS by the internal clock CKin supplied via the delay circuit 102. Here, the delay circuit 102 is provided to generate the timing signal TS by adjusting the timing of the internal clock CKin that has been delayed due to the drive capability of the clock driver 114, the load capacitance of the signal line, etc.

In the above-described prior art timing signal generating circuit using the DLL circuit shown in FIG. 42, or a timing signal generating circuit having a similar configuration but using a PLL circuit instead of the DLL circuit, the internal clock CKin phase-synchronized to the reference clock CKr can be generated, but when using the internal clock CKin, for example, for high-speed signal transmission between LSI chips, there are problems yet to be solved.

First, for signal transmission between LSI chips (or between electronic apparatuses), multi-bit transmission is often employed that uses a plurality of signal lines in order to obtain the necessary signal transmission bandwidth, but in that case, optimum receiving timing differs for each bit because of variations of the delay characteristics of the respective signal lines, etc. To address this, a plurality of DLL circuits, for example, are provided to adjust the timing for the respective bits, but this involves the problem that the circuit size becomes excessively large.

Further, even in the case of one-bit wide transmission, the optimum receiving timing at the receiver circuit is usually different from the rise timing or fall timing of the reference clock CKr, which therefore requires creating a receiving clock by passing the reference clock CKr through a delay stage. However, even if the internal clock CKin independent of variations of device characteristics is created by going to the trouble of using a DLL circuit or PLL circuit, since a delay that has no relevance to the cycle of the reference clock CKr is caused by the delay stage, there arises the problem that signal reception at optimum timing is rendered impossible if the clock frequency varies.

First, the basic functional configuration of the timing signal generating circuit according to the third aspect of the present invention will be described with reference to FIG. 43.

Figure 43:
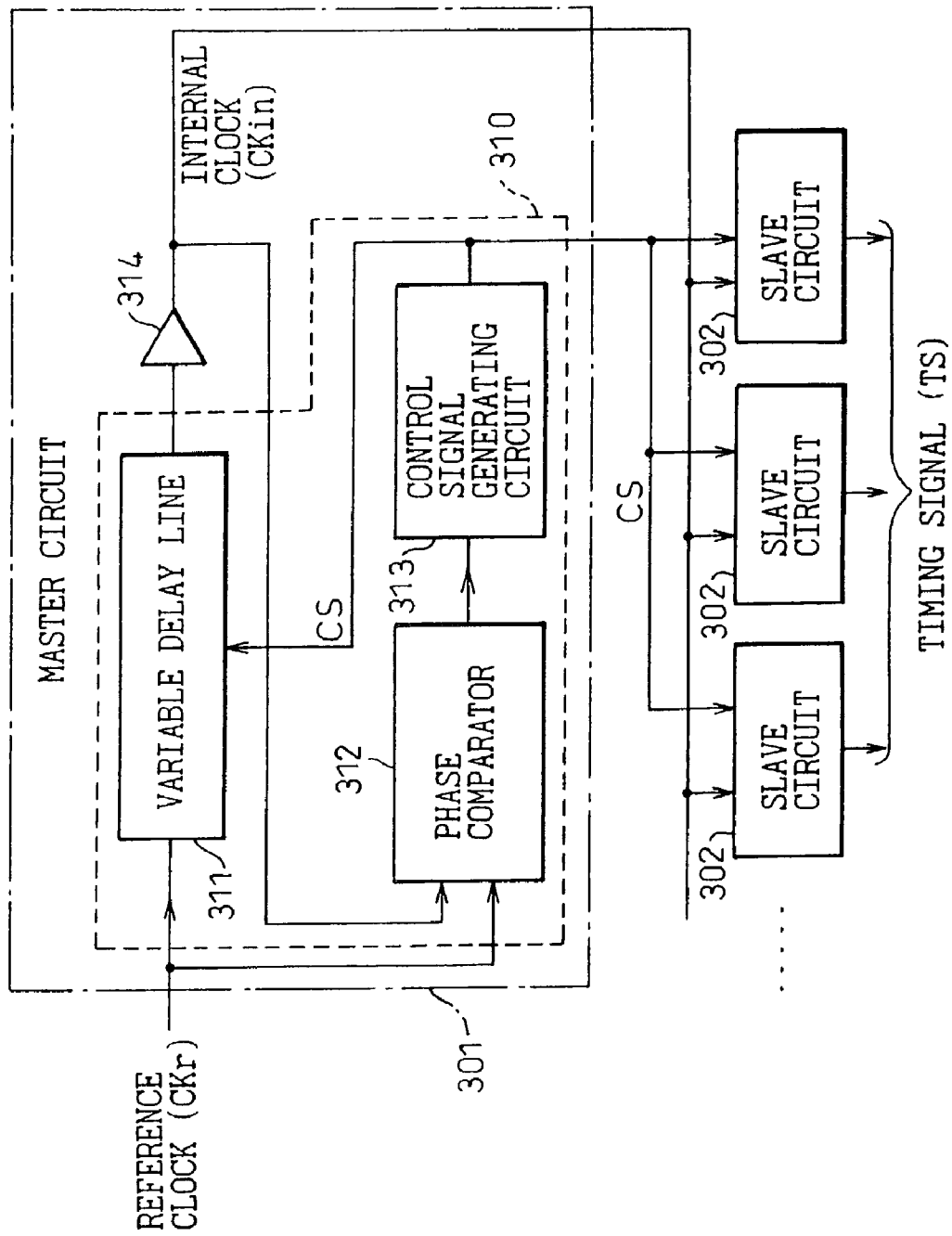
FIG. 43 is a block diagram showing the basic functional configuration of a timing signal generating circuit according to a third aspect of the present invention.

FIG. 43 is a block diagram showing the basic functional configuration of the timing signal generating circuit according to the present invention. In FIG. 43, reference numeral 301 is a master circuit, 302 are slave circuits, 310 is a DLL circuit, 311 is a variable delay line, 312 is a phase comparator circuit, 313 is a control signal generating circuit, and 314 is a drive circuit (clock driver).

As shown in FIG. 43, the timing signal generating circuit according to the third aspect of the present invention comprises the master circuit 301 and the plurality of slave circuits 302. The master circuit 301 is similar in configuration to the prior art signal generating circuit shown in FIG. 42, and comprises the DLL circuit 310 and the clock driver 314. The master circuit 301, however, is not limited to the configuration using the DLL circuit, but a configuration using, for example, a PLL circuit is also applicable.

The DLL circuit 310 comprises the variable delay line 311, phase comparator circuit 312, and control signal generating circuit 313. The reference clock CKr and the output of the clock driver 314 (internal clock CKin) are supplied as inputs to the phase comparator circuit 312 which compares the phase of the clock CKin with the phase of the clock CKr. Based on the result of the phase comparison, the control signal generating circuit 313 generates a control signal (voltage or current of analog value) CS. Using the control signal CS from the control signal generating circuit 313, the delay amount in the variable delay line 311 is controlled, and eventually the phase difference between the reference clock CKr and the internal clock CKin is minimized. Here, the output (CKin) of the clock driver 314 is not only fed back to the phase comparator circuit 312 but also supplied to the slave circuits 302 to which is also supplied the control signal CS from the control signal generating circuit 313.

As shown in FIG. 43, in the timing signal generating circuit according to the third aspect of the present invention, the control signal (the output signal of the control signal generating circuit 313) used in the master circuit 301 is also used to control the plurality of slave circuits 302. That is, the control signal CS used to control the amount of delay in the variable delay line 311 of the DLL circuit 310 in the master circuit 301 is also used in each slave circuit 302 so that a delay proportional to the cycle of the reference clock CKr can be provided by using delay elements substantially the same as the delay elements (delay units D) used in the variable delay line 311.

As a result, each slave circuit 302 can also generate a timing signal (TS) having a delay amount based on the cycle of the reference clock CKr (that is, having a predetermined phase difference relative to the reference clock). Further, by using the control signal CS generated in the master circuit 301 also in the slave circuits 302, the response frequency characteristics of the slave circuits 302 can be controlled in accordance with the frequency of the reference clock CKr. Stated specifically, the characteristic frequency (for example, the cut-off frequency) of a filter circuit used in each slave circuit 302, for example, can be made proportional to the frequency of the reference clock CKr. Utilizing this feature, each slave circuit 302 can generate, for example, a sine wave of constant amplitude by filtering a square-wave clock of CMOS amplitude.

In this way, according to the timing signal generating circuit of the third aspect of the present invention, the timing signal synchronized to the reference clock CKr can be generated in each slave circuit 302 that is much simpler in configuration than the master circuit 301. Furthermore, by varying the response speed of the slave circuit 302 in accordance with the frequency of the reference clock CKr, a highly accurate timing signal TS can be generated over a wide frequency range.

Embodiments of the timing signal generating circuit according to the third aspect of the present invention will be described below with reference to accompanying drawings.

Figure 44:
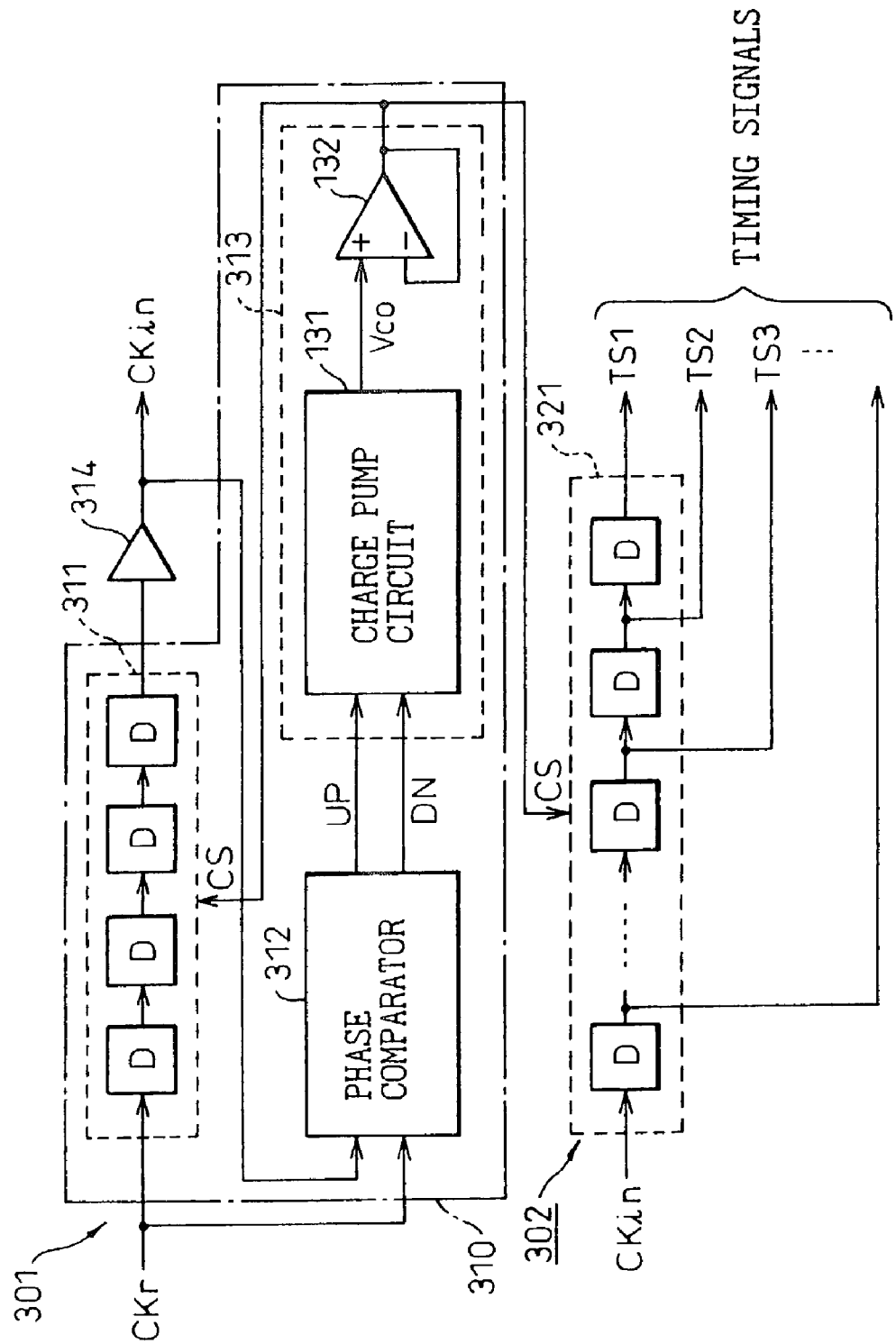
FIG. 44 is a block diagram showing a configurational example of the timing signal generating circuit as a first embodiment according to the third aspect of the present invention.

FIG. 44 is a block diagram showing the configuration of the timing signal generating circuit as a first embodiment according to the third aspect of the present invention.

As shown in FIG. 44, the variable delay line 311 is constructed from a plurality of delay units D, and the amount of delay in the variable delay line 311 is controlled by selecting the necessary number of delay units D in the variable delay line 311 by using the control signal CS. The control signal generating circuit 313 consists of a charge pump circuit 131 and a buffer amplifier 132, and generates the control signal CS in response to the up signal UP or down signal DN that is output from the phase comparator circuit 312 in accordance with the phase difference between the reference clock CKr and the internal clock CKin.

Further, as shown in FIG. 44, the slave circuit 302 includes a variable delay line 321 constructed from a plurality of delay units D which are identical to the delay units D constituting the variable delay line 311 in the master circuit 301, and the internal clock CKin, the output of the clock driver 314 in the master circuit 301, is supplied as an input to the variable delay line 321 in the slave circuit 302. The slave circuit 302 is used to generate a timing signal (TS) having, for example, a predetermined delay relative to the clock cycle.

The amount of delay (the number of stages of delay units D) in the variable delay line 321 in the slave circuit 302 is controlled by the control signal CS output from the control signal generating circuit 313 (the buffer amplifier 132) in the master circuit 301. In this way, the delay units D identical to those used in the variable delay line 311 in the master circuit 301 are used in the slave circuit 302 so that a plurality of timing signals (TS1, TS2, . . . ), each having a delay amount proportional to the cycle of the reference clock CKr, can be generated. These timing signals, TS1, TS2, . . . , have predetermined delay amounts relative to the reference clock CKr, their timings being delayed, for example, by 1/m, 2/m, . . . cycles relative to the reference clock CKr. Further, more than one slave circuit 302 can be provided for one master circuit 301, in which case the variable delay line 321 in each slave circuit 302 can be constructed with a smaller amount of circuitry than the variable delay line 311 in the master circuit 301, that is, with fewer delay units D.

In the above configuration, the master circuit 301 and the plurality of slave circuits 302 can be formed within a single semiconductor integrated circuit device (LSI chip), but instead, the master circuit 301 and the plurality of slave circuits 302, respectively, may be constructed on different semiconductor integrated circuit devices. That is, the timing signal generating circuit can be applied to a semiconductor integrated circuit system having a plurality of semiconductor integrated circuit devices.

Figure 45:
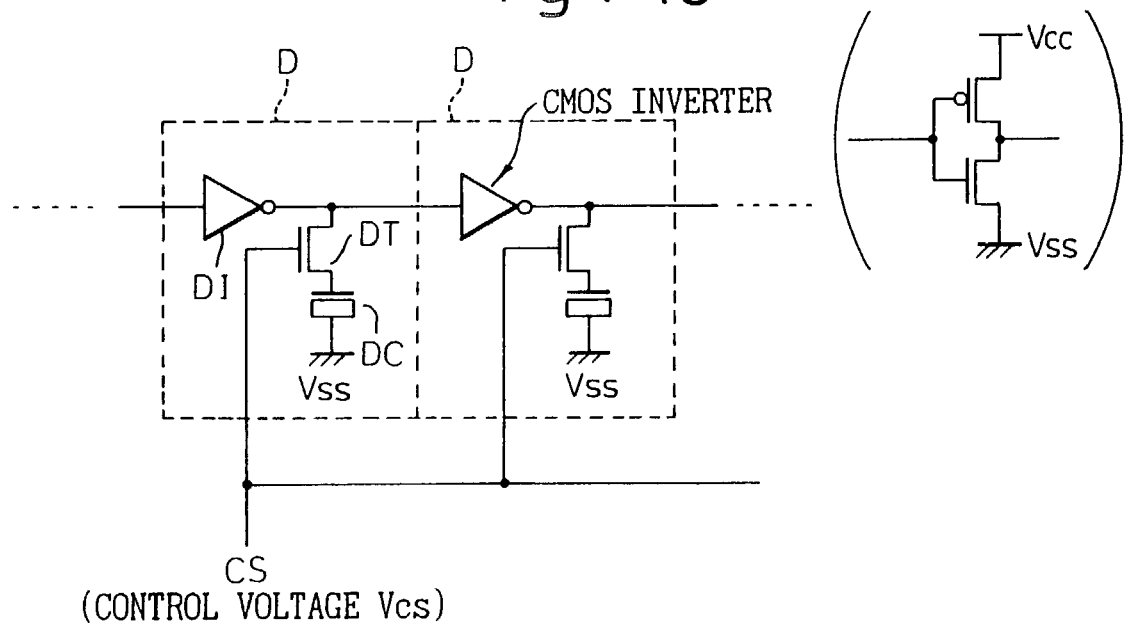
FIG. 45 is a circuit diagram showing one example of a delay unit used in a variable delay line in the timing signal generating circuit of FIG. 44.

FIG. 45 is a circuit diagram showing one example of each delay unit D used in the variable delay lines in the timing signal generating circuit of FIG. 44. The circuit example of the delay unit D shown in FIG. 45 is applicable to both the delay units used in the variable delay line 311 in the master circuit 301 and the delay units used in the variable delay line 321 in the slave circuit 302.

Figure 49:
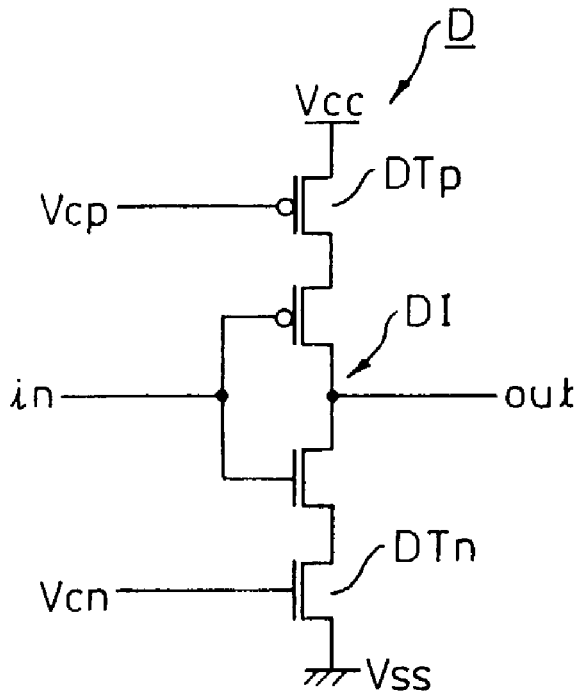
FIG. 49 is a circuit diagram showing another example of the delay unit used in the variable delay line in the timing signal generating circuit of FIG. 44.

As shown in FIG. 45, each delay unit D comprises: a CMOS inverter DI consisting of a p-channel MOS (pMOS) transistor and n-channel MOS (nMOS) transistor provided between a high-level voltage supply line (Vcc) and a low-level voltage supply line (Vss); and an nMOS transistor DT and capacitor DC provided between the output of the CMOS inverter DI and the low-level voltage supply line (Vss). The variable delay line 311 (321) is constructed from a plurality of such delay units D connected in cascade. The delay unit D shown in FIG. 45 is configured so that a control voltage Vcs (control signal CS) is applied to the gate of the transistor DT, but the delay unit D is not limited to this particular configuration; rather, various other configurations are possible. For example, a transistor operating in constant current mode may be added on the source side of each of the transistors (pMOS and nMOS) forming the CMOS inverter DI, as shown in FIG. 49 described later, in which case the delay can be controlled using control voltages Vcn and Vcp applied to these additional transistors. Further, to avoid logic inversion, two delay units D may be combined into one unit (one stage).

Figure 46:
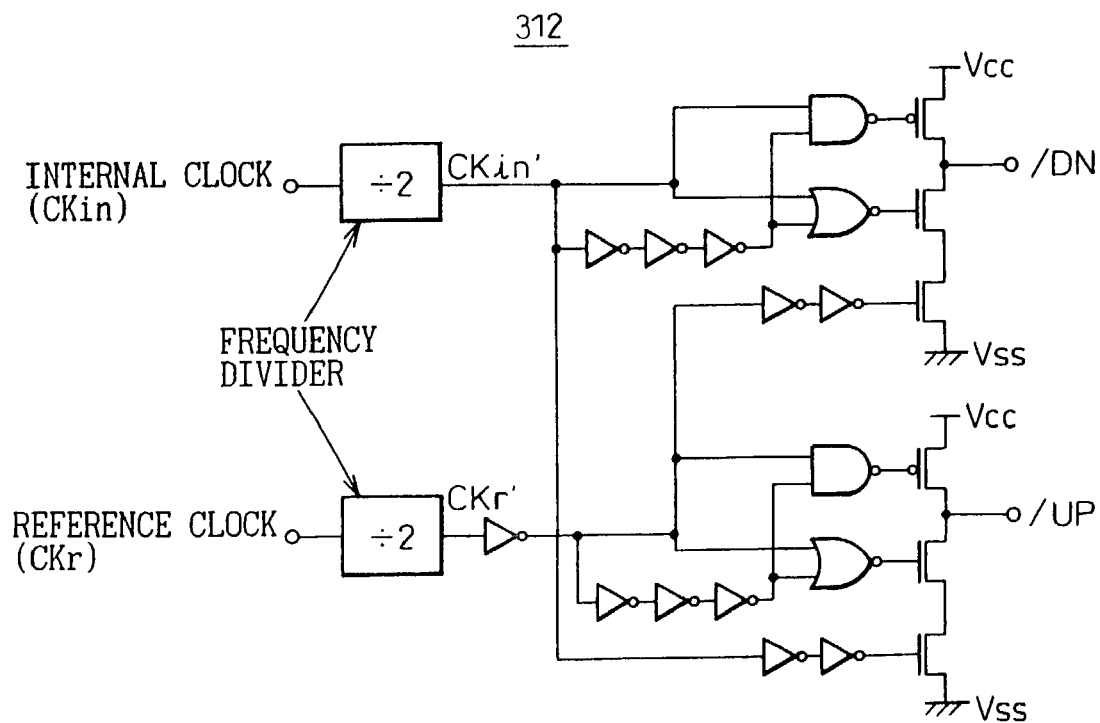
FIG. 46 is a block circuit diagram showing one example of a phase comparator circuit in the timing signal generating circuit of FIG. 44.
Figure 47:
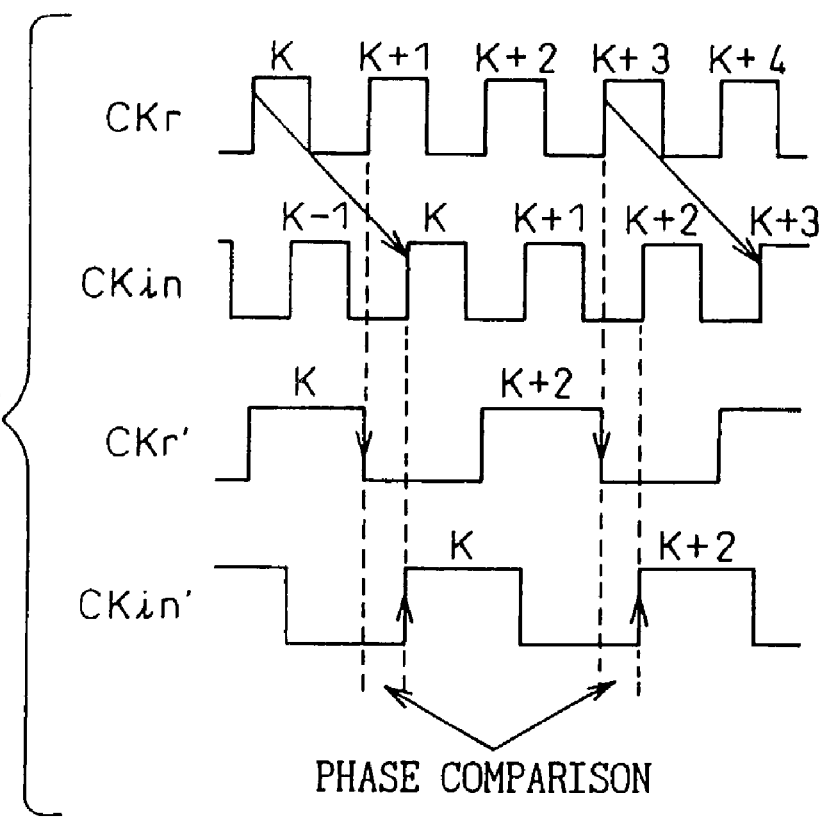
FIG. 47 is a timing diagram for explaining the operation of the phase comparator circuit of FIG. 46.

FIG. 46 is a block circuit diagram showing one example of the phase comparator circuit 312 in the timing signal generating circuit of FIG. 44, and FIG. 47 is a timing diagram for explaining the operation of the phase comparator circuit of FIG. 46.

As shown in FIG. 46, the phase comparator circuit 312 compares the phase of the internal clock CKin with the phase of the reference clock CKr, and outputs an up signal (/UP) or down signal (/DN) in accordance with the phase difference between the clock signals; here, the negative logic up signal (/UP) and down signal (/DN) are generated by dividing the frequency of the reference clock CKr and internal clock CKin by two, and by performing logic operations on the resulting reference clock CKr' and internal clock CKin' whose clock cycle is two times the original clock cycle.

More specifically, when the low level "L" to high level "H" transition timing of the divided-by-two internal clock CKin' is advanced with respect to the low level "L" to high level "H" transition timing of the divided-by-two reference clock CKr', as shown in FIG. 47, the up signal /UP of low level "L" is output; conversely, when it is delayed with respect to the low level "L", to high level "H" transition timing of the divided-by-two reference clock CKr', the down signal /DN of low level "L" is output.

Figure 48:
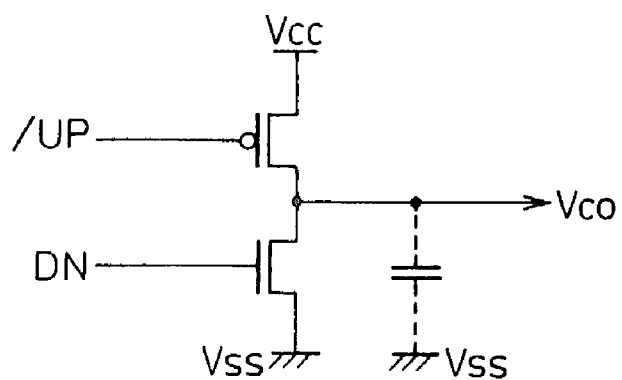
FIG. 48 is a circuit diagram showing one example of a charge pump circuit in the timing signal generating circuit of FIG. 44.

FIG. 48 is a circuit diagram showing one example of the charge pump circuit 131 in the timing signal generating circuit of FIG. 44.

As shown in FIG. 48, the charge pump circuit 131 is provided between the high-level voltage supply line (Vcc) and low-level voltage supply line (Vss), and comprises a pMOS transistor, which is supplied at its gate with the up signal (inverted logic up signal) /UP, and an nMOS transistor, which is supplied at its gate with the down signal DN. That is, when the up signal /UP of low level "L" is applied, the potential of the output level Vco rises, and when the down signal DN of high level "H" is applied (when /DN is at the low level "L"), the potential of the output level Vco lowers.

The output Vco of the charge pump circuit 131 is applied, via the buffer amplifier 132, as the control voltage Vcs (control signal CS) to the transistor DT in each delay unit D of FIG. 45. When the control voltage Vcs rises, the load capacitance at the output of each CMOS inverter DI increases, increasing the delay amount in the variable delay line 311 (321) and thus delaying the phase of the internal clock CKin. Conversely, when the control voltage Vcs lowers, the load capacitance at the output of each CMOS inverter DI decreases, decreasing the delay amount in the variable delay line 311 (321) and thus advancing the phase of the internal clock CKin.

FIG. 49 is a circuit diagram showing another example of each delay unit D used in the variable delay lines in the timing signal generating circuit of FIG. 44.

As shown in FIG. 49, in the delay unit D, a transistor operating in a constant current mode is added on the source side of each of the transistors (pMOS and nMOS) forming the CMOS inverter DI, and the delay is controlled using control voltages Vcn and Vcp applied to these additional transistors. More specifically, a pMOS transistor DTp is provided between the high-level voltage supply line (Vcc) and the source of the pMOS transistor of the CMOS inverter DI, and an nMOS transistor DTn is provided between the low-level voltage supply line (Vss) and the source of the nMOS transistor of the CMOS inverter DI. The control voltage Vcp is applied to the gate of the transistor DTp, and the control voltage Vcn to the gate of the transistor DTn. The delay unit D shown in FIG. 49 has the advantage of being able to vary the delay amount over a wide range with one delay unit. As previously described, two delay units D may be combined into one unit (one stage) to avoid logic inversion.

Figure 50:
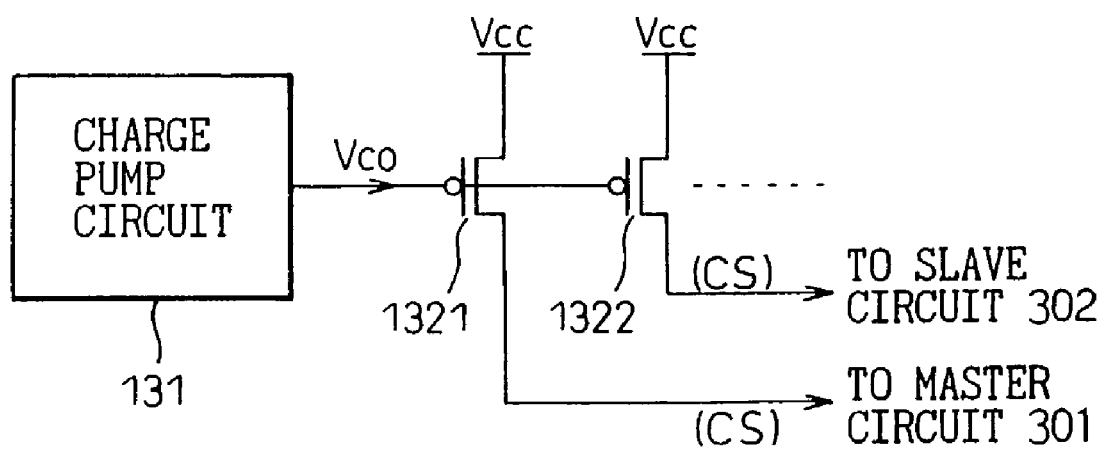
FIG. 50 is a block circuit diagram showing a configurational example of a control signal generating circuit in the timing signal generating circuit as a second embodiment according to the third aspect of the present invention.
Figure 51:
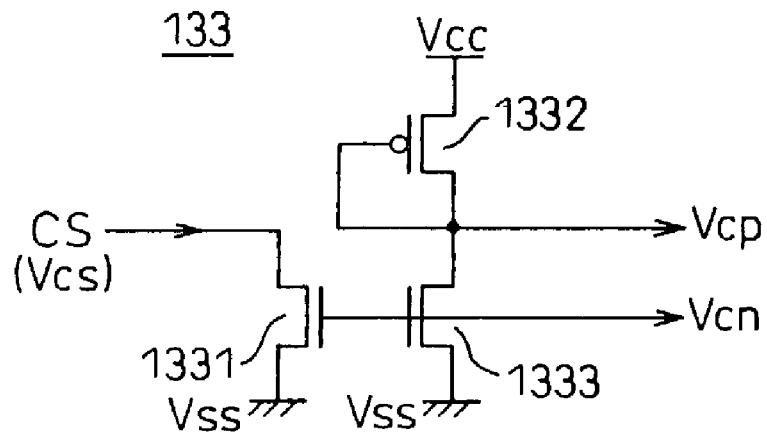
FIG. 51 is a circuit diagram showing one example of a current-to-voltage conversion circuit for converting the output of the control signal generating circuit of FIG. 50.

FIG. 50 is a block circuit diagram showing the configuration of the control signal generating circuit 313 in the timing signal generating circuit as a second embodiment according to the third aspect of the present invention, and FIG. 51 is a circuit diagram showing one example of a current-to-voltage conversion circuit 133 for converting the output of the control signal generating circuit 313 of FIG. 50.

As shown in FIG. 50, the control signal generating circuit 313 comprises the charge pump circuit 131 and a plurality of pMOS transistors 1321 and 1322 in a current mirror configuration. The sources of the pMOS transistors 1321 and 1322 are connected to the high-level voltage supply line (Vcc), and their gates are coupled to the output of the charge pump circuit 131. Control signals CS to the master circuit 301 and the slave circuit 302 are output from the drains of the respective pMOS transistors 1321 and 1322. That is, in the second embodiment, current signals are used for the delivery of the control signals CS to the master circuit 301 and the slave circuit 302. As for the pMOS transistor 1322 for the slave circuit, a plurality of such transistors can be provided corresponding, for example, to the number of slave circuits 302.

Then, as shown in FIG. 51, in the master circuit 301 and in each slave circuit 302, the control signal (current signal) CS from the control signal generating circuit 313 (from the pMOS transistor 1321 or 1322) is converted by the current-to-voltage conversion circuit 133 into the control voltages Vcn and Vcp. These control voltages Vcn and Vcp are applied, for example, to the gates of the respective transistors DTn and DTp in the delay unit shown in FIG. 49. In the case of the delay unit shown in FIG. 45, the control voltage Vcn is used as the control voltage Vcs. The current-to-voltage conversion circuit 133 shown here consists of nMOS transistors 1331 and 1333 and a pMOS transistor 1332, but the configuration is not limited to this particular example.

By delivering the control signals CS as current signals, the second embodiment has the advantage that the control signals CS can be transmitted without any problem despite variations in transistor threshold voltage that occur, for example, when the master circuit 301 and the slave circuit 302 are located farther away from each other within a chip.

Figure 52:
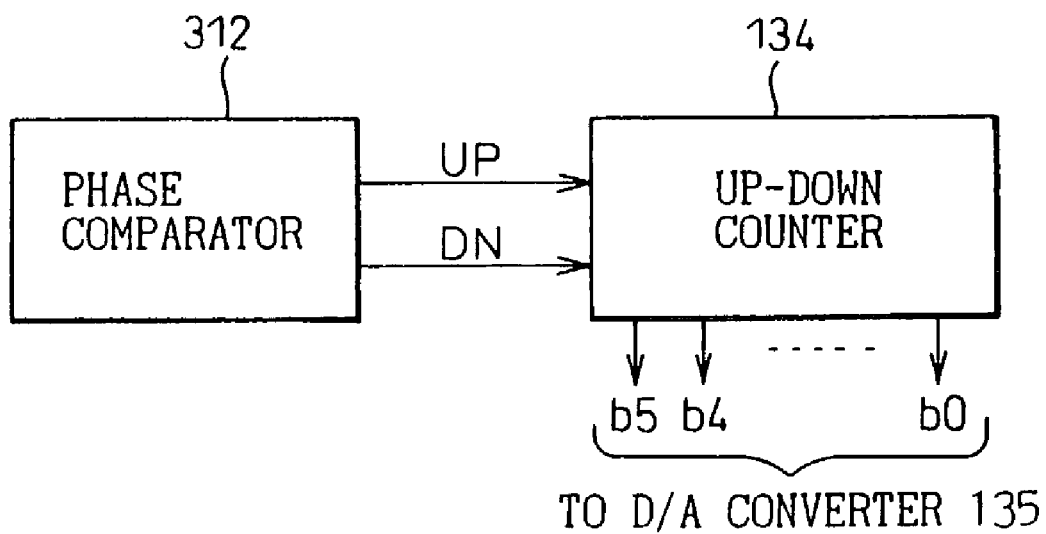
FIG. 52 is a block diagram showing one example of the configuration of an essential portion of the timing signal generating circuit as a third embodiment according to the third aspect of the present invention.
Figure 53:
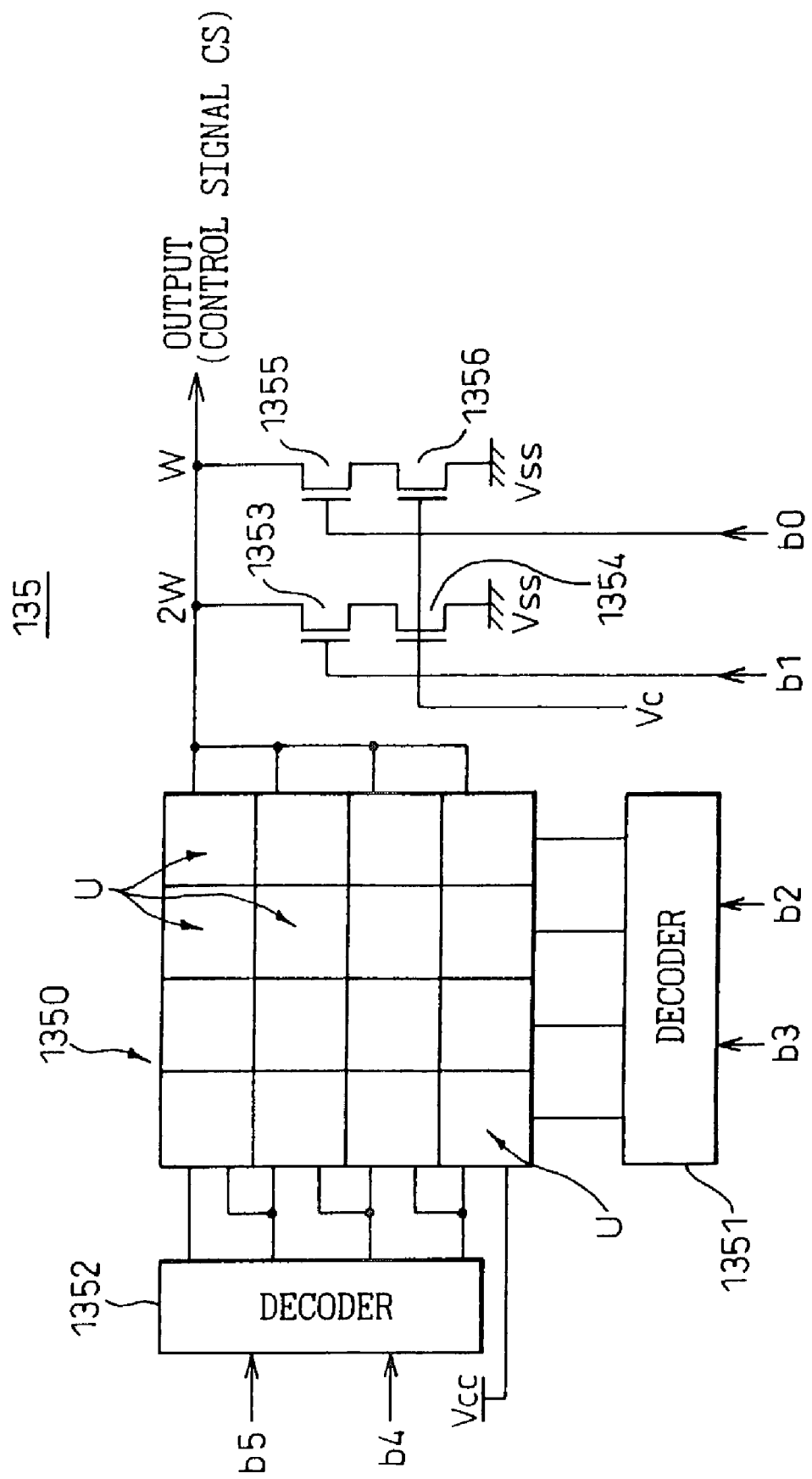
FIG. 53 is a block circuit diagram showing one example of a D/A converter for performing a D/A conversion of the outputs of an up-down counter in FIG. 52.

FIG. 52 is a block diagram showing the configuration of an essential portion of the timing signal generating circuit as a third embodiment according to the third aspect of the present invention, and FIG. 53 is a block circuit diagram showing one example of a D/A converter for performing a digital-to-analog conversion (D/A conversion) of the outputs of the up-down counter shown in FIG. 52.

As can be seen from the comparison between FIG. 52 and FIG. 44, the third embodiment uses the up-down counter 134 instead of the charge pump circuit 131 in the first embodiment. More specifically, the up-down counter 134 counts the up signal UP and down signal DN supplied from the phase comparator circuit 312, and supplies, for example, a 6-bit count signal b0-b5 to the D/A converter 135 shown in FIG. 53.

The D/A converter 135 is a current-matrix cell type D/A converter, and outputs the control signal CS, for example, by converting the 6-bit count signal b0-b5 output from the up-down counter 134 into an analog signal.

Figure 54:
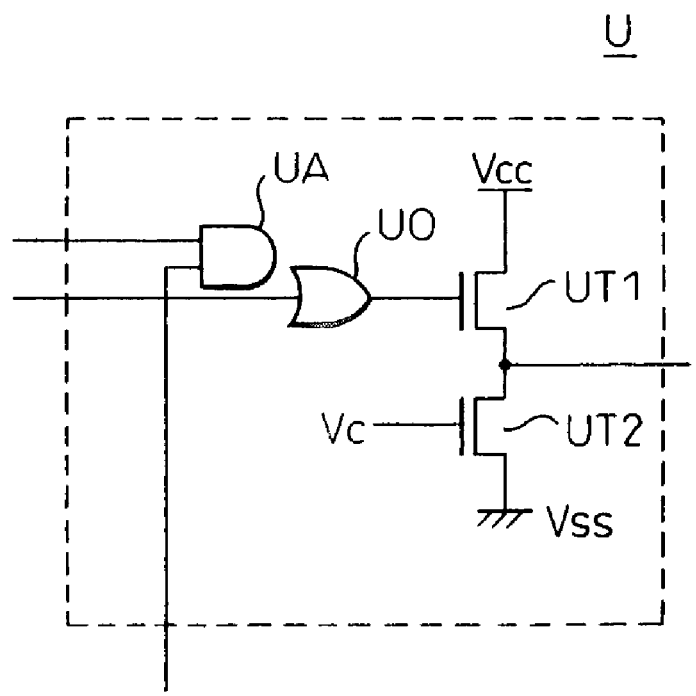
FIG. 54 is a circuit diagram showing a configurational example of one current matrix cell in the D/A converter shown in FIG. 53.

FIG. 54 is a circuit diagram showing a configurational example of each current matrix cell (U) in the D/A converter 135 shown in FIG. 53.

As shown in FIG. 54, each current matrix cell U comprises an AND gate UA, an OR gate UO, and two nMOS transistors UT1 and UT2; many such cells U are arranged in a matrix array to form a current matrix block 1350, and count signals (b2, b3; b4, b5) are supplied to the current matrix cells U via decoders 1351 and 1352. The high-order count signals b0 and b1 are supplied to the gates of nMOS transistors (1353 and 1355) in two transistor-pairs (1353, 1354; 1355, 1356) each consisting of two nMOS transistors connected in series between the output terminal and the low-level voltage supply line (Vss). The control voltage Vc is applied to the gates of the other transistors (1354 and 1356) in the respective transistor pairs. This control voltage Vc is also applied to the gate of the transistor UT2 in each current matrix cell U.

By using a combination of the up-down counter 134 and D/A converter 135, the third embodiment shown in FIGS. 52 to 54 has the advantages that the design of a loop filter is facilitated, and that even when the phase comparison operation of the loop using the DLL circuit is completely stopped, the delay amount can be maintained at a constant level and power consumption can thus be reduced.

Figure 55:
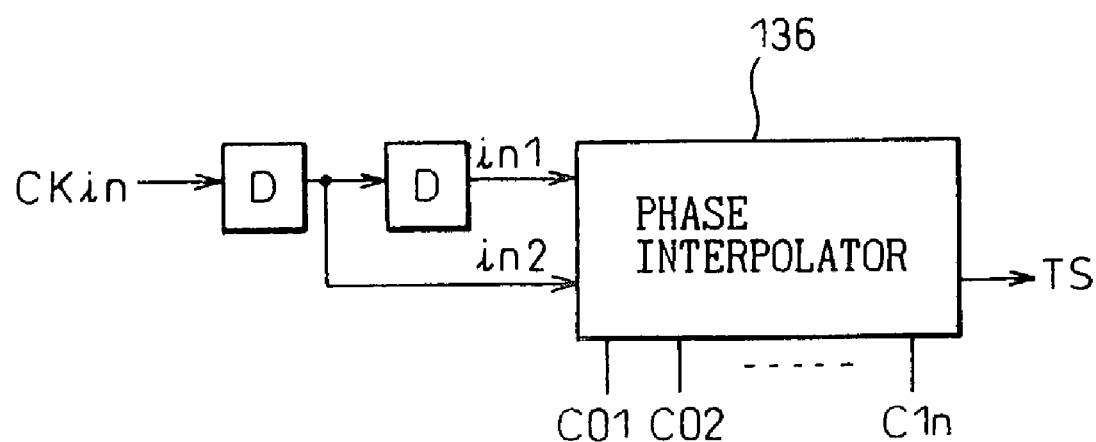
FIG. 55 is a block diagram showing a configurational example of the timing signal generating circuit applicable to a slave circuit, as a fourth embodiment according to the third aspect of the present invention.
Figure 56:
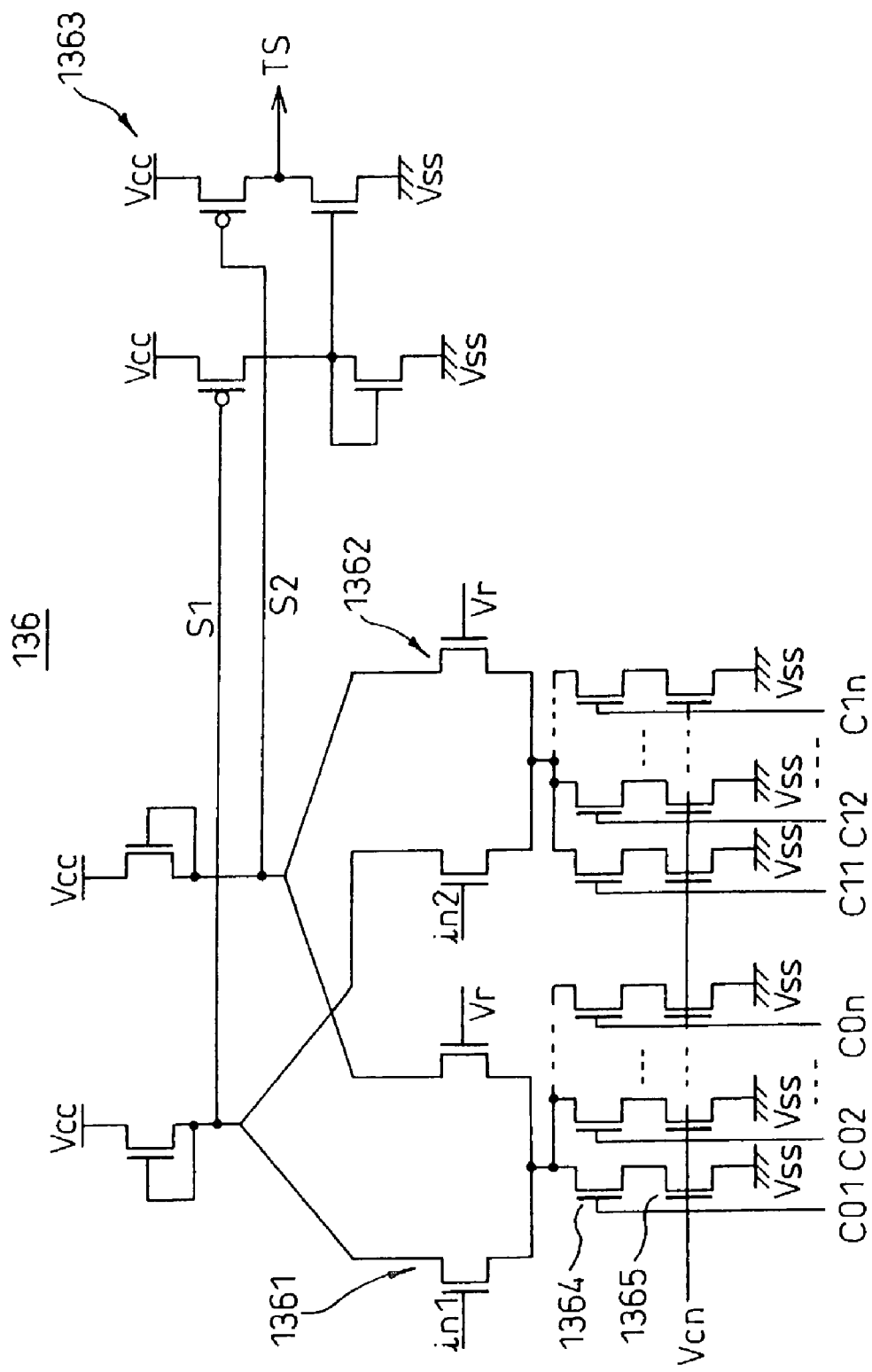
FIG. 56 is a circuit diagram showing one example of a phase interpolator in FIG. 55.

FIG. 55 is a block diagram showing the configuration of the timing signal generating circuit applicable to the slave circuit, as a fourth embodiment according to the third aspect of the present invention, and FIG. 56 is a circuit diagram showing one example of a phase interpolator 136 in FIG. 55.

As shown in FIG. 55, in the fourth embodiment, an input clock (in2) and a signal (in1) delayed by one stage relative to the input clock are supplied to the phase interpolator 136 which then generates the timing signal TS in the slave circuit 302.

As shown in FIG. 56, the phase interpolator 136 takes a weighted sum of the two inputs (in1 and in2) by varying the bias currents of input transistors (tail current) of a pair of differential amplifier stages 1361 and 1362, and supplies signals S1 and S2 from the two differential amplifier stages 1361 and 1362 to a comparator 1363 to obtain an output (timing signal TS) having an intermediate phase between the phases of the two signals S1 and S2. Weighting of the inputs in1 and in2 in the differential amplifier stages 1361 and 1362 can be accomplished, for example, by applying a control code (C01, C02, ..., C0n; C11, C12, ..., C1n) to one transistor (1364) in each transistor pair consisting of two nMOS transistors connected in series and a control voltage (Vcs) to the gate of the other transistor (1365) in each pair. Using the phase interpolator 136 of such configuration offers the advantage of being able to adjust the timing of the output signal (timing signal TS) with a resolution higher than that of one delay unit stage. Highly accurate timing adjustments can thus be achieved.

Figure 57:
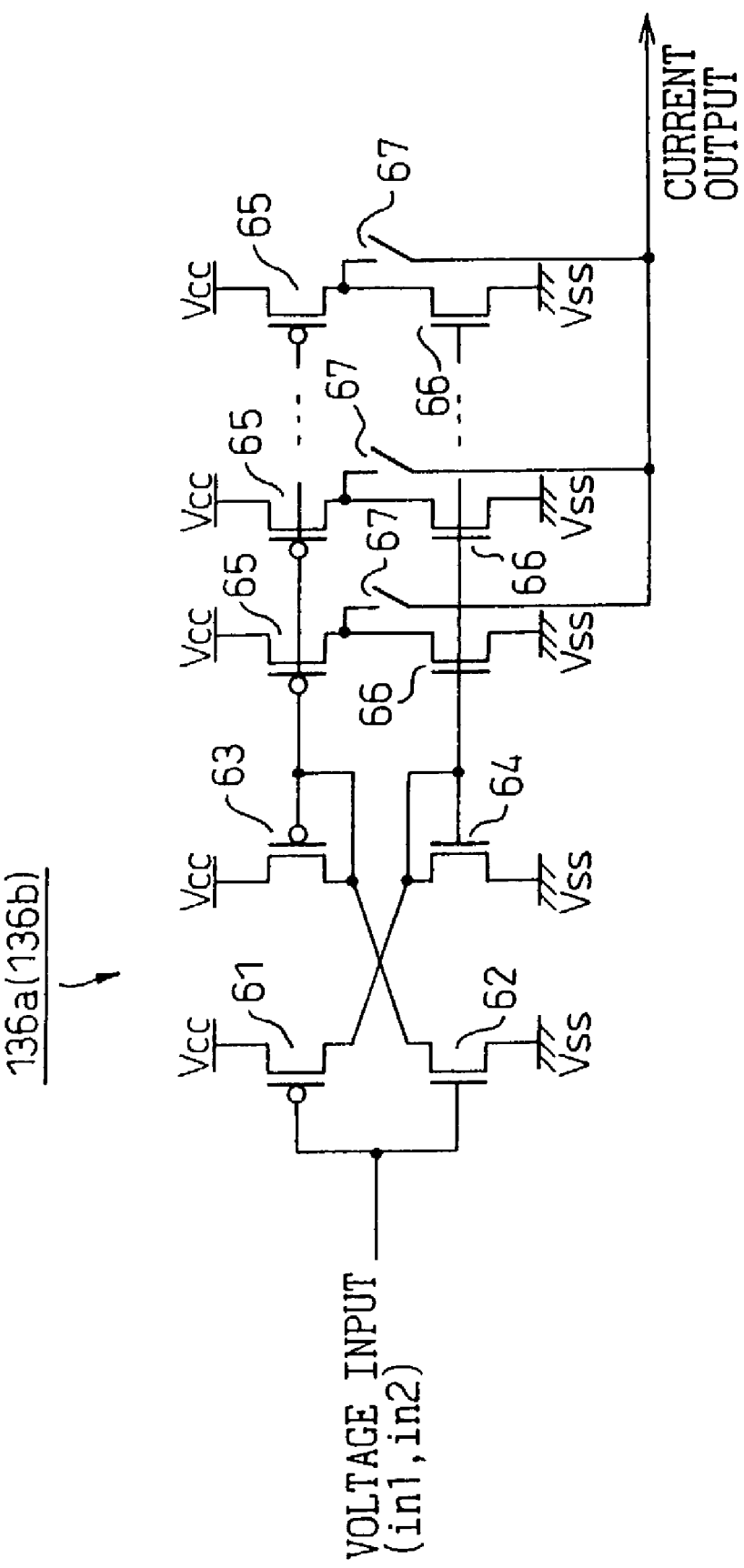
FIG. 57 is a circuit diagram showing a configurational example of the phase interpolator as a fifth embodiment according to the third aspect of the present invention.

FIG. 57 is a circuit diagram showing another example of the phase interpolator 136 as a fifth embodiment according to the third aspect of the present invention.

The phase interpolator 136 shown in FIG. 57 comprises two voltage-to-current conversion circuits 136a and 136b each of which includes pMOS transistors 61 and 63 and nMOS transistors 62 and 64. The voltage-to-current conversion circuits 136a and 136b convert the voltage inputs in1 and in2 into current outputs. The number of output transistors (65 and 66) in each voltage-to-current conversion circuit is controlled by switch means 67 using an external signal, thus varying the conversion factor of the voltage-to-current conversion. The converted currents are summed, and the results are supplied to the comparator to obtain the timing signal (TS).

Figure 58:
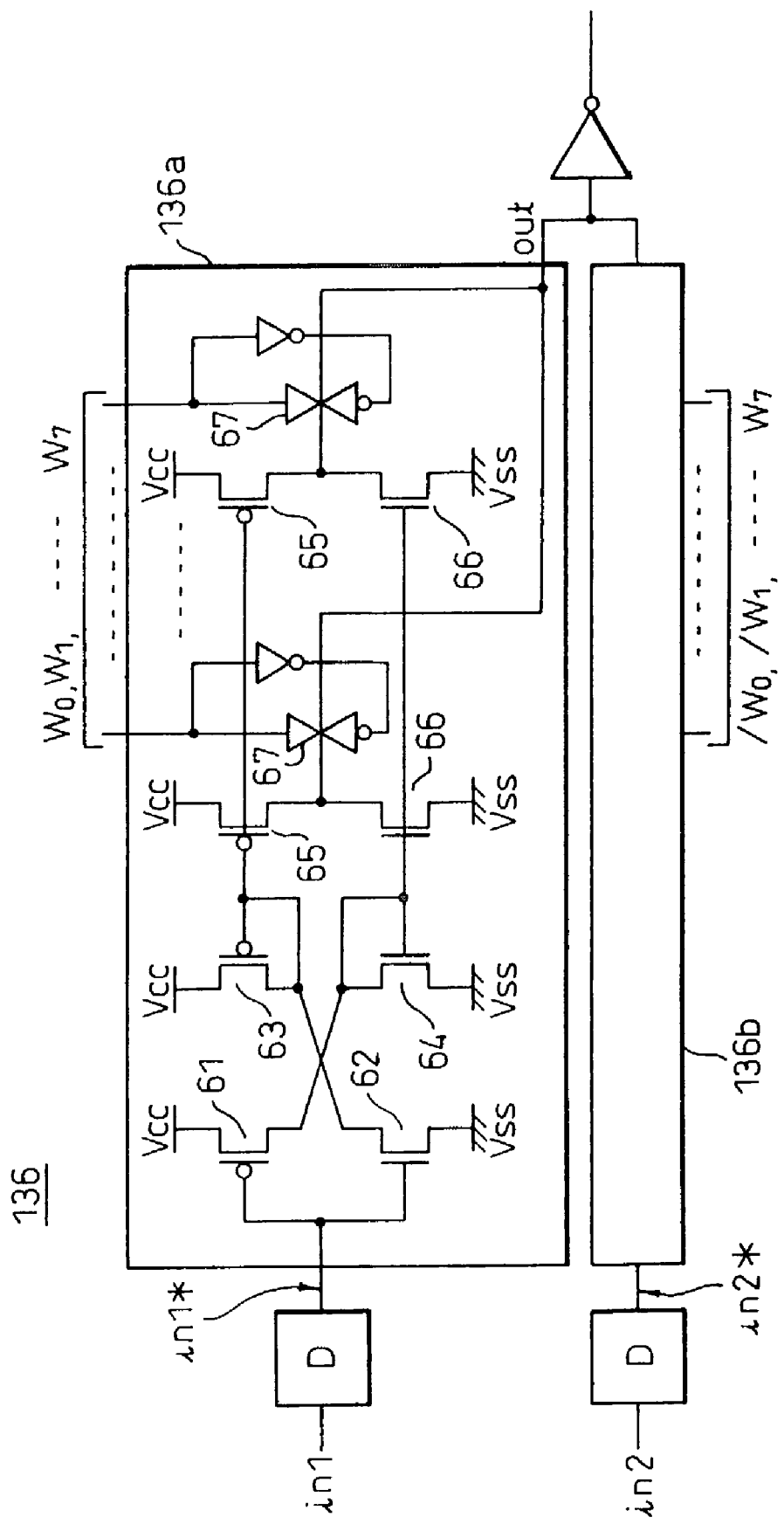
FIG. 58 is a circuit diagram showing a configurational example of the timing signal generating circuit used to perform a simulation of the fifth embodiment according to the present invention.
Figure 59:
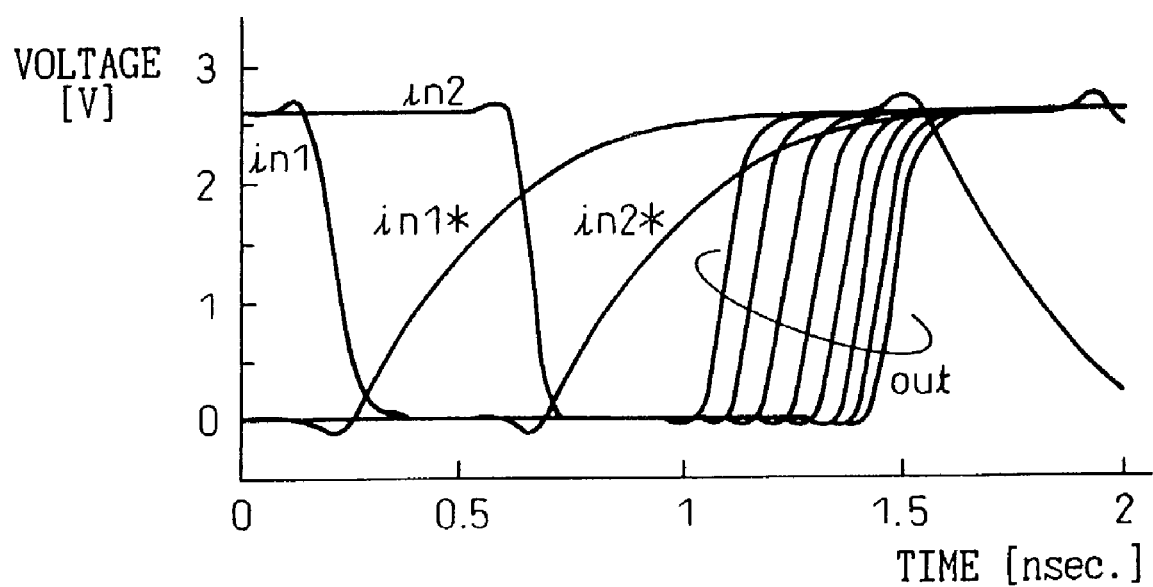
FIG. 59 is a diagram showing simulation results for the timing signal generating circuit of FIG. 58.

FIG. 58 is a circuit diagram showing the configuration of the timing signal generating circuit (phase interpolator 136) used to perform a simulation of the fifth embodiment according to the third aspect of the present invention, and FIG. 59 is a diagram showing simulation results (SPICE simulation results) for the timing signal generating circuit of FIG. 58.

As shown in FIG. 58, the phase interpolator 136 comprises the voltage-to-current conversion circuits 136a and 136b which respectively convert the input signals (voltage signals) in1 and in2 into current signals. Here, a delay unit D (the same delay unit as used in the variable delay line 311: See FIG. 45 or 49) is inserted at the input of each of the voltage-to-current conversion circuits 136a and 136b, and signals in1* and in2*, obtained by moderating the change of the input signals in1 and in2 through the respective delay units D, are supplied to the voltage-to-current conversion circuits 136a and 136b, respectively. Reference characters $W_0$ to $W_7$ (/$W_0$ to /$W_7$) in FIG. 58 are the external signals used to control the switching of the transfer gates (switch means) 67; using these external signals $W_0$ to $W_7$ (/$W_0$ to /$W_7$), the transfer gates are opened or closed to control the number of output transistors (65 and 66) in the voltage-to-current conversion circuit 136a (136b). In this way, the timing of the output (Out) can be changed as shown in FIG. 59. More specifically, by varying the conversion factor of the voltage-to-current conversion circuits 136a and 136b, the weights to be assigned to the two input signals in1 and in2 are varied, thereby implementing the operation of the phase interpolator 136. The phase interpolator of the fifth embodiment has the advantage of allowing further lower voltage operation because it does not use current-mirror deferential amplifier stages as in the fourth embodiment shown in FIG. 56.

Figure 60:
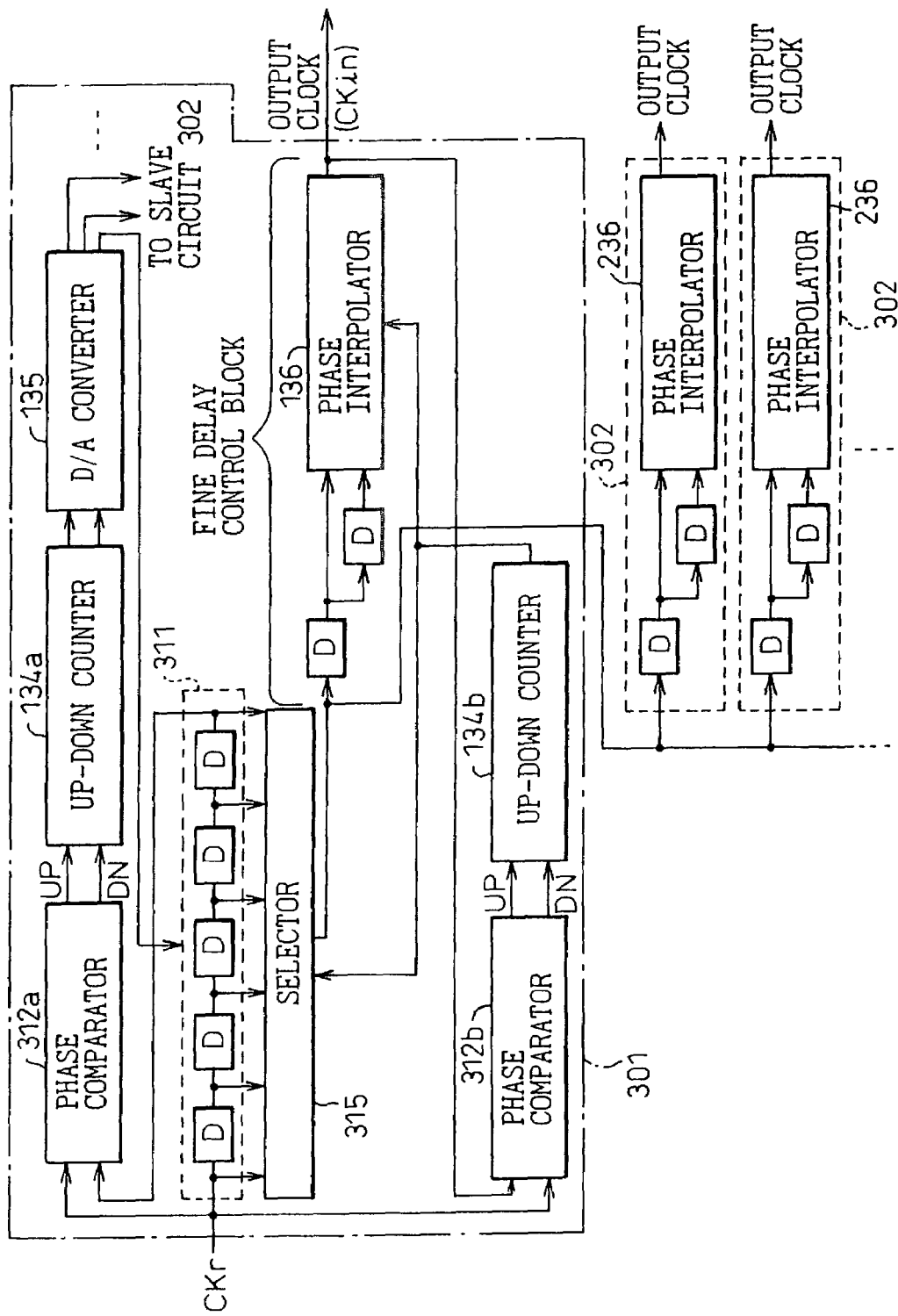
FIG. 60 is a block diagram showing a configurational example of the timing signal generating circuit as a sixth embodiment according to the third aspect of the present invention.

FIG. 60 is a block diagram showing the configuration of the timing signal generating circuit as a sixth embodiment according to the third aspect of the present invention.

As shown in FIG. 60, in the sixth embodiment, a DLL circuit is formed using the master circuit 301 and slave circuit 302; more specifically, a coarse delay control block for performing coarse delay control and a fine delay control block for performing fine delay control are provided in the master circuit 301, and a circuit corresponding to the fine delay control block in the master circuit 301 is included in the slave circuit 302.

The coarse delay control block in the master circuit 301 comprises a delay line 311, a phase comparator circuit 312a, an up-down counter 134a, a D/A converter 135, and a selector 315, and the fine delay control block in the master circuit 301 comprises a phase interpolator 136 and two delay units D for delaying the output of the coarse delay control block (the selector 315), for example, by one and two delay stages and for supplying the delayed outputs to the phase interpolator 136. Here, the reference clock CKr and the output of the final delay stage in the delay line 311 consisting, for example, of m delay units D are supplied as inputs to the phase comparator circuit 312a; further, an output (current control signal) from the D/A converter 135 is supplied to the delay line 311, which outputs to the selector 315 a timing signal whose phase is equally divided according to the number of stages of the delay units D. The selector 315 and the phase interpolator 136 are also supplied with a control signal generated by a phase comparator circuit 312b and up-down counter 134b. That is, the coarse delay control block takes taps off the delay line 311 consisting of the plurality of delay units, selects the output of each tap using the selector (selecting means) 315, and supplies the output signal to each fine delay control block.

As shown in FIG. 60, each slave circuit 302 includes a fine delay control block which, like the fine delay control block in the master circuit 301, comprises a phase interpolator 236 and two delay units D for delaying the output of the coarse delay control block (the selector 315) in the master circuit 301 by one and two delay stages and for supplying the delayed outputs to the phase interpolator 236. Here, the configuration of the delay units D in the fine delay control block can be modified in various ways.

As shown in FIG. 60, in the sixth embodiment, the coarse delay control block in the master circuit 301 and the fine delay control block (in the master circuit 301 or in each slave circuit 302) are connected in series, and a DLL loop is formed with the coarse delay control block itself. Further, with the fine delay control block using a phase interpolator (136 or 236), a delay with a resolution higher than that of one delay stage (delay unit D) of the master circuit 301 is obtained. The delay units used for the phase interpolator (136 or 236) in the fine delay control block are identical to the delay units D used in the delay line 311 in the coarse delay control block. Further, the output (current control signal) of the D/A converter 135 is also supplied to each slave circuit 302.

In this way, according to the sixth embodiment, a delay with a resolution higher than the resolution of the delay line 311 can be produced using a digital signal, and a highly accurate DLL signal can thus be obtained. Further, a digitally controlled DLL circuit can be achieved that allows the phase comparison operation to be stopped for a long period and that can resume operation in a short period from sleep mode. There is also the advantage that, by arranging a plurality of fine delay control blocks (phase interpolators 236) as slave circuits 302, a plurality of timing signals, each having a delay with a resolution higher than the resolution of the delay line 311, can be obtained.

Figure 61:
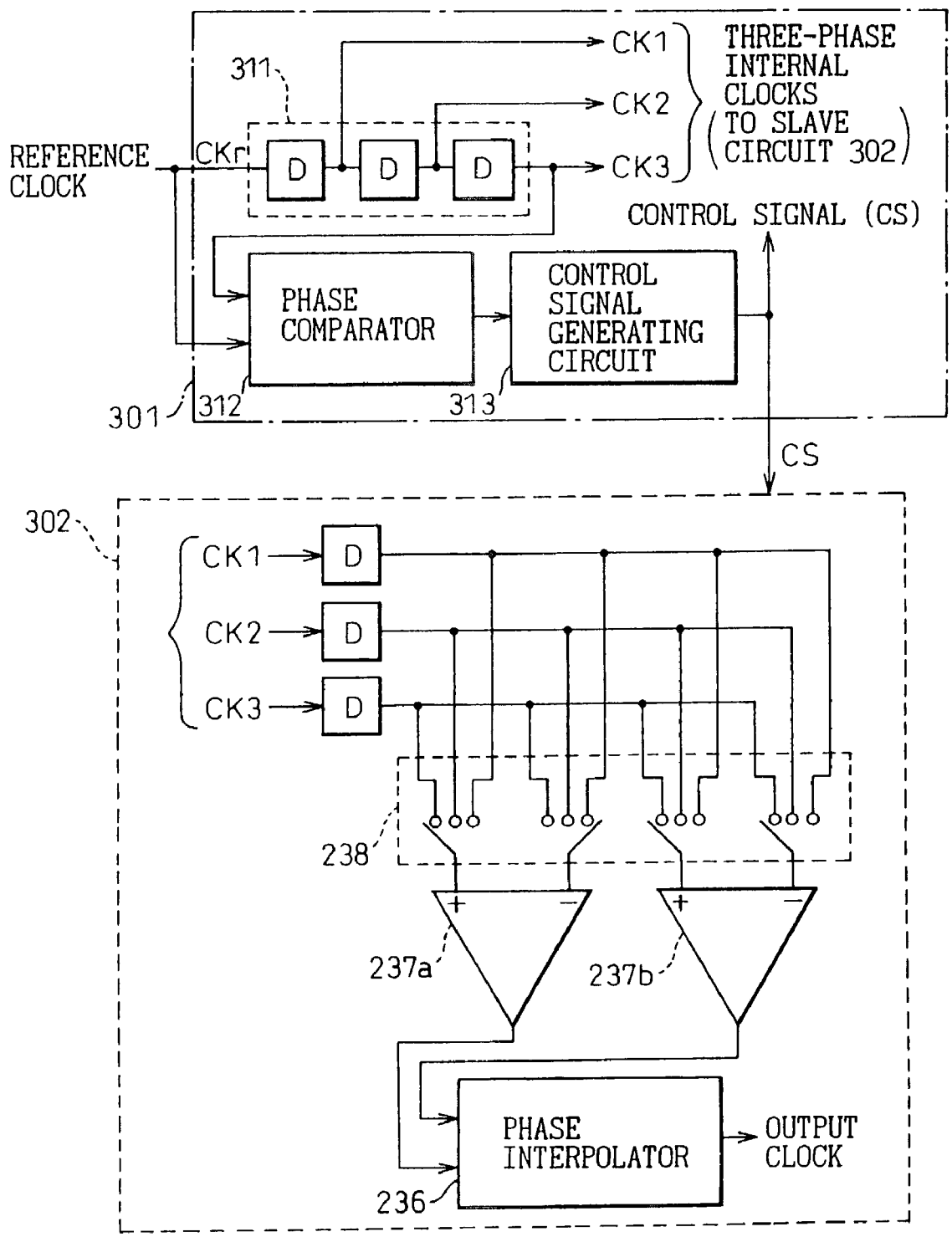
FIG. 61 is a block diagram showing a configurational example of the timing signal generating circuit as a seventh embodiment according to the third aspect of the present invention.

FIG. 61 is a block diagram showing the configuration of the timing signal generating circuit as a seventh embodiment according to the third aspect of the present invention.

In the seventh embodiment, not only the control signal CS (the output of the control signal generating circuit 313) but also three-phase internal clocks CK1 to CK3 (the delayed outputs of the delay line 311) are supplied from the master circuit 301 to the slave circuit 302. In the slave circuit 302, a timing signal (output clock) with a desired phase is generated by the phase interpolator 236, based on the three-phase clocks CK1 to CK3 supplied from the master circuit 301.

More specifically, as shown in FIG. 61, the three-phase clocks CK1 to CK3 are supplied to a switch block 238 in the slave circuit 302 via delay units D provided, for example, to moderate the signal changes. Prescribed combinations of the three-phase clocks are selected by the switch block 238 and supplied to the inputs of operational amplifiers 237a and 237b. The outputs of the operational amplifiers 237a and 237b are supplied to the phase interpolator 236 where the phase is divided and a prescribed timing signal is produced for output. The seventh embodiment has the advantage that a timing signal (output clock) having a desired phase angle within 360 degrees can be generated in the slave circuit 302.

Figure 62:
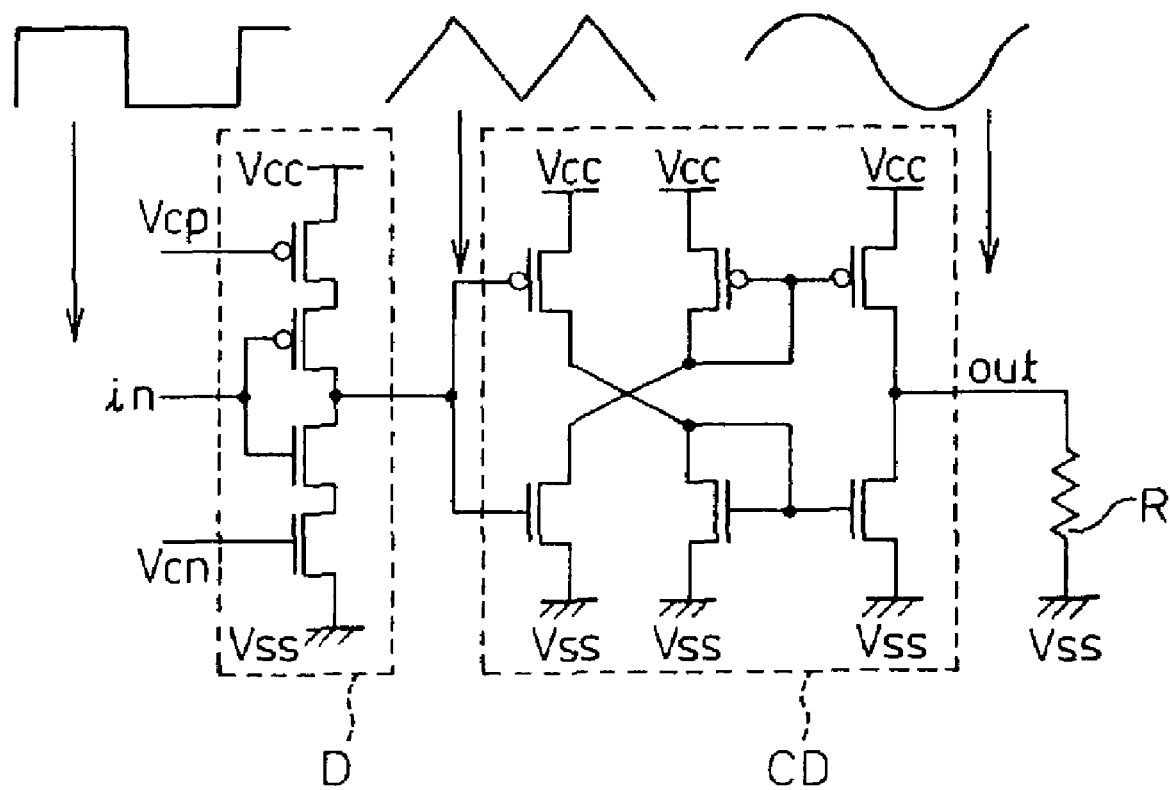
FIG. 62 is a circuit diagram showing a configurational example of a sine wave generating circuit as an eighth embodiment according to the third aspect of the present invention.

FIG. 62 is a circuit diagram showing the configuration of a sine wave generating circuit as an eighth embodiment according to the third aspect of the present invention.

In recent years, use of a sine wave as a clock waveform has been drawing attention because it can reduce the power consumption of clock drivers and can also eliminate harmonics for reduced clock noise. Using a sinusoidal clock can reduce the power consumption of clock drivers because the clock drivers can be constructed from small-size transistors having small drive capabilities (transistors with low power consumption) as the output waveform need not be made to rise and fall steeply (the output need only be made to rise and fall gradually). FIG. 62 shows one example of the sinusoidal clock generating circuit applicable, for example, for use in the slave circuit 302.

As shown in FIG. 62, by passing the voltages (control voltages) Vcn and Vcp, obtained by the current-to-voltage conversion circuit 133 as shown in FIG. 51, through the delay unit as shown in FIG. 49, for example, a CMOS clock (square wave) of full amplitude is converted to a triangular wave, and then by passing this triangular wave through a constant-current driver CD having nonlinear input/output characteristics, the triangular wave is converted to a sine wave (pseudo-sine wave). Here, the delay unit D, which operates with the control signal (CS) from the master circuit 301, is used for the portion that produces the triangular wave; since the delay in this delay unit D is proportional to the cycle of the reference clock (CKr), the amplitude of the triangular wave is maintained at a constant level regardless of variations in the reference clock frequency. Accordingly, the eighth embodiment has the advantage of being able to generate the sine wave over a wide frequency range.

Figure 63:
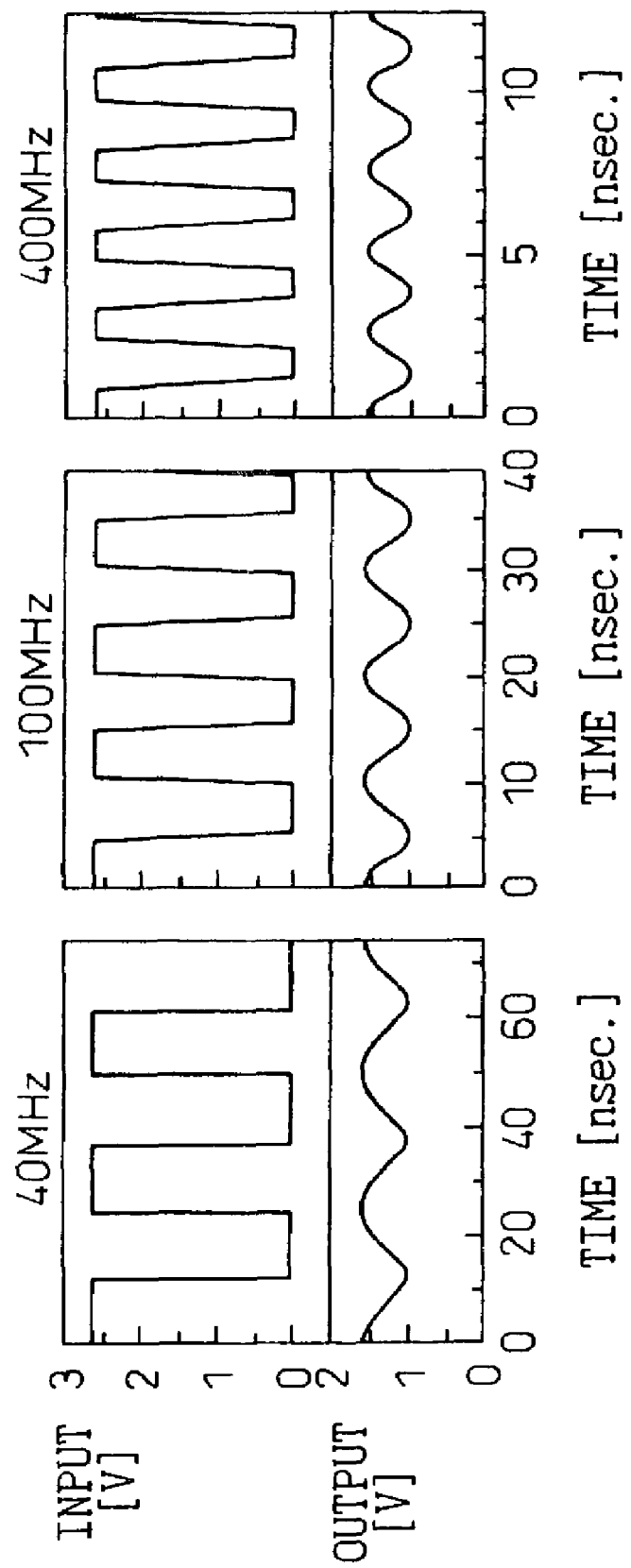
FIGS. 63A, 63B, and 63C are diagrams showing simulation results for the sine wave generating circuit of FIG. 62.

FIGS. 63A to 63C are diagrams showing simulation results (SPICE simulation results) for the sine wave generating circuit of FIG. 62: FIG. 63A shows the case of an input signal (clock) of 40 MHz, FIG. 63B the case of an input signal of 100 MHz, and FIG. 63C the case of an input signal of 400 MHz. The simulation was performed by providing at the output of the sine wave generating circuit a resistor R having a resistance value equal to, for example, one half the characteristic impedance of the transmission line.

As can be seen from FIGS. 63A to 63C, for each frequency (40 MHz, 100 MHz, 400 MHz) the sine wave generating circuit of FIG. 62 can convert an input square wave to a substantially sinusoidal waveform.

Figure 64:
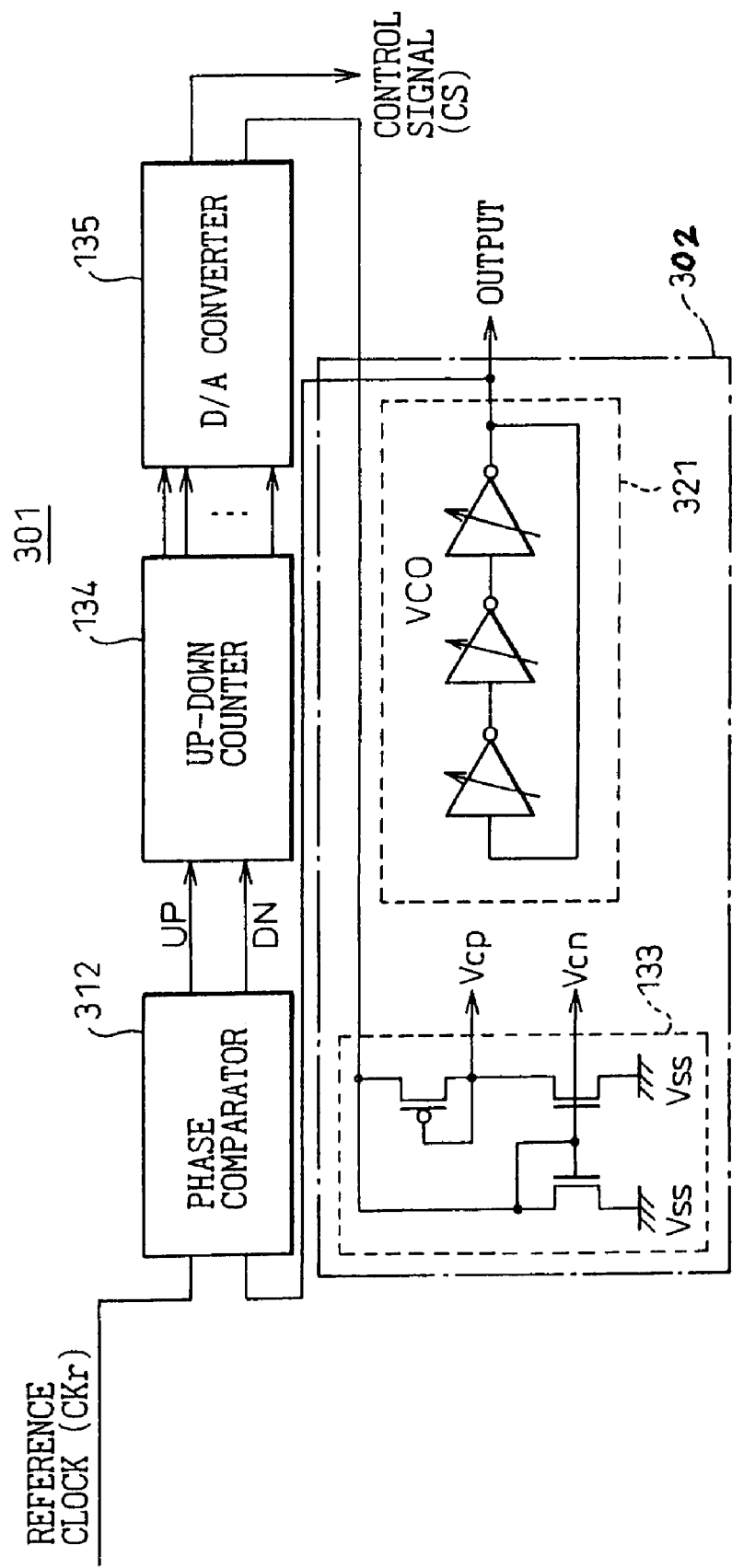
FIG. 64 is a block diagram showing a configurational example of the timing signal generating circuit as a ninth embodiment according to the third aspect of the present invention.

FIG. 64 is a block diagram showing the configuration of the timing signal generating circuit as a ninth embodiment according to the third aspect of the present invention, dealing with an example of the timing signal generating circuit using a PLL circuit.

In FIG. 64, reference numeral 312 is a phase comparator circuit, 134 is an up-down counter, 135 is a D/A converter, and 321 is a voltage-controlled oscillator (VCO). The voltage-controlled oscillator 321 is constructed from a ring oscillator formed, for example, by cascading three stages of circuits each similar in configuration to the delay unit D shown in FIG. 49, and the control voltages Vcp and Vcn, output from the control signal generating circuit (current-to-voltage conversion circuit 133), are applied to the gates of the control transistors (DTp and DTn) in each stage to control the oscillation frequency. Here, each slave circuit 302 comprises the current-to-voltage conversion circuit 133 and the voltage-controlled oscillator 321.

In this way, since, in the ninth embodiment, the master circuit 301 uses the PLL circuit, not the DLL circuit, the output signal (timing signal) can be generated even in cases where a completely periodic clock signal cannot be obtained. That is, even when jitter is contained in the input reference clock CKr, for example, since the jitter component can be removed by the voltage-controlled oscillator (ring oscillator) 321, etc., the ninth embodiment is particularly preferable when recovering a clock component from the received data.

Figure 65:
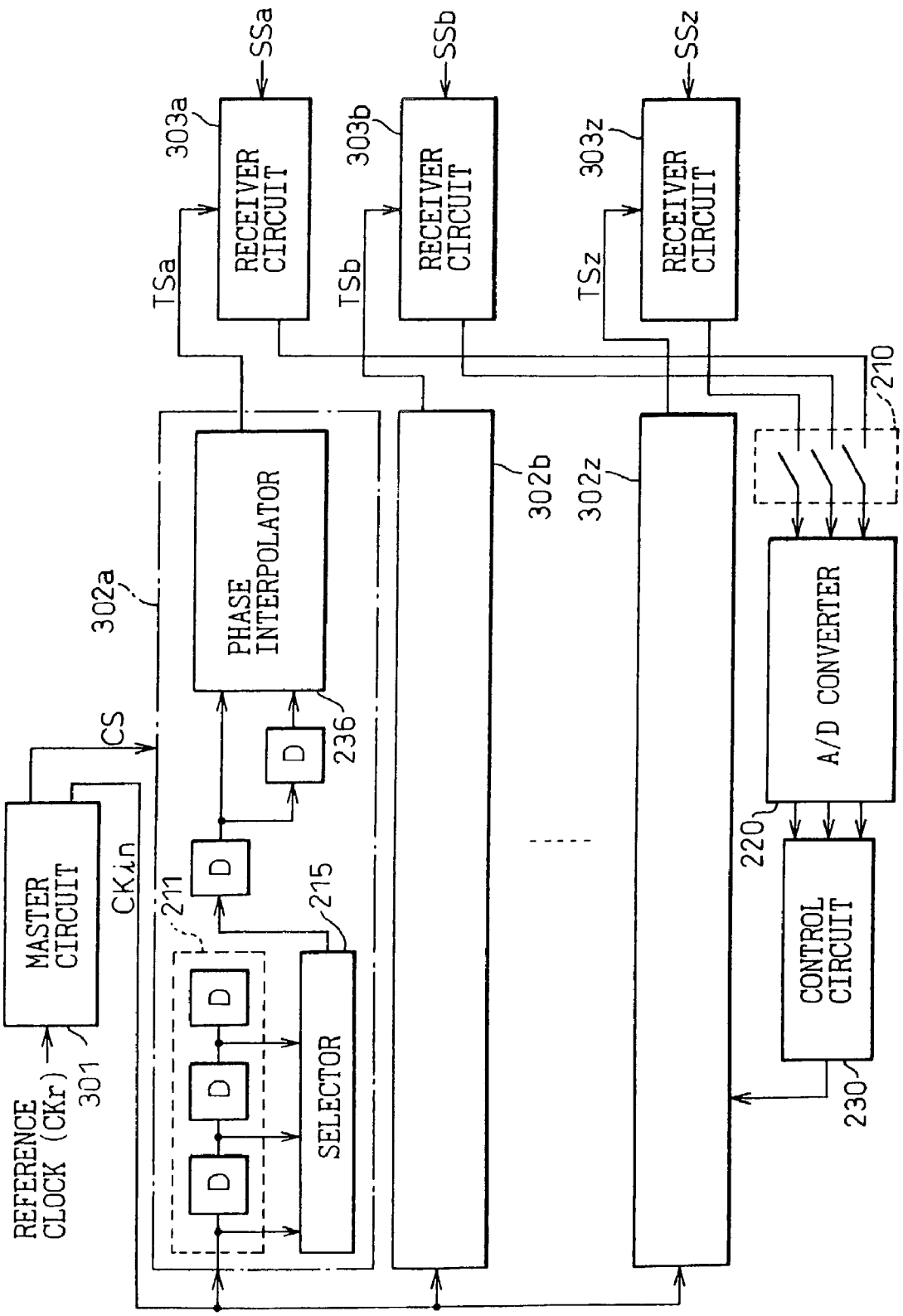
FIG. 65 is a block diagram showing a configurational example of the timing signal generating circuit as a 10th embodiment according to the third aspect of the present invention.

FIG. 65 is a block diagram showing the configuration of the timing signal generating circuit as a 10th embodiment according to the third aspect of the present invention.

In the 10th embodiment, the master circuit 301 uses a DLL circuit that outputs an internal clock (CKin) locked on the reference clock (CKr), and slave circuits 302a to 302z are provided for the respective bits of multi-bit receiver circuits 303a to 303z. Here, the master circuit 301 is not limited to the one shown in FIG. 60, but various other configurations are possible.

As shown in FIG. 65, the slave circuits 302a to 302z (302a) each comprise a selector 211, a delay line 215, two delay units D, and a phase interpolator 236, corresponding respectively to the selector (315), delay line (311), delay units (D), and phase interpolator (136) shown in FIG. 60, and supply timing signals TSa to TSz to the corresponding receiver circuits 303a to 303z to control the timing for the respective receiver circuits 303a to 303z to latch signals SSa to SSz.

In the 10th embodiment, the slave circuits 302a to 302z sequentially detect the levels of the signals SSa to SSz in the corresponding receiver circuits 303a to 303z, and control the respective delay amounts to provide optimum latch timing. More specifically, the signals from the receiver circuits are sequentially selected by a switch means 210 (for example, the signal SSa from the receiver circuit 303a is selected) and the selected signal is supplied to an A/D converter 220 for analog-to-digital conversion (A/D conversion); then, the selection (the delay amount in the delay line 211) by the selector 215 is controlled via a control circuit 230 so as to maximize the signal level (to increase the S/N ratio). Here, when the signal SSa is latched at the receiver circuit (303a) with optimum timing TSa, for example, the level of the signal SSa is maximum; in the 10th embodiment, therefore, the timing of the timing signal TSa is determined utilizing this characteristic.

More specifically, in the 10th embodiment, the delay amount in the delay line 211 is controlled using, for example, a 6-bit digital signal, and this digital signal is controlled so that the signal strength becomes the greatest in each of the receiver circuits 303a to 303z. Here, provisions are made so that the signal strength optimization operation is carried out while a special signal for that purpose (for example, a bit sequence "1010 . . . ,") is being transmitted. According to the 10th embodiment, the advantage is that, even for parallel signal transmission of multiple bits, the operation timing of each receiver circuit can be optimized by also considering the signal line delay between each bit.

Figure 66:
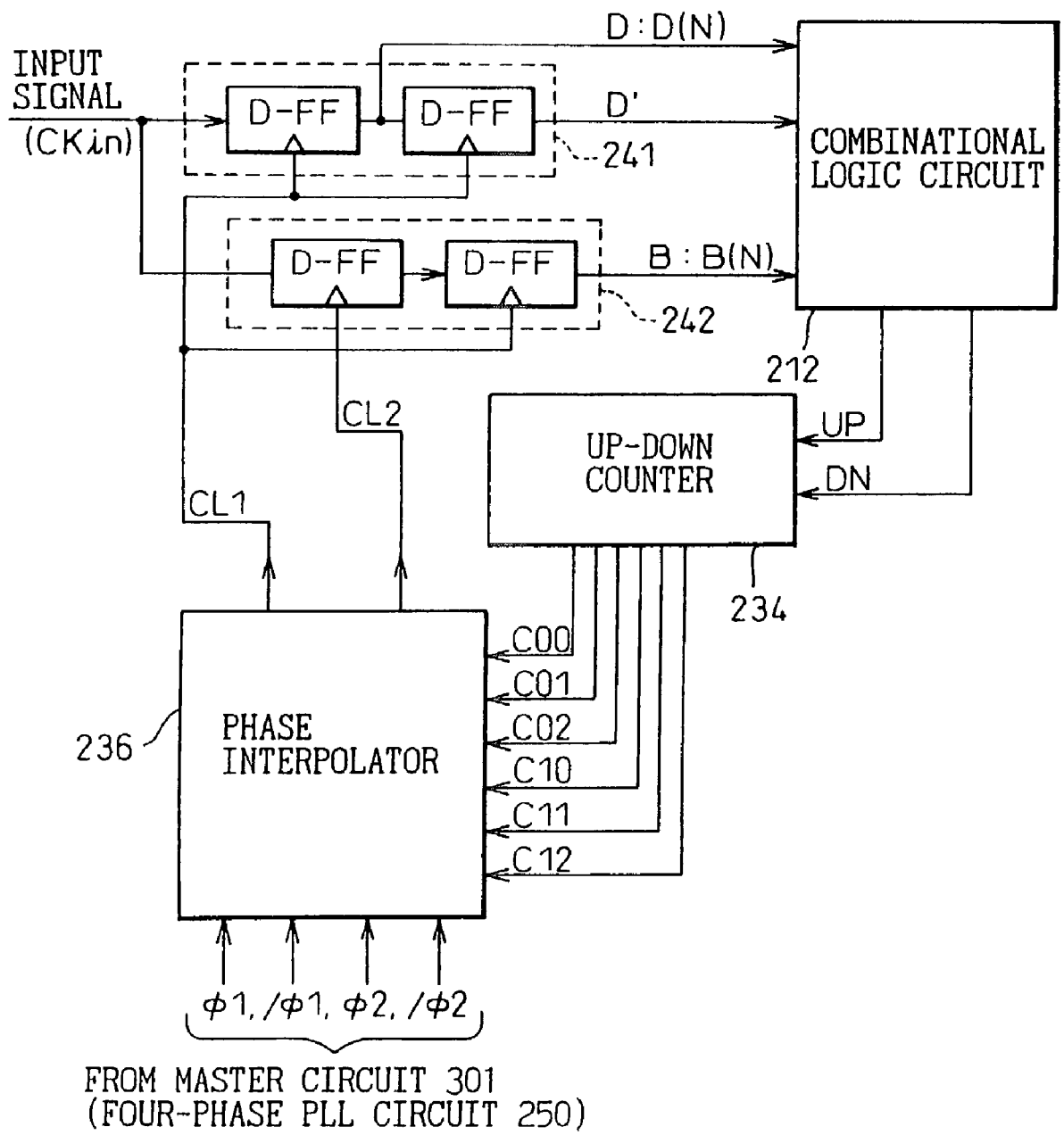
FIG. 66 is a block diagram showing one example of the configuration of an essential portion of the timing signal generating circuit as an 11th embodiment according to the third aspect of the present invention.

FIG. 66 is a block diagram showing the configuration of an essential portion of the timing signal generating circuit as an 11th embodiment according to the third aspect of the present invention.

In the 11th embodiment, as in the foregoing 10th embodiment, receiving timing for multiple bits is optimized for each bit, and the master circuit 302 generates a signal (internal clock CKin) locked on the reference clock CKr. Here, the slave circuits 302 (302a to 302z), as in the 10th embodiment, are provided for the respective bits of the multi-bit receiver circuits 303 (303a to 303z), and as shown in FIG. 66, each slave circuit 302 is provided with a fine delay control block using a phase interpolator 236, and controls input sampling timing (CL1, CL2) by using a 6-bit digital signal.

In FIG. 66, reference numeral 212 is a combinational logic circuit, 234 is an up-down counter, and 241 and 242 are receiving latch circuits. The phase interpolator 236 is supplied with outputs φ1, /φ1, φ2, /φ2 of a four-phase PLL circuit (250) in the master circuit 301, and outputs the control clocks CL1 and CL2 to control the sampling timing at the latch circuits 241 and 242. The latch circuits 241 and 242 are each constructed from two D-type flip-flops (D-FFs); sampling by the two flip-flops in the latch circuit 241 is controlled by the control clock CL1, while sampling by the two flip-flops in the latch circuit 242 is controlled by the control clocks CL1 and CL2, respectively.

More specifically, in each slave circuit 302 (302a to 302z) of the 11th embodiment, two receiving latch circuits 241 and 242 are provided for one bit; the latch circuit 241 samples the input at the center of a data receiving window (also called a bit cell), while the other latch circuit 242 samples at the boundary between two adjacent bit cells. For that purpose, the two latch circuits 241 and 242 are controlled by the control clocks CL1 and CL2 180 degrees out of phase with respect to each other, so that the input signal is sampled at a sampling rate twice the usual sampling rate. By using the two latch circuits 241 and 242, when a data transition from "0" to "1" or from "1" to "0" occurs between adjacent bit cells, it is possible to know whether the sampling timing (the timing of the control clocks CL1 and CL2) is advanced or delayed with respect to the data.

More specifically, when a data transition occurs such that the N-th data is "1" and the (N+1)th data is "0", then the sequence of "D(N), B(N), D(N+1)" is "1, 0, 0" or "1, 1, 0", where D(N) represents the output of the latch circuit 241 sampling the bit cell center and D(B) the output of the latch circuit 242 sampling the bit cell boundary. Here, the sequence "1, 0, 0" indicates that the timing of the sampling control clocks (CL1 and CL2) is delayed with respect to the data, while the sequence "1, 1, 0" indicates that the timing of the control clocks is advanced with respect to the data.

Next, when a data transition occurs such that the N-th data is "0" and the (N+1)th data is "1", if the sequence of "D(N), B(N), D(N+1)" is "0, 0, 1", it follows that the timing of the sampling control clocks (CL1 and CL2) is advanced with respect to the data; if the sequence is "0, 1, 1", it follows that the timing of the control clocks is delayed with respect to the data.

Then, by passing the outputs of the two latch circuits 241 and 242 through the combinational logic circuit 212, a decision signal (up signal UP or down signal DN) can be obtained that indicates whether the control clocks CL1 and CL2 should be delayed or advanced. This decision signal (UP, DN) is counted by the up-down counter 234, and the contents are converted to a 6-bit signal (C00, C01, C02; C10, C11, C12) which is supplied to the phase interpolator 236 to control the timing of the control clocks CL1 and CL2, thereby optimizing the signal receiving timing for maximum S/N ratio.

Here, the processing for optimizing the signal receiving timing in the 11th embodiment should only be performed while a signal dedicated to the timing optimization (a special signal, for example, a sequence "101010 . . .") is being transmitted. In this way, the 11th embodiment offers the advantages that the A/D converter 220 for evaluating the signal reception strength as an analog amount, as in the foregoing 10th embodiment, can be omitted, and that the processing for the timing optimization can be performed in parallel for multiple bits without having to sequentially select the bits by the switch means 210. Accordingly, in cases where the occurrence of a "0" to "1" or "1" to "0" transition at a prescribed frequency is guaranteed for every bit (for example, when data is encoded by a coding scheme such as 10B/8B), the processing for the receiving timing optimization for each bit can be performed in parallel with data transmission and reception.

Figure 67:
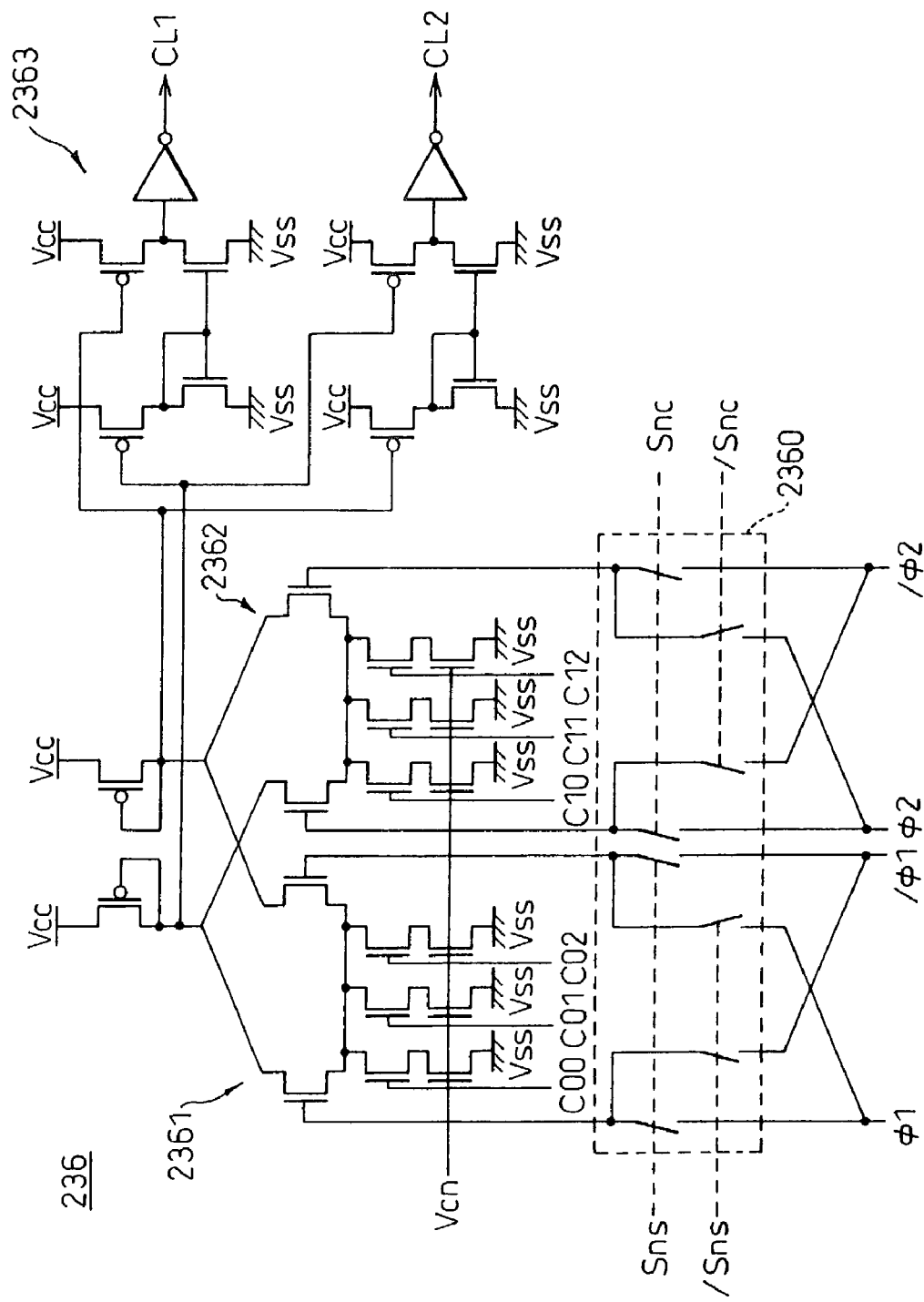
FIG. 67 is a circuit diagram showing one example of the phase interpolator (phase adjuster) in the timing signal generating circuit of FIG. 66.

FIG. 67 is a circuit diagram showing one example of the phase interpolator (phase adjuster) 236 in the timing signal generating circuit of FIG. 66.

As shown in FIGS. 66 and 67, the 6-bit signal (C00, C01, C02; C10, C11, C12) from the up-down counter 234 and the outputs (φ1, /φ1, φ2, /φ2) from the four-phase PLL circuit (250) in the master circuit 301 are supplied to the phase interpolator 236. The differential inputs to differential amplifier stages 2361 and 2362 are weighted using the 6-bit signal. The outputs (φ1, /φ1, φ2, /φ2) from the four-phase PLL circuit are supplied to the inputs of the respective differential amplifier stages 2361 and 2362 by being switched via a switch means 2360 which is controlled by control signals Sns and /Sns. Then, the signals output from the pair of differential amplifier stages 2361 and 2362 are passed through an output stage (comparator) 2363 to produce the control clocks CL1 and CL2, as in the case of FIG. 56 previously explained.

Figure 68:
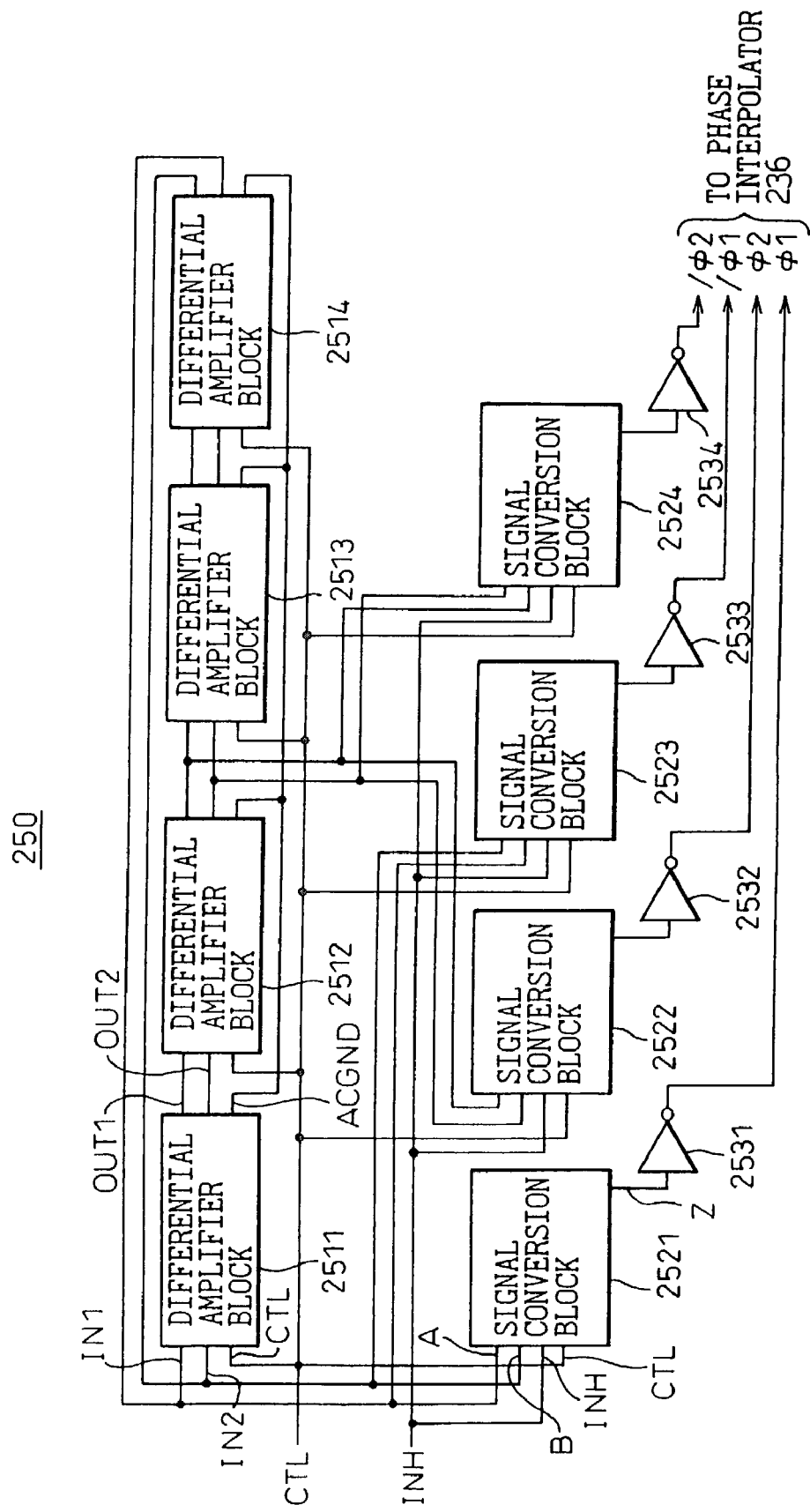
FIG. 68 is a circuit diagram showing one example of a four-phase PLL circuit applicable for use in the timing signal generating circuit of FIG. 66.

FIG. 68 is a circuit diagram showing one example of the four-phase PLL circuit 250 applicable for use in the timing signal generating circuit of FIG. 66.

As shown in FIG. 68, the four-phase PLL circuit 250 comprises four stages of differential amplifier blocks 2511 to 2514 four signal conversion blocks 2521 to 2524, and four inverters 2531 to 2534. That is, the four differential amplifier blocks 2511 to 2514 are connected in cascade, prescribed signals are supplied to the signal conversion blocks 2521 and 2524, and signal levels are inverted and waveshaping performed by the inverters 2351 and 2354 to obtain the four-phase output signals φ1, /φ1, φ2, and /φ2.

Figure 69:
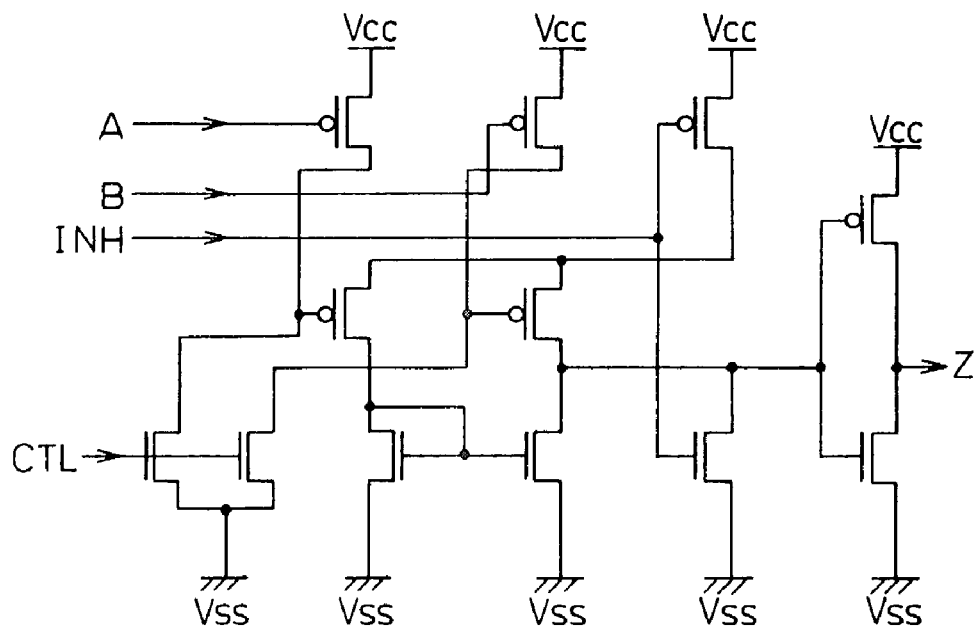
FIG. 69 is a circuit diagram showing one example of a signal conversion block in the four-phase PLL circuit of FIG. 68.
Figure 70:
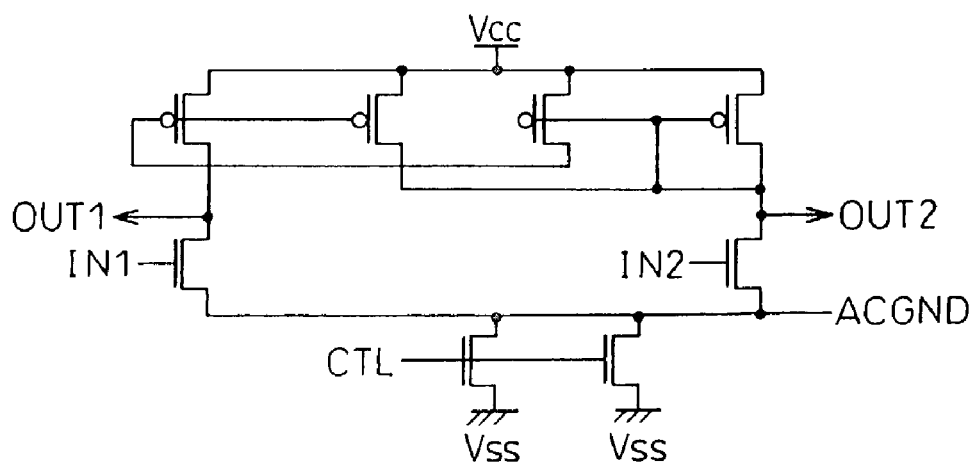
FIG. 70 is a circuit diagram showing one example of a differential amplifier block in the four-phase PLL circuit of FIG. 68.

FIG. 69 is a circuit diagram showing one example of the signal conversion block 252 (2521 to 2524) in the four-phase PLL circuit of FIG. 68, and FIG. 70 is a circuit diagram showing one example of the differential amplifier block 251 (2511 to 2514) in the four-phase PLL circuit of FIG. 68.

As shown in FIGS. 68 and 69, the signal conversion block 252 (2521 to 2524) accepts two input signals (A and B) and produces one output signal (Z). More specifically, two output signals from the second-stage differential amplifier block 2512 or the fourth-stage differential amplifier block 2514 in the four-stage cascade of differential amplifier blocks are supplied as the inputs A and B to each signal conversion block 252 (2521 to 2524) which produces the single output Z by processing the two inputs A and B. Then, the output Z is fed to the inverter 253 (2531 to 2534) for level inversion and waveshaping. The four-phase PLL circuit 250 thus produces the outputs φ1, /φ1, φ2, and /φ2. Here, each signal conversion block 252 always outputs a signal (Z) of high level "H", when signal INH is at a high level "H", and a signal (Z), whose level is dependent on the input signals A and B, when the signal INH is at a low level "L" and control signal CTL is at a high level "H".

As shown in FIGS. 68 and 70, the differential amplifier blocks 251 (2511 to 2514) are cascaded so that the output signals (OUT1 and OUT2) from the differential amplifier blocks 2511, 2512, and 2513 are supplied as input signals IN1 and IN2 to the differential amplifier blocks 2512, 2513, and 2514 at the respective subsequent stages. Here, to the first-stage differential amplifier block 2511 are supplied the output signals from the last stage (fourth-stage) differential amplifier block 2514. Each differential amplifier block 251 is activated when the control signal CTL is at a high level "H".

Figure 71:
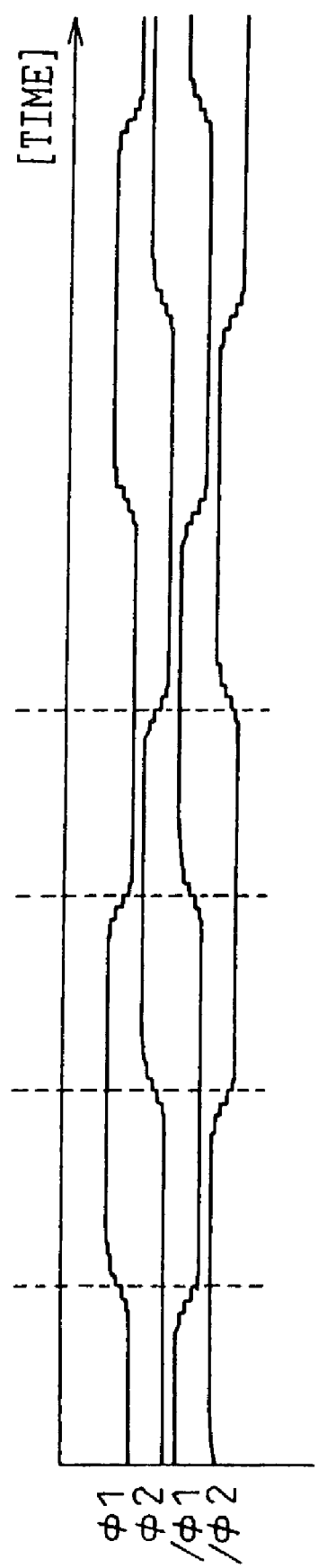
FIG. 71 is a diagram showing output signals of the four-phase PLL circuit of FIG. 68.

FIG. 71 is a diagram showing the output signals of the four-phase PLL circuit of FIG. 68.

The four-phase output signals φ1, φ2, /φ1, and /φ2, one shifted in phase by 90 degrees with respect to the next, as shown in FIG. 71, are obtained from the four-phase PLL circuit 250 constructed using the signal conversion blocks 252 and differential amplifier blocks 251 shown in FIGS. 69 and 70. As previously noted, these signals φ1, φ2, /φ1, and /φ2 are supplied to the phase interpolator 236 in the slave circuit 302 shown, for example, in FIG. 66.

It will be appreciated that the four-phase PLL circuit 250, the signal conversion blocks 252, and the differential amplifier blocks 251 are not limited in configuration to those described above, but various other circuit configurations are also possible.

As described above, according to the timing signal generating circuit in each embodiment of the third aspect of the present invention, the timing signal synchronized to the reference clock can be generated in each slave circuit that is much simpler in configuration than the master circuit. Furthermore, by varying the response speed of the slave circuit according to the frequency of the reference clock, it becomes possible to generate a highly accurate timing signal over a wide frequency range. That is, timing pulses having a predetermined phase difference relative to each other can be generated synchronously with the reference clock by using many slave circuits that are simple in configuration, and highly accurate timing signals necessary for the transmission and reception of high-speed signals can be generated using circuitry that occupies a small area.

While the master circuit and the plurality of slave circuits can be provided within one semiconductor integrated circuit device (LSI chip), it is also possible to construct the master circuit and the slave circuits respectively on different semiconductor integrated circuit devices. That is, the timing signal generating circuit according to each embodiment in the third aspect of the present invention can also be applied to a semiconductor integrated circuit system having a plurality of semiconductor integrated circuit devices or to a multichip module (MCM) or the like.

As described in detail above, according to the third aspect of the present invention, a plurality of timing signals synchronized to the reference clock and having a predetermined phase difference relative to each other can be generated with high accuracy, using simple circuitry.

Next, embodiments of the phase interpolator according to the present invention will be described with reference to accompanying drawings.

Figure 72:
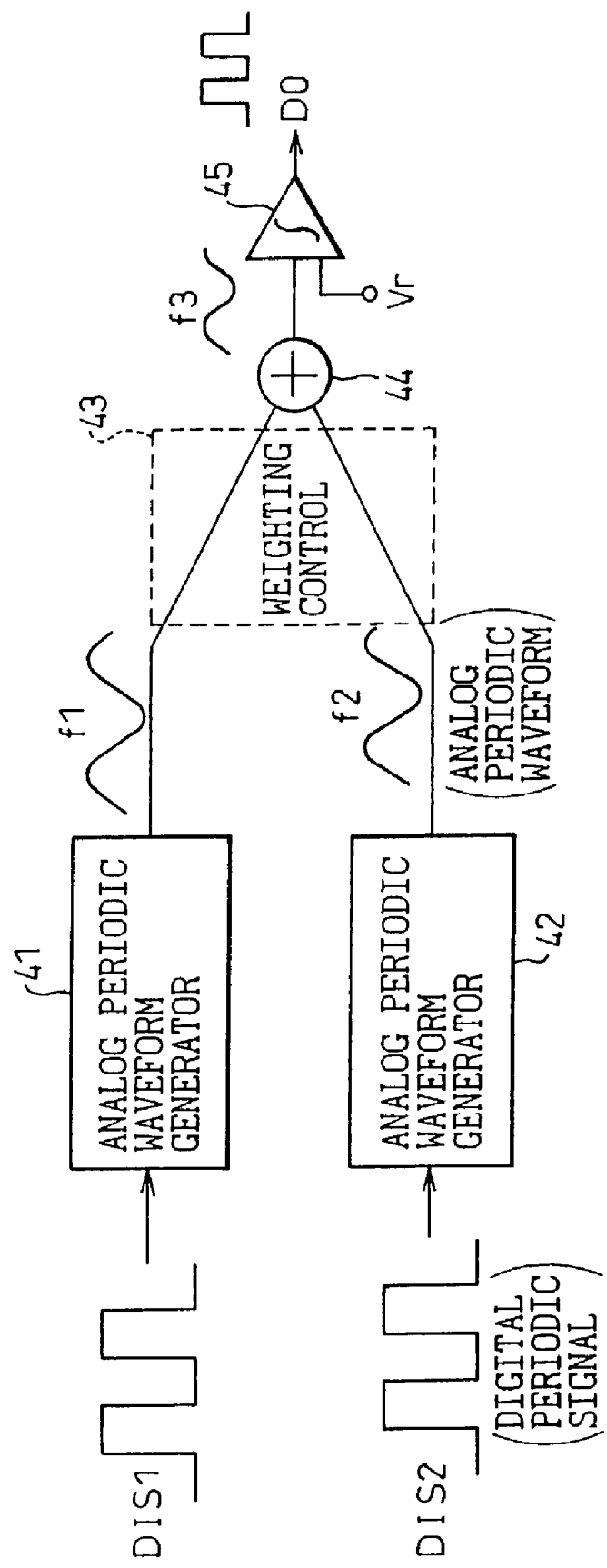
FIG. 72 is a block diagram showing the basic functional configuration of the phase interpolator according to the present invention.
Figure 73:
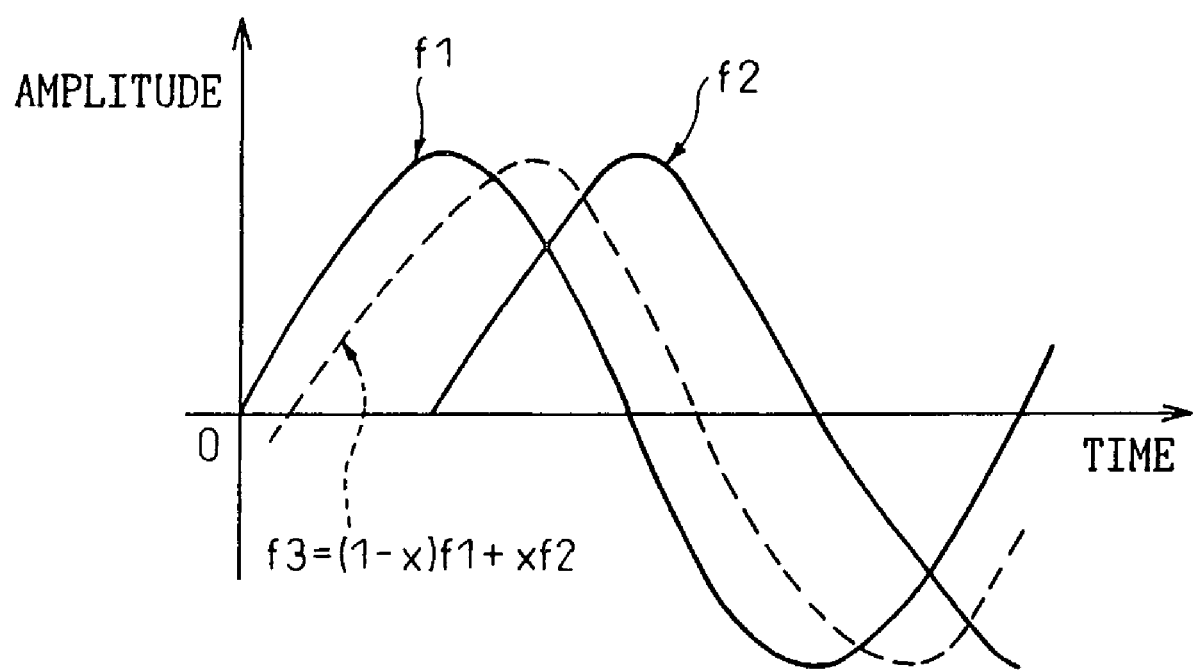
FIG. 73 is a waveform diagram for explaining the operation of the phase interpolator of FIG. 72.

FIG. 72 is a block diagram showing the basic functional configuration of the phase interpolator according to the present invention, and FIG. 73 is a waveform diagram for explaining the operation of the phase interpolator of FIG. 72.

In FIG. 72, reference numerals 41 and 42 are analog periodic waveform generating blocks, 43 is a weighting control block, 44 is a summed waveform generating block, and 45 is an analog/digital conversion block.

As shown in FIG. 72, the analog periodic waveform generating block 41 receives a first digital periodic signal DIS1 and generates a first analog periodic waveform (f1: See FIG. 73) whose value varies in an analog fashion, and the analog periodic waveform generating block 42 receives a second digital periodic signal DIS2 and generates a second analog periodic waveform (f2: See FIG. 73) whose value varies in an analog fashion. Here, the first digital periodic signal DIS1 and the second digital periodic signal DIS2 are signals shifted relative to each other along the time axis (signals with different phases). The phase interpolator is a device which, for example, accepts the digital signals DIS1 and DIS2 having different phases and generates from them a digital signal having an arbitrary intermediate phase.

The first analog periodic waveform f1 and the second analog periodic waveform f2 are weighted in the weighting control block 43 and are summed in the summed waveform generating block 44 which thus generates a third analog periodic waveform (f3: See FIG. 73). That is, the third analog periodic waveform f3 such that $f3=(1-x)f1+f2$, where $0 \leq x \leq 1$, is obtained at the output of the summed waveform generating block 44.

The analog/digital conversion block 45 then converts the third analog periodic waveform f3 to a digital signal having a prescribed phase, which is output as a third digital periodic signal DO. Here, the analog/digital conversion block 45 is constructed, for example, from a comparator which compares the third analog periodic waveform f3 with the reference voltage Vr and outputs "0" or "1".

The phase interpolator according to the present invention can be used, for example, as the phase interpolators 136 and 236 (FIGS. 55, 60, 61, etc.) in the previously described timing signal generating circuits, but it will be appreciated that it can be used extensively in various other circuits.

Figure 74:
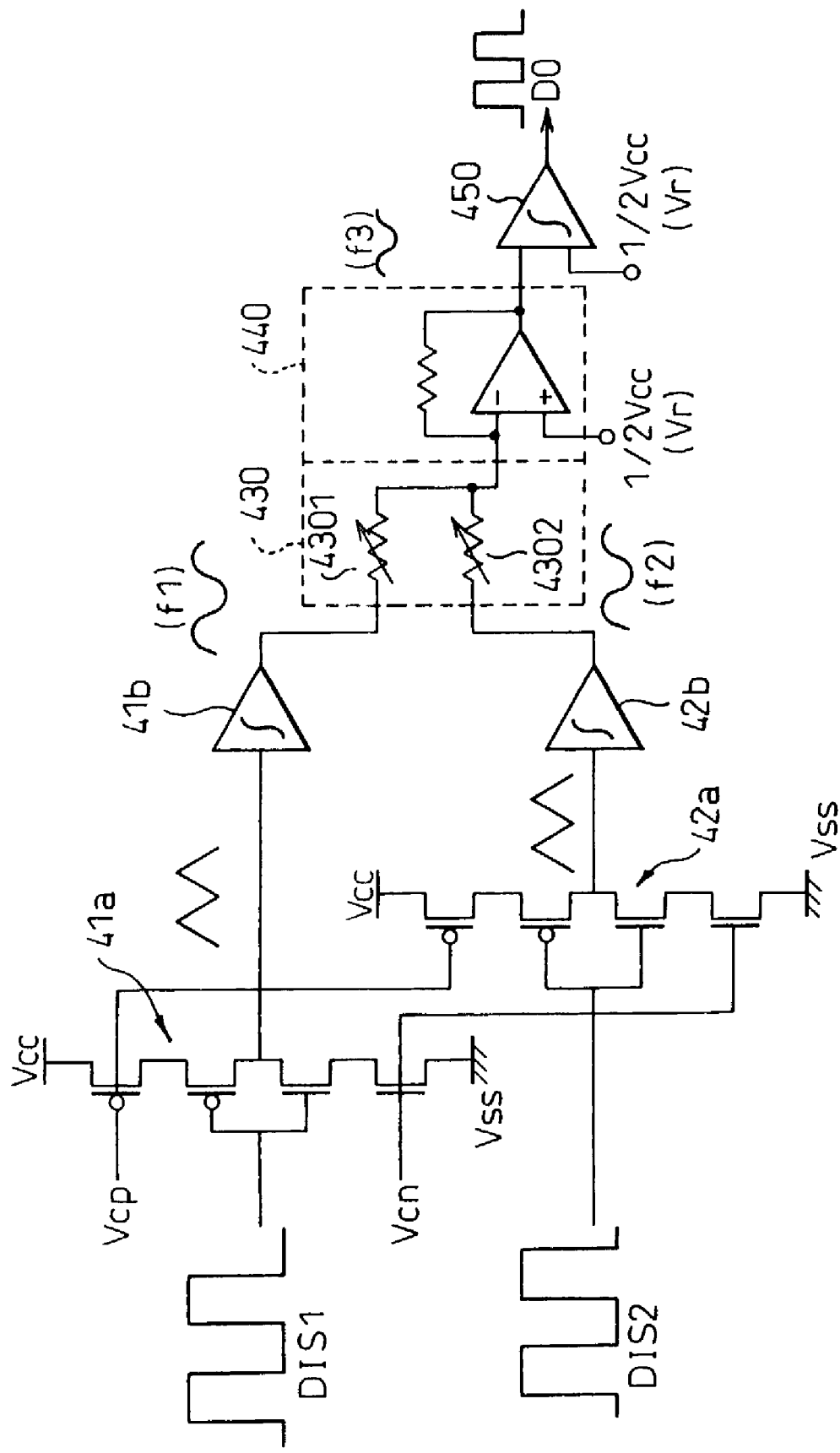
FIG. 74 is a circuit diagram showing a configurational example of the phase interpolator as a 12th embodiment of the present invention.
Figure 75:
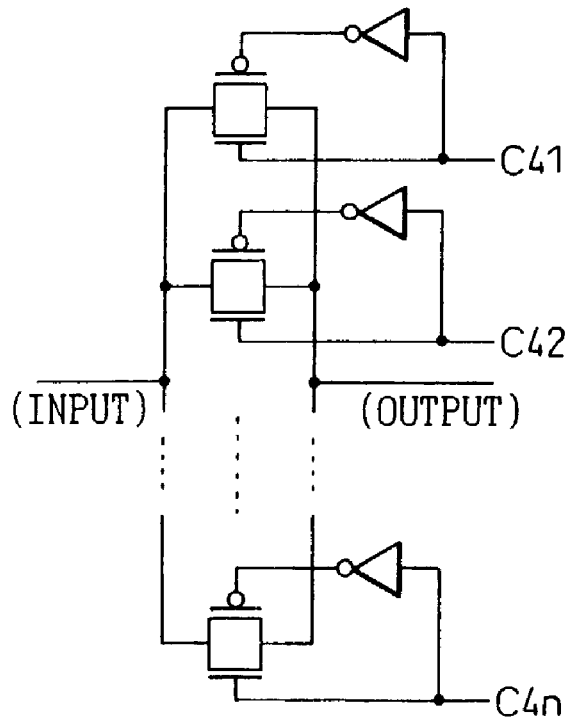
FIG. 75 is a circuit diagram showing a configurational example of a weighting control block in the phase interpolator of FIG. 74.

FIG. 74 is a circuit diagram showing a configurational example of the phase interpolator as a 12th embodiment of the present invention, and FIG. 75 is a circuit diagram showing a configurational example of the weighting control block in the phase interpolator of FIG. 74. In FIG. 74, reference numerals 41a, 41b and 42a, 42b are sine wave generating circuits, 430 is a weighting control circuit (weighting control block), 440 is an operational amplifier circuit (summed waveform generating circuit), and 450 is a comparator circuit (analog/digital conversion circuit).

As earlier explained with reference to FIG. 62, the phase interpolator of the 12th embodiment shown in FIG. 74 converts square waves into triangular waves by passing the digital signals (square waves) DIS1 and DIS2 through the delay circuits 41a and 42a, and further converts the triangular waves into sine waves (pseudosine waves) by passing the triangular waves through the driver circuits (nonlinear amplifier circuits) 41b and 42b. These sine waves (f1 and f2) are then fed into the weighting control circuit 430 where they are assigned prescribed weights by the respective weighting control blocks (4301 and 4302); after that, the sine waves are summed in the operational amplifier circuit 440 and the resulting wave is fed to the comparator 450.

As shown in FIG. 75, the weighting control block 4301 (4302) is constructed from a plurality (the number n) of transfer gates provided in parallel between the input and output. These n (for example, 16) transfer gates are controlled for connection by control signals C41 to C4n, respectively, so that the sine wave f1 (f2) is weighted according to the number of transfer gates caused to conduct between the input and output. More specifically, in the circuit example of FIG. 75, of the control signals C41 to C4n an arbitrary number of control signals are set to the high level "H", causing the corresponding number of transfer gates to turn on and thus varying the conductance (the conductance at the input side of the operational amplifier circuit 440).

In FIG. 75, the nMOS and pMOS transistors forming the respective transfer gates are of the same size, but alternatively, the nMOS and pMOS transistors forming each transfer gate may be varied in size (for example, with the gate width of the smallest transistor being 1, the gate widths of the other transistors are set to 1.1, 1.2, 1.3, . . . , respectively); in the latter case, the sine wave f1 (f2) can be weighted by turning on an arbitrary transfer gate or an arbitrary number of transfer gates in a desired combination, that is, by causing at least one transfer gate to conduct.

Figure 76:
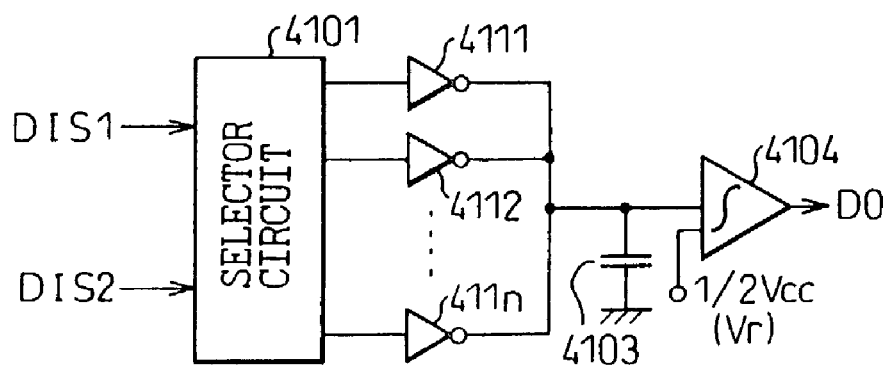
FIG. 76 is a circuit diagram showing a configurational example of the phase interpolator as a 13th embodiment of the present invention.

FIG. 76 is a circuit diagram showing a configurational example of the phase interpolator as a 13th embodiment of the present invention. In FIG. 76, reference numeral 4101 is a selector circuit, 4111 to 411n are CMOS inverters, 4103 is a capacitive load, and 4104 is a comparator circuit (comparator).

The selector circuit 4101 performs control to select the number, k, of CMOS inverters, 4111 to 411k, to which the first digital periodic signal DIS1 is input, and the number, n–k, of CMOS inverters, 411k to 411n, to which the second digital periodic signal DIS2 is input. That is, the number (k) of CMOS inverters, to which the first digital periodic signal DIS1 is input, and the number (n–k) of CMOS inverters, to which the second digital periodic signal DIS2 is input, are controlled by the selector circuit 4101. Here, the total number of CMOS inverters 4111 to 411n is, for example, 16. Further, the outputs of the CMOS inverters 4111 to 411n are connected in common and coupled to the terminal (an input terminal of the comparator 4104) to which the capacitive load 4103 is connected. The comparator 4104 compares the input with the reference voltage Vr (½·Vcc) and outputs, the digital periodic signal DO, "0" or "1".

Each of the CMOS inverters 4111 to 411n takes the digital signal DIS1 or DIS2, a square wave, directly as its input, but the output of each of the CMOS inverters 4111 to 411n becomes an analog periodic waveform whose value varies in analog fashion because of the presence of the capacitive load 4103. The phase interpolator of the 13th embodiment accomplishes the conversion of the digital-signals (DIS1 and DIS2) to analog waveforms simultaneously with their weighting control by controlling the number of CMOS inverters to be connected to the first and second digital periodic signals DIS1 and DIS2, respectively. The phase interpolator of the 13th embodiment thus offers the advantage that there is no need to provide sine wave generating circuits and the linearity of weighting control is high.

Figure 77:
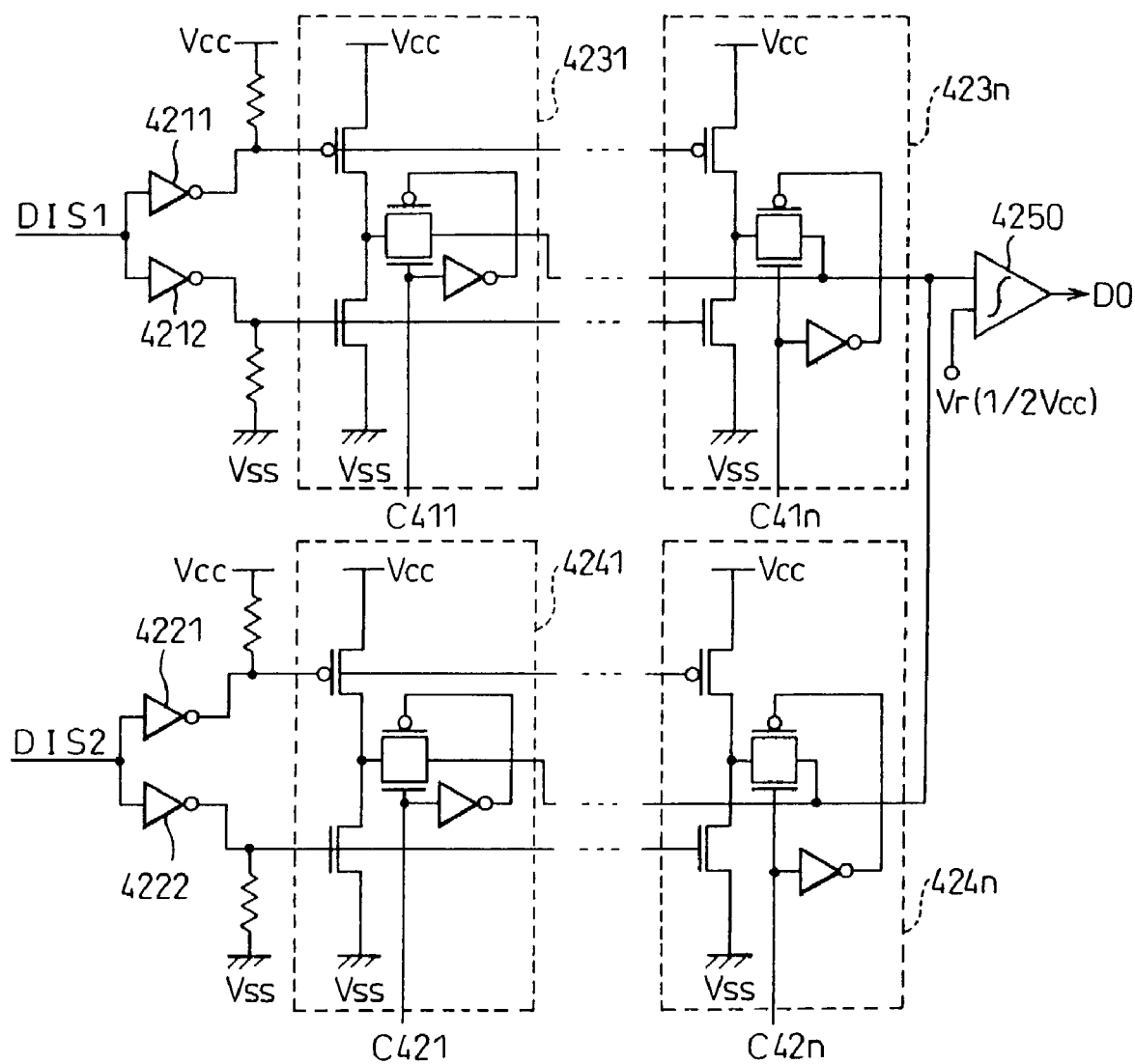
FIG. 77 is a circuit diagram showing a configurational example of the phase interpolator as a 14th embodiment of the present invention.

FIG. 77 is a circuit diagram showing a configurational example of the phase interpolator as a 14th embodiment of the present invention.

In the phase interpolator of the 14th embodiment, the digital signals DIS1 and DIS2 are received by respective inverter pairs 4211, 4212 and 4221, 4222, and nMOS and pMOS transistors in each of a plurality of CMOS inverter output stages 4231 to 423n and 4241 to 424n are driven by the outputs of these inverters 4211, 4212 and 4221, 4222. Here, the outputs of the output stages 4231 to 423n (4241 to 424n) are taken through respective transfer gates which are controlled for connection by respective control signals C411 to C41n (C421 to C42n), and are connected in common and supplied as an input to the comparator 4250.

More specifically, the phase interpolator of the 14th embodiment uses a plurality of CMOS inverters for weighting control, as in the foregoing 13th embodiment, but the difference is that only the number of output stages is controlled for connection by the control signals, the input circuitry (the inverters 4211, 4212 and 4221, 4222) being provided in common. Here, the nMOS and pMOS transistors forming the respective output stages (and transfer gates) 4231 to 423n and 4241 to 424n are chosen to have the same size, and the number of output stages controlled for connection is, for example, 16 or 32.

Since the input capacitance of the circuit is constant regardless of weight values, the phase interpolator of the 14th embodiment has the advantage that a phase shift due to the loading effect does not occur to the input digital signals DIS1 and DIS2, which makes it possible to generate the digital signal DO having a more accurate timing (phase difference).

Figure 78:
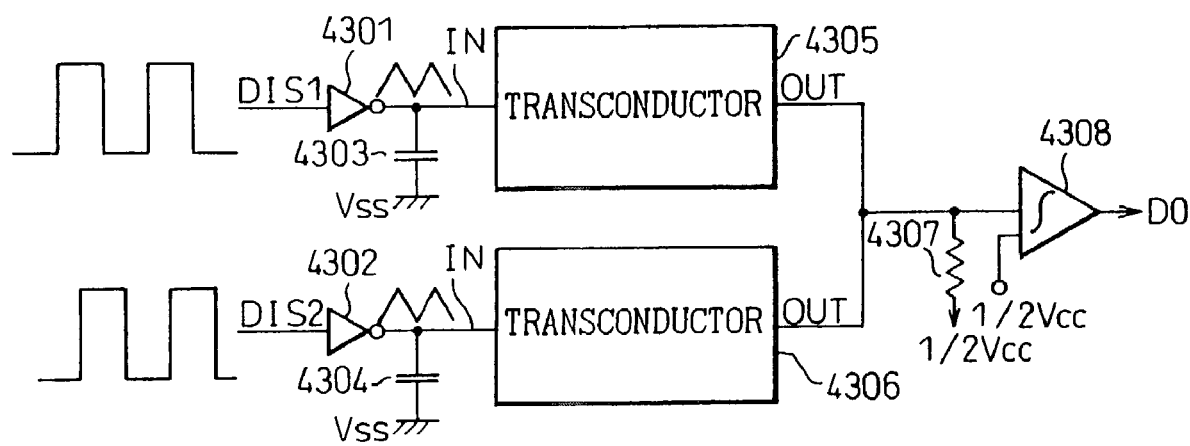
FIG. 78 is a circuit diagram showing a configurational example of the phase interpolator as a 15th embodiment of the present invention.
Figure 79A:
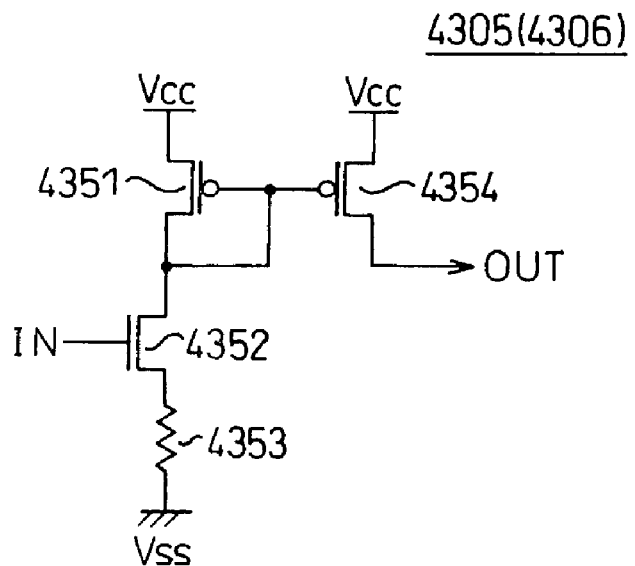
FIGS. 79A and 79B are circuit diagrams showing examples of transconductors in the phase interpolator of FIG. 78.
Figure 79B:
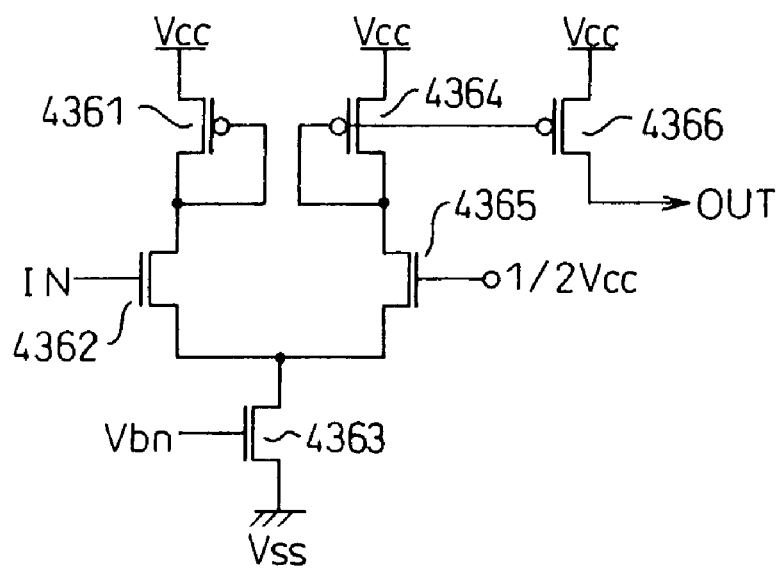

FIG. 78 is a circuit diagram showing a configurational example of the phase interpolator as a 15th embodiment of the present invention, and FIGS. 79A and 79B are circuit diagrams showing examples of transconductors in the phase interpolator of FIG. 78.

As shown in FIG. 78, in the phase interpolator of the 15th embodiment, the digital input signals DIS1 and DIS2 are converted to triangular waves by integrator circuits each consisting of an inverter 4301, 4302 and a capacitive load 4303, 4304, and supplied to the respective transconductors (variable transconductors) 4305 and 4306. Here, each integrator circuit can be obtained by switching the constant current by the digital signal, but various other integrator circuits can be used. Further, filter circuits that simply attenuate the high frequency components of the digital signals may be used instead of the integrator circuits.

As shown in FIGS. 79A and 79B, the transconductor 4305 (4306) is provided to extract a current output corresponding to the input voltage.

The transconductor 4305 of FIG. 79A consists of pMOS transistors 4351 and 4354, an nMOS transistor 4352, and a resistor 4353, and is configured so that a current corresponding to the input voltage (IN) applied to the gate of the transistor 4352 flows to the transistor 4351 and the current flowing through the transistor 4354 connected in a current mirror arrangement with the transistor 4351 is extracted as the current output.

On the other hand, the transconductor 4305 of FIG. 79B consists of pMOS transistors 4361, 4364, and 4366, and nMOS transistors 4362, 4363, and 4365, and is configured so that the current flowing through the transistor 4364, according to the input voltage (IN) applied to one input of the differential circuit (the gate of the transistor 4362) and the reference voltage (½·Vcc) applied to the other input thereof, is extracted as the current output from the transistor 4366 connected in a current mirror arrangement with the transistor 4364.

Besides the transconductors 4305 and 4306 shown in FIGS. 79A and 79B, various transconductor circuits known in the field of continuous-time analog processing can be used for the above purpose.

As shown in FIG. 78, after the triangular waves are converted by the transconductors 4305 and 4306 into current signals, the current signals are output to a resistive load 4307 to achieve a weighted sum. The comparator 4308 then compares the weighted sum with the reference voltage (½·Vcc) to produce the digital signal DO having a prescribed phase.

The phase interpolator of the 15th embodiment offers the advantage that a highly accurate circuit design becomes possible because the circuitry for performing the conversion to triangular waves and the circuitry for creating the sum can be optimized separately.

Figure 80:
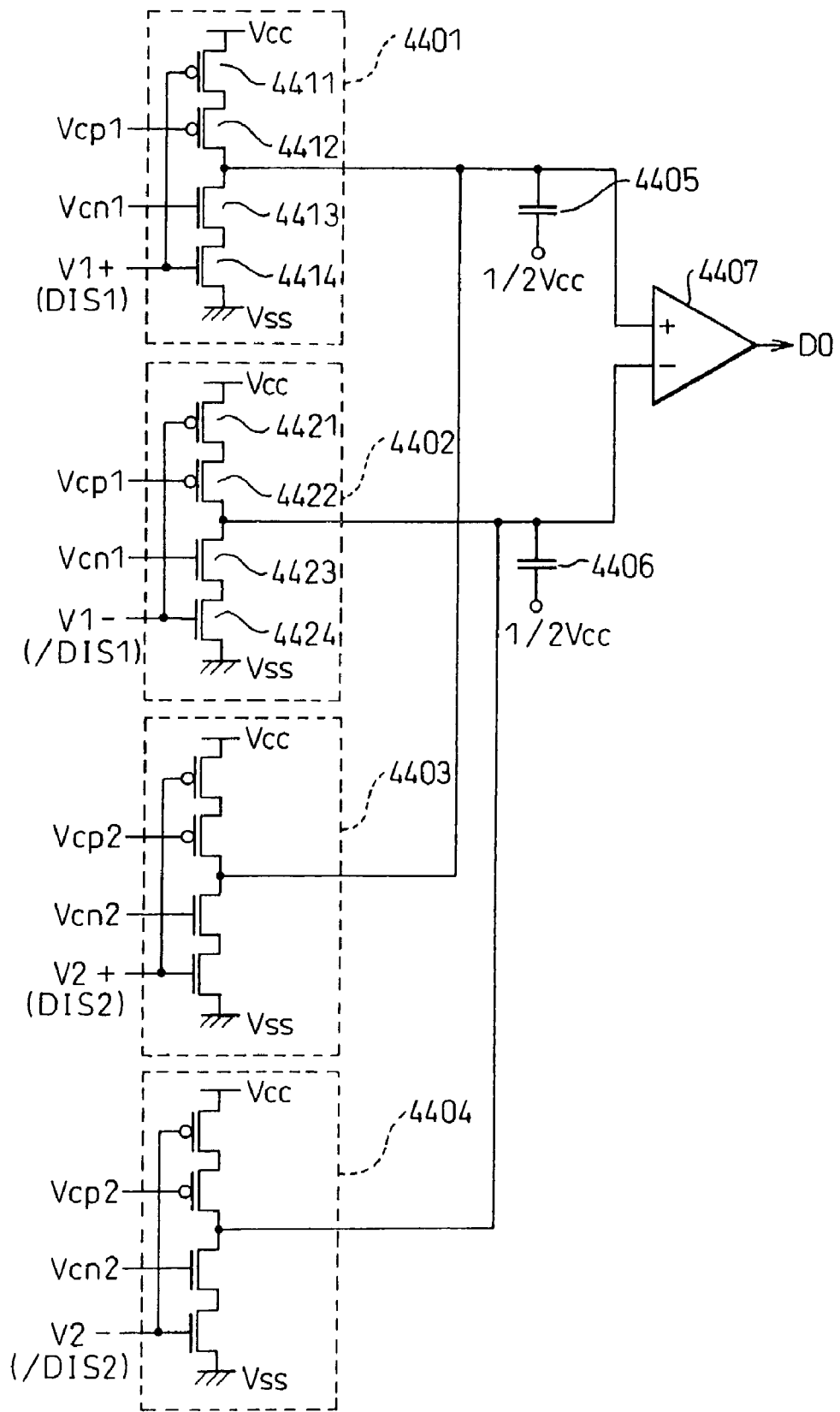
FIG. 80 is a circuit diagram showing a configurational example of the phase interpolator according to a 16th embodiment of the present invention.

FIG. 80 is a circuit diagram showing a configurational example of the phase interpolator according to a 16th embodiment of the present invention. In FIG. 80, reference character V1+ corresponds to the first digital periodic signal DIS1, V1– corresponds to the inverted signal (/DIS1) of the first digital periodic signal DIS1, V2+ corresponds to the second digital periodic signal DIS2, and V2– corresponds to the inverted signal (/DIS2) of the second digital periodic signal DIS2.

As shown in FIG. 80, the analog periodic waveform generating block and summed waveform generating block are constructed by connecting constant current sources with switches (4401, 4403 and 4402, 4404) to respective capacitive loads (4405 and 4406). That is, when the first input digital signal DIS1 (V1+) is at a high level "H", in the constant current source with switches 4401 an nMOS transistor 4414 is ON and a pMOS transistor 4411 is OFF and, in the constant current source with switches 4402, an nMOS transistor 4424 is OFF and a pMOS transistor 4421 is ON; as a result, current flows to the capacitive load 4405 through the nMOS transistors 4413 and 4414, and likewise, current flows to the capacitive load 4406 through the pMOS transistors 4421 and 4422. Conversely, when the first input digital signal DIS1 is at a low level "L", current flows to the capacitive load 4405 through the pMOS transistors 4411 and 4412, and likewise, current flows to the capacitive load 4406 through the nMOS transistors 4423 and 4424. The same applies for the second input digital signal DIS2 (V2+) that differs in phase. Further, one end of the capacitive load 4405 whose other end is connected to the positive logic input of the comparator 4407 is held at the intermediate potential (½·Vcc), and likewise, one end of the capacitive load 4406 whose other end is connected to the negative logic input of the comparator 4407 is also held at the intermediate potential (½·Vcc).

The analog summed waveform (the waveform at the other end of the capacitive load 4405) obtained by summing the positive logic digital periodic signals DIS1 and DIS2 (V1+ and V2+) is compared in the comparator 4407 with the analog summed waveform (the waveform at that other end of the capacitive load 4406) obtained by summing the negative logic digital periodic signals /DIS1 and /DIS2 (V1– and V2–), and the digital periodic signal DO corresponding to the result of the comparison is output.

In the phase interpolator of the 16th embodiment, weighting control is performed by changing the voltage levels of bias signals (Vcp1, Vcn1; Vcp2, Vcn2). Circuits for generating the bias signals will be described later with reference to FIGS. 81 and 82.

In this way, in the phase interpolator of the 16th embodiment, the analog periodic waveform generating and summed waveform generating block comprises current polarity switching means (4411, 4414 and 4421, 4424) for switching the polarity of the current flowing from the constant current sources (4412, 4413 and 4422, 4423) to the common capacitive loads (4405 and 4406) by the first digital periodic signal DIS1 (V1+, V1–), and current value control means (4412, 4413 and 4422, 4423) for controlling the current values of the current sources. The construction is fundamentally the same for the second digital periodic signal DIS2.

The constant current source with switches 4401 (4402 to 4404) is constructed by inserting the pMOS transistor 4412 and nMOS transistor 4413, biased in constant current mode, on the drain side of the pMOS transistor 4411 and nMOS transistor 4414 forming a CMOS inverter. Alternatively, the pMOS transistor and nMOS transistor biased in constant current mode may be inserted, not on the drain side, but on the source side of the transistors forming the CMOS inverter (that is, between the high-level voltage supply line Vcc and the source of the pMOS transistor 4411 and between the low-level voltage supply line Vss and the source of the nMOS transistor 4414).

The phase interpolator of the 16th embodiment allows the function of converting the digital input signals into analog signals (the function of the analog periodic waveform generating block) and the function of generating the sum (the function of the summed waveform generating block) to be implemented on one terminal; this serves to simplify the circuit configuration and reduce the power consumption.

Figure 81:
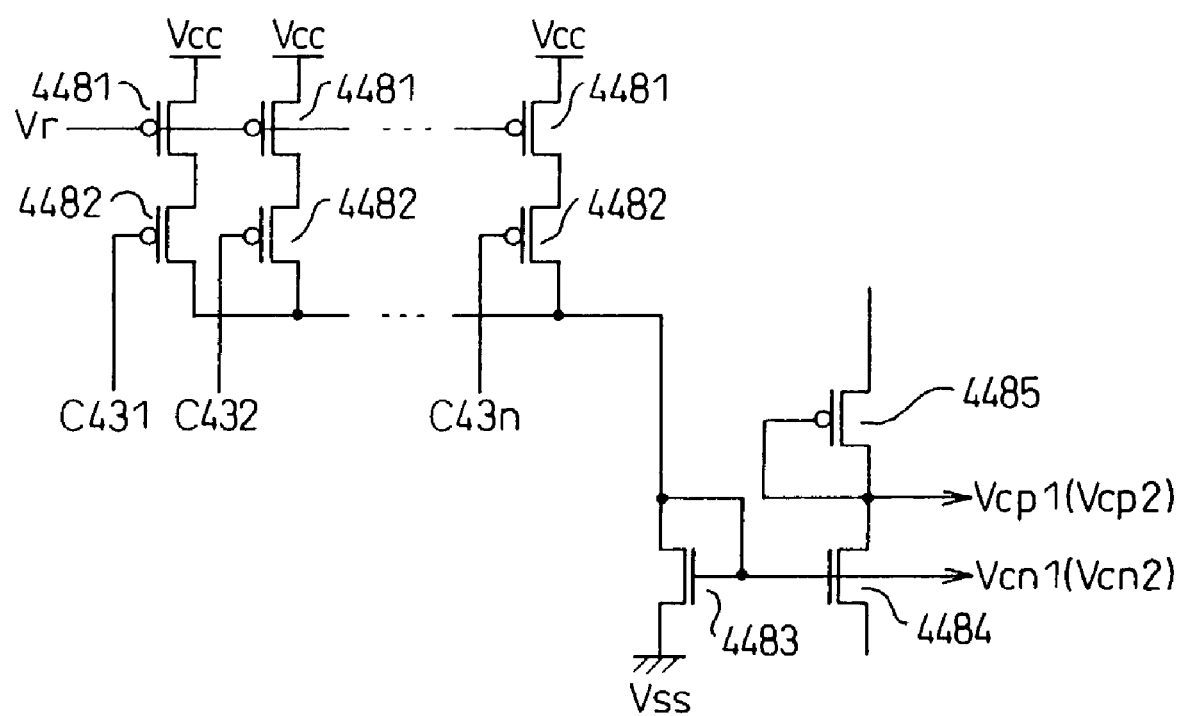
FIG. 81 is a circuit diagram showing one example of a circuit for generating bias signals in the phase interpolator of FIG. 80.
Figure 82:
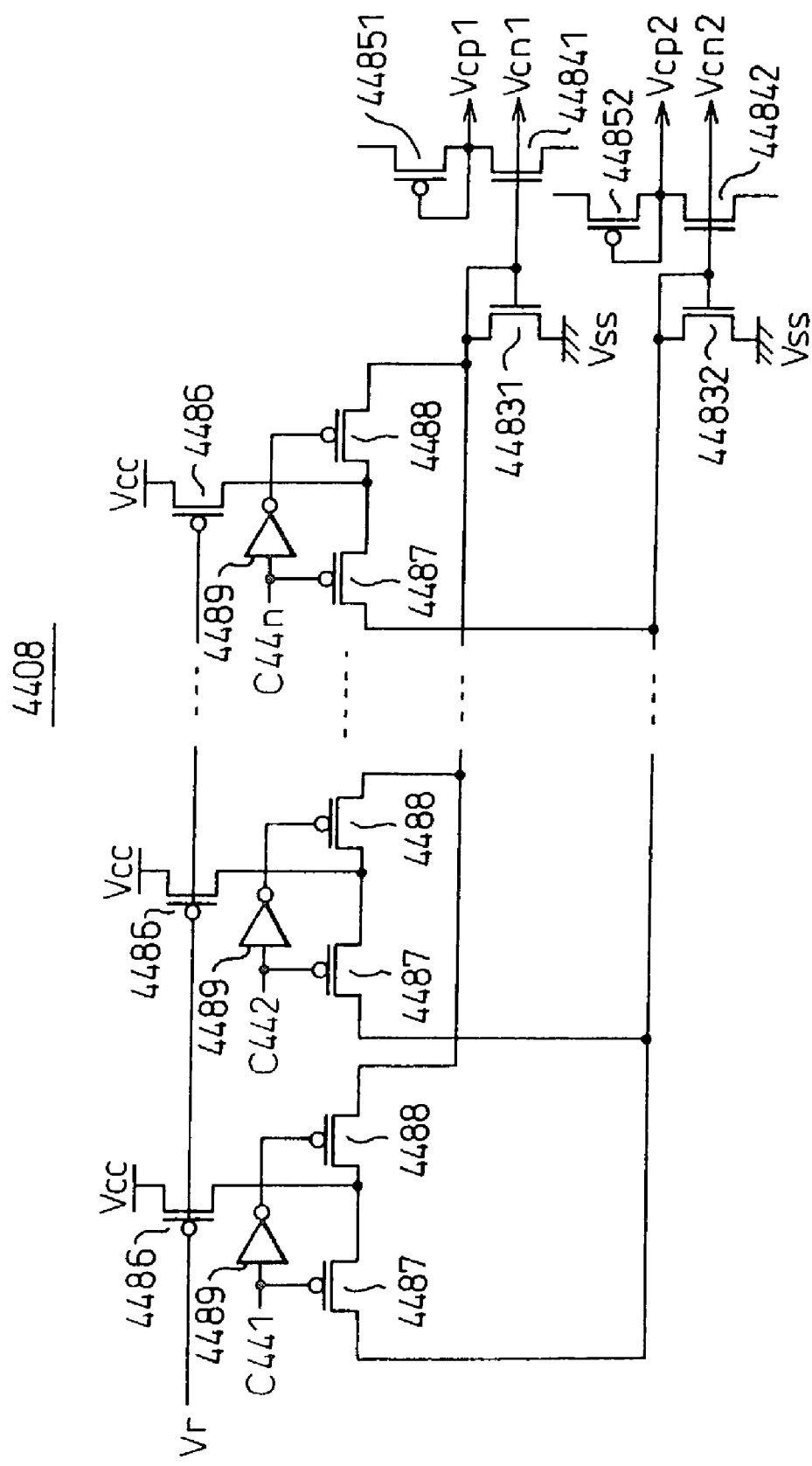
FIG. 82 is a circuit diagram showing another example of the circuit for generating the bias signals in the phase interpolator of FIG. 80.

FIG. 81 is a circuit diagram showing one example of the circuit for generating the bias signals in the phase interpolator of FIG. 80, and FIG. 82 is a circuit diagram showing another example of the circuit for generating the bias signals in the phase interpolator of FIG. 80.

As earlier described, in the phase interpolator shown in FIG. 80, weighting control for the digital periodic signals DIS1, DIS2, /DIS1, and /DIS2 is performed by changing the voltage level of the bias signals Vcp1, Vcn1, Vcp2, and Vcn2. Examples of the bias signal generating circuit (4408) for generating the bias signals are provided in FIGS. 81 and 82.

As shown in FIG. 81, in one example of the bias signal generating circuit 4408, a plurality of transistor pairs, each consisting of two pMOS transistors 4481 and 4482 connected in series, are provided in parallel and, with the reference voltage (Vr) applied to the gate of one transistor 4481 in each pair, control signals (digital signals) C431 to C43n are applied to the other transistors 4482 in the respective pairs to control the switching operations thereof.

Here, all the transistor pairs (4481, 4482) are connected in common to one end of an nMOS transistor 4483 so that the sum of the currents flowing through the transistor pairs selected by the control signals C431 to C43n flows to the nMOS transistor 4483. Further, the current flowing in the transistor 4483 flows to an nMOS transistor 4484 connected in a current mirror arrangement and also to a pMOS transistor 4485 connected in series to the transistor 4484. The bias signals Vcp1 (Vcp2) and Vcn1 (Vcn2) are thus obtained through the transistors 4485 and 4484 (4483). For the phase interpolator of FIG. 80, two such bias signal generating circuits are needed, one for generating the bias signals Vcp1 and Vcn1 and the other for generating the bias signals Vcp2 and Vcn2, and the weighting control is performed such that when the positive logic control signals C431 to C43n are supplied to the bias signal generating circuit that generates the bias signals Vcp1 and Vcn1, for example, the complements of the control signals, /C431 to /C43n, are supplied to the bias signal generating circuit that generates the bias signals Vcp2 and Vcn2.

In this way, the bias signal generating circuit 4408 shown in FIG. 81 is constructed as a current-output type D/A converter, and the current source at the controlled side obtains a variable constant current by mirroring the current received from the D/A converter by using the current mirror circuit, and generates the bias signals Vcp1 (Vcp2) and Vcn1 (Vcn2) having a prescribed voltage level appropriate to the control signals C431 to C43n. Since the current source at the controlled side can be simplified in configuration, the advantage is that the bias signal generating circuit is realizable with a small amount of circuitry.

FIG. 82 is a circuit diagram showing an alternative example of the bias signal generating circuit in the phase interpolator of FIG. 80.

As shown in FIG. 82, in the alternative example of the bias signal generating circuit 4408, the drain of each of a plurality of pMOS transistors 4486, each supplied with the reference voltage (Vr), is connected to one end (the source) of each of pMOS transistors 4487 and 4488 whose switching operations are controlled by control signals (digital signals) C441 to C44n. Here, the transistors 4487 in the respective transistor pairs are supplied at their gates with the corresponding control signals C441 to C44n, while the transistors 4488 in the respective transistor pairs are supplied at their gates with the control signals (/C441 to /C44n) inverted by respective inverters 4489. Accordingly, in each transistor pair one of the transistors, 4487 or 4488, is ON and the other is OFF.

The other ends (the drains) of the transistors 4487 in the respective transistor pairs are connected in common so that the sum of the currents flowing through the transistors 4487 in the ON state flows to an nMOS transistor 44832; likewise, the other ends of the transistors 4488 in the respective transistor pairs are connected in common so that the sum of the currents flowing through the transistors 4488 in the ON state flows to an nMOS transistor 44831. Then, in the same manner as explained with reference to FIG. 81, the currents flowing through the transistors 44831 and 44832 flow to nMOS transistors 44841 and 44842 respectively connected in a current mirror configuration, and also to pMOS transistors 44851 and 44852 connected in series with the respective transistors 44841 and 448φ2, and the bias signals Vcp1, Vcn1 and Vcp2, Vcn2 are thus obtained.

In this way, in the bias signal generating circuit 4408 shown in FIG. 82, the output of the current-control type D/A converter for controlling the output value of the current source is switched for connection to the complementary output nodes. Here, since the output current of the D/A converter is always maintained constant, the output transistor voltage of the D/A converter is maintained constant, the resulting advantage being that transient response spikes, as seen when the current is interrupted, are eliminated. Further, the current consumption of the current-output type D/A converter can also be reduced (by about one half).

Figure 83:
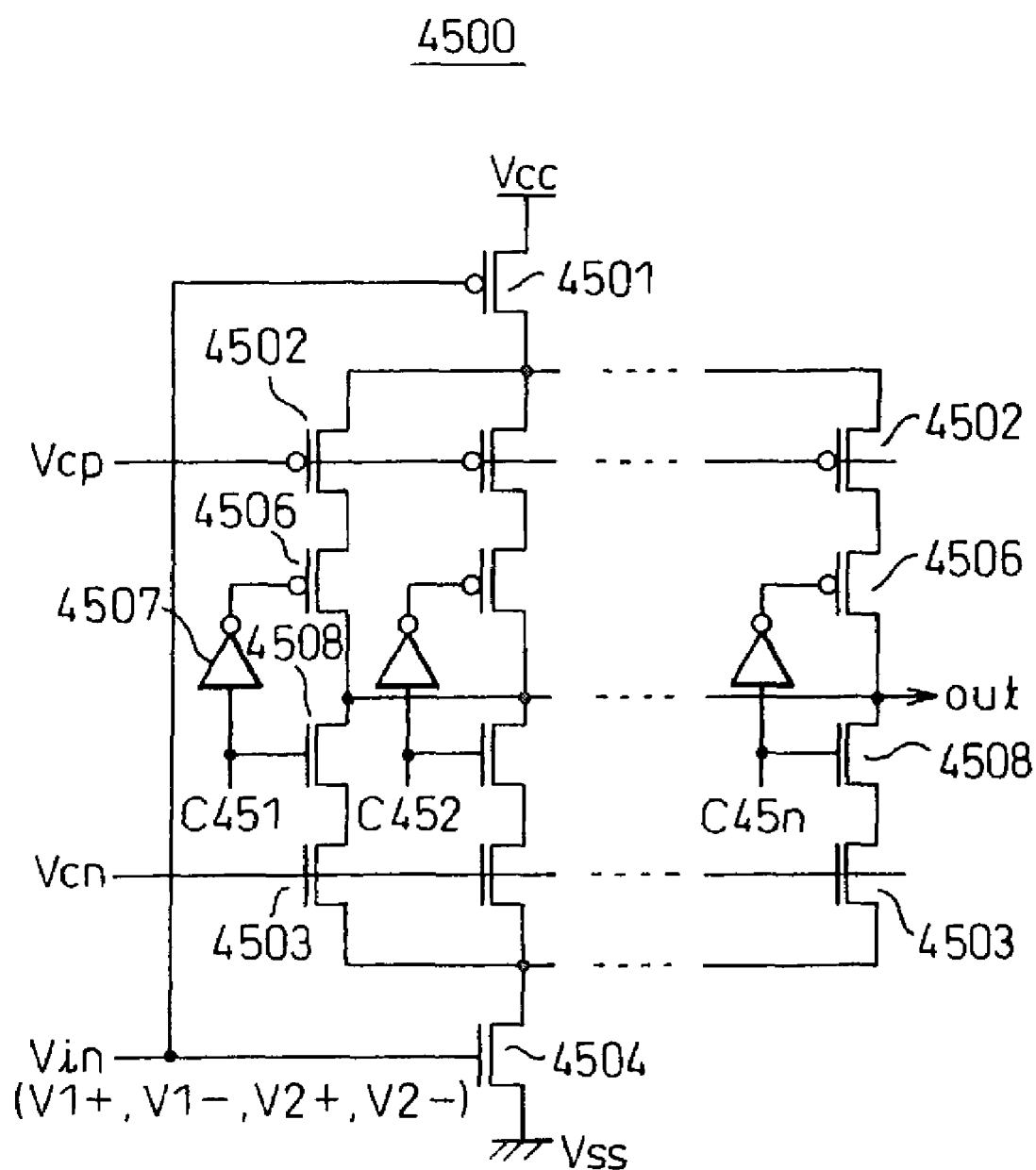
FIG. 83 is a circuit diagram showing a configurational example of a variable current source as a modified example of the 16th embodiment of FIG. 80.

FIG. 83 is a circuit diagram showing the configuration of a variable current source (4500) as a modified example of the 16th embodiment of FIG. 80. This example is applicable to each constant current source (4401 to 4404) in the previously described phase interpolator of FIG. 80. In the current source 4500 shown in FIG. 83, the bias signals (bias voltages) Vcp and Vcn are constant-voltage-level signals, and weighting control is performed using control signals C451 to C45n.

As shown in FIG. 83, the variable current source 4500 of this modified example differs from the constant current source 4401 in FIG. 80 in that the transistors 4501 and 4503 (corresponding to the transistors 4412 and 4413) to which the bias signals Vcp (Vcp1) and Vcn (Vcn1) are supplied are provided in a plurality of pairs and a pMOS transistor 4506 and an nMOS transistor 4508 are provided between the transistors 4501 and 4503 in each pair. Here, the positive logic control signals C451 to C45n are supplied to the gates of the transistors 4508 in the respective pairs, while the control signals (/C451 to /C45n) inverted by respective inverters 4507 are supplied to the gates to the transistors 4506 in the respective pairs. The node between the transistors 4506 and 4508 in each pair is connected in common with the corresponding nodes in the other pairs, to produce an output (output terminal) "out". The output terminal "out" is connected, for example, to one end of the capacitive load (4405 or 4406) and one input terminal of the comparator (4407), as shown in FIG. 80.

In this way, the variable current source of the modified example shown in FIG. 83 controls the number of output transistors (4506 and 4508) in the current mirror to obtain the variable current source, and maintains the gate bias (bias signals Vcp and Vcn) of the current-mirror operating transistors (4502 and 4503) always at a constant level. This serves to enhance the current stability. Further, the variable current source of the modified example has the advantage of excellent linearity because current control is accomplished by controlling the number of transistors.

Figure 84:
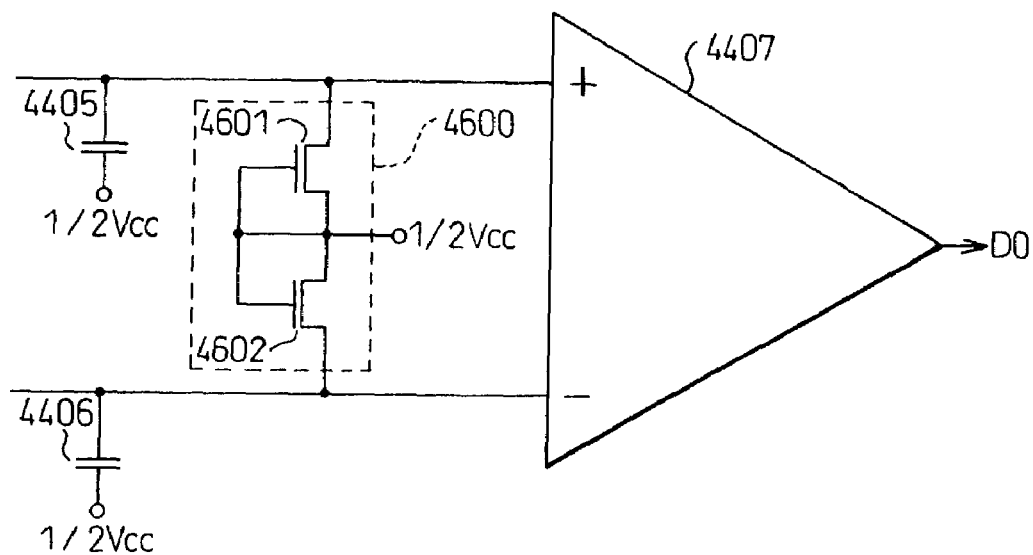
FIG. 84 is a circuit diagram showing a configurational example of a portion of the phase interpolator as a 17th embodiment of the present invention.

FIG. 84 is a circuit diagram showing a configurational example of a portion of the phase interpolator as a 17th embodiment of the present invention, in which a clamp circuit 4600 is provided between the two input terminals of the comparator 4407 in the phase interpolator of FIG. 80.

When the clamp circuit 4600 is provided, for example, between the two input terminals (the nodes where analog waveforms are generated by summing) of the comparator 4407 in the phase interpolator of FIG. 80, as shown in FIG. 84, the common mode potentials of these nodes are maintained constant by the clamp circuit 4600 even if there occurs an unbalance in the current values of the current sources. As a result, the comparator 4407 at the subsequent stage can always perform the compare operation under a constant condition, and timing accuracy can thus be enhanced.

The clamp circuit 4600 shown in FIG. 84 is configured so that ½·Vcc (reference voltage) is applied to the gates of two nMOS transistors 4601 and 4602 connected in series and also to the node between these transistors 4601 and 4602, to clamp the voltage between the two input terminals of the comparator 4407. For the clamp circuit 4600, various configurations other than that shown in FIG. 84 are applicable.

Figure 85:
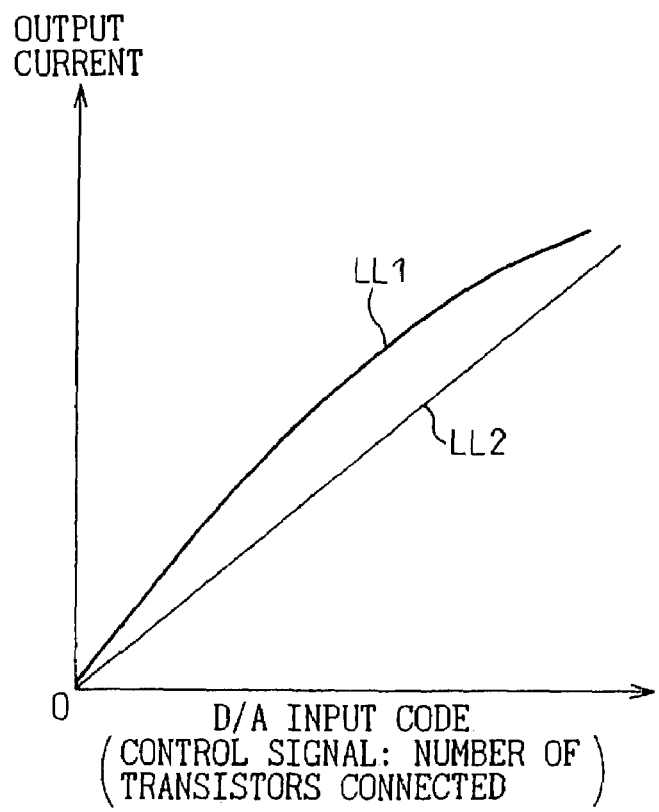
FIG. 85 is a diagram for explaining a configurational example of the phase interpolator as an 18th embodiment of the present invention.

FIG. 85 is a diagram for explaining a configurational example of the phase interpolator as an 18th embodiment of the present invention. In FIG. 85, the horizontal axis represents D/A input code, that is, the number of transistors selected (connected) by control signals, and the vertical axis shows the output current as the sum of the currents flowing through the selected transistors.

As described so far, to accomplish the weighting control for controlling the weighting of each analog periodic waveform, the phase interpolator of the present invention selects a plurality of transistors, for example, of the same size by using control signals (digital signals), thereby controlling the number of transistors to be connected and thus adjusting the current output.

The characteristic curve LL1 in FIG. 85 represents the relationship between the output current and the number of transistors connected when the transistors of the same size are selected by the control signals; as shown, the relationship is represented by a nonlinear curve.

In view of this, in the 18th embodiment, the size of each transistor is adjusted so that the relationship between the output current and the number of transistors controlled by the control signals becomes a linear line (straight line) as shown by the characteristic curve LL2 in FIG. 85.

For example, in the bias signal generating circuit shown in FIG. 81, the number of transistors 4482 to be caused to conduct (connected) is controlled in accordance with the control signals C431 to C43n, and the sum of the currents flowing through the conducting transistors 4482 flows to the transistor 4483. When the 18th embodiment is applied to such configuration, the size of each transistor 4482 (4481) is adjusted so that a linear relationship is maintained between the current (output current) flowing to the transistor 4483 and the number of transistors 4482 conducting in accordance with the control signals C431 to C43n. This transistor size adjustment can be applied not only to the transistors in the above-described current D/A converter but also to the transistors (for example, the transistors 4483, 4484, 4485, etc.) associated with the current mirror circuit, etc. in order to compensate for nonlinear components occurring in the current mirror circuit, etc.

In this way, by applying the 18th embodiment, it becomes possible to further enhance the timing accuracy of the signals that the phase interpolator outputs.

Many different embodiments of the present invention may be constructed without departing from the spirit and scope of the present invention, and it should be understood that the present invention is not limited to the specific embodiments described in this specification, except as defined in the appended claims.

What is claimed is:

1. A timing signal generating circuit comprising:
   a master circuit for generating an internal signal having the same cycle or the same phase as that of an input reference signal on the basis of a control signal generated by feedback control, said master circuit comprising a comparator circuit for comparing the cycle or phase of said internal signal with that of said reference signal, a control signal generating circuit for varying said control signal in accordance with an output of said comparator circuit, and a first variable delay line for outputting said internal signal by controlling a delay amount for said reference signal in accordance with said control signal, said control signal generating circuit including a charge pump circuit for controlling an output voltage level in accordance with an up signal and a down signal from said comparator circuit;
   at least two slave circuits each for generating a timing signal having prescribed timing relative to said reference signal by receiving said internal signal and said control signal from said master circuit, each of said at least two slave circuits comprising a second variable delay line for outputting said timing signal by delaying said internal signal, and a phase interpolator for accepting input signals of different phases and for outputting a finer timing signal of an intermediate phase, without comprising a comparator circuit for comparing the cycle or phase of said internal signal with that of said reference signal, and a control signal generating circuit for varying said control signal in accordance with an output of said comparator circuit; and
   at least two receiver circuits, each receiving the finer timing signal output from corresponding one of said slave circuits, latching a receiving signal and detecting a level of the receiving signal based on the finer timing signal, and feedback controlling a delay value of the input signals to said phase interpolator.

2. A timing signal generating circuit as claimed in claim 1, wherein said master circuit contains a circuit corresponding to one of said at least two slave circuits so that said master circuit also outputs a timing signal by itself.

3. A timing signal generating circuit as claimed in claim 1, wherein said master circuit is a DLL circuit which comprises a coarse delay control block for performing coarse delay control and a fine delay control block for performing fine delay control, and each of said at least two slave circuits contains a circuit corresponding to said fine delay control block.

4. A timing signal generating circuit as claimed in claim 3, wherein said coarse delay control block takes taps off said delay line consisting of a plurality of delay units, and performs coarse delay control by selecting an output of each of said taps, while said fine delay control block receives a signal for controlling the DLL circuit in said coarse delay control block and a signal subjected to said coarse delay control in said coarse delay control block, and performs fine delay control through an interpolator by using said coarse delay control signal.

5. A timing signal generating circuit as claimed in claim 1, wherein said control signal generating circuit includes an up-down counter for counting an up signal and a down signal from said comparator circuit and a D/A converter for performing digital-to-analog conversion on an output of said up-down counter.

6. A timing signal generating circuit as claimed in claim 1, wherein said at least two slave circuits each include an amplifier circuit whose response speed varies in accordance with a signal from said master circuit, and generates a signal of sinusoidal waveform as said timing signal.

7. A timing signal generating circuit as claimed in claim 1, wherein each of said at least two slave circuits are used to generate a timing signal for controlling the timing of one-bit or multiple-bit input or output signals, and said timing signal generating circuit includes timing signal adjusting means, provided common to each of said at least two slave circuits, for adjusting said timing signal so as to increase the S/N ratio of a transmitted and received signal.

8. A timing signal generating circuit as claimed in claim 7, wherein said timing signal adjusting means includes selecting means for selecting an input or output signal of a circuit controlled by said timing signal from each of the at least two slave circuits, and timing signal generating means for controlling output timing of said timing signal by detecting the level of said input or output signal of said circuit selected by said selecting means.

9. A timing signal generating circuit as claimed in claim 1, wherein each of said at least two slave circuits is used to generate a timing signal for controlling the timing of one-bit or multiple-bit input or output signals, and each of said at least two slave circuits includes timing signal adjusting means for adjusting said timing signal so as to increase the S/N ratio of a transmitted and received signal.

10. A semiconductor integrated circuit device employing a timing signal generating circuit comprising a master circuit, at least two slave circuits, and at least two receiver circuits, said master circuit and said slave circuit being formed on the same semiconductor chip used for said semiconductor integrated circuit device, wherein:
    said master circuit generates an internal signal having the same cycle or the same phase as that of an input reference signal on the basis of a control signal generated by feedback control; and
    each of said slave circuits generates a timing signal having prescribed timing relative to said reference signal by receiving said internal signal and said control signal from said master circuit,
    wherein said master circuit comprises:
    a comparator circuit for comparing the cycle of phase of said internal signal with that of said reference signal;
    a control signal generating circuit for varying said control signal in accordance with an output of said comparator circuit, said control signal generating circuit including a charge pump circuit for controlling an output voltage level in accordance with an up signal and a down signal from said comparator circuit; and
    a first variable delay line for outputting said internal signal by controlling a delay amount for said reference signal in accordance with said control signal,
    wherein each of said slave circuits comprises:
    a second variable delay line for outputting said timing signal by delaying said internal signal; and
    a phase interpolator for accepting input signals of different phases and for outputting a finer timing signal of an intermediate phase, without comprising a comparator circuit for comparing the cycle or phase of said internal signal with that of said reference signal, and a control signal generating circuit for varying said control signal in accordance with an output of said comparator circuit,
    and wherein each of said receiver circuits receives the finer timing signal output from corresponding one of said slave circuits, latches a receiving signal and detects a level of the receiving signal based on the finer timing signal, and feedback controls a delay value of the input signals to said phase interpolator.

11. A semiconductor integrated circuit device as claimed in claim 10, wherein said master circuit contains a circuit corresponding to one of said at least two slave circuits so that said master circuit also outputs a timing signal by itself.

12. A semiconductor integrated circuit device as claimed in claim 10, wherein said master circuit is a DLL circuit which comprises a coarse delay control block for performing coarse delay control and a fine delay control block for performing fine delay control, and each of said at least two slave circuits contains a circuit corresponding to said fine delay control block.

13. A semiconductor integrated circuit device as claimed in claim 12, wherein said coarse delay control block takes taps off said delay line consisting of a plurality of delay units, and performs coarse delay control by selecting an output of each of said taps, while said fine delay control block receives a signal for controlling the DLL circuit in said coarse delay control block and a signal subjected to said coarse delay control in said coarse delay control block, and performs fine delay control through an interpolator by using said coarse delay control signal.

14. A semiconductor integrated circuit device as claimed in claim 10, wherein said control signal generating circuit includes an up-down counter for counting an up signal and a down signal from said comparator circuit and a D/A converter for performing digital-to-analog conversion on an output of said up-down counter.

15. A semiconductor integrated circuit device as claimed in claim 10, wherein each of said at least two slave circuits includes a variable delay line for outputting said timing signal by delaying said internal signal in accordance with said control signal from said master circuit.

16. A semiconductor integrated circuit device as claimed in claim 10, wherein each of said at least two slave circuits includes an amplifier circuit whose response speed varies in accordance with a signal from said master circuit, and generates a signal of sinusoidal waveform as said timing signal.

17. A semiconductor integrated circuit device as claimed in claim 10, wherein each of said at least two slave circuits is used to generate a timing signal for controlling the timing of one-bit or multiple-bit input or output signals, and said timing signal generating circuit includes timing signal adjusting means, provided common to each of said at least two slave circuits, for adjusting said timing signal so as to increase the S/N ratio of a transmitted and received signal.

18. A semiconductor integrated circuit device as claimed in claim 17, wherein said timing signal adjusting means includes selecting means for selecting an input or output signal of a circuit controlled by said timing signal from each of said at least two slave circuits, and timing signal generating means for controlling output timing of said timing signal by detecting the level of said input or output signal of said circuit selected by said selecting means.

19. A semiconductor integrated circuit device as claimed in claim 10, wherein each of said at least two slave circuits is used to generate a timing signal for controlling the timing of one-bit or multiple-bit input or output signals, and each of said at least two slave circuits includes timing signal adjusting means for adjusting said timing signal so as to increase the S/N ratio of a transmitted and received signal.

20. A semiconductor integrated circuit system employing a timing signal generating circuit comprising a master circuit, at least two slave circuits, and at least two receiver circuits, said semiconductor integrated circuit system having a plurality of semiconductor integrated circuit devices, each of said semiconductor integrated circuit devices having said master circuit and/or said slave circuit and being formed on corresponding one semiconductor chip, wherein:
said master circuit generates an internal signal having the same cycle or the same phase as that of an input reference signal on the basis of a control signal generated by feedback control, and said master circuit is a DLL circuit which comprises a coarse delay control block for performing coarse delay control and a fine delay control block for performing fine delay control, said master circuit comprising a comparator circuit for comparing the cycle or phase of said internal signal with that of said reference signal, a control signal generating circuit for varying said control signal in accordance with an output of said comparator circuit, and a variable delay line for outputting said internal signal by controlling a delay amount for said reference signal in accordance with said control signal, said control signal generating circuit including a charge pump circuit for controlling an output voltage level in accordance with an up signal and down signal from said comparator circuit;
each of said at least two slave circuits includes a phase interpolator for accepting input signals of different phases and for outputting a finer timing signal of an intermediate phase, and generates a timing signal having prescribed timing relative to said reference signal by receiving said internal signal and said control signal from said master circuit, without containing a circuit corresponding to said coarse delay control block for performing course delay control; and
each of said at least two receiver circuits receives the finer timing signal output from corresponding one of said slave circuits, latches a receiving signal and detects a level of the receiving signal based on the finer timing signal, and feedback controls a delay value of the input signals to said phase interpolator.

21. A semiconductor integrated circuit system as claimed in claim 20, wherein said master circuit contains a circuit corresponding to one of said at least two slave circuits so that said master circuit also outputs a timing signal by itself.

22. A semiconductor integrated circuit system as claimed in claim 20, wherein said coarse delay control block takes taps off said delay line consisting of a plurality of delay units, and performs coarse delay control by selecting an output of each of said taps, while said fine delay control block receives a signal for controlling the DLL circuit in said coarse delay control block and a signal subjected to said coarse delay control in said coarse delay control block, and performs fine delay control through an interpolator by using said coarse delay control signal.

23. A semiconductor integrated circuit system as claimed in claim 20, wherein said control signal generating circuit includes an up-down counter for counting an up signal and a down signal from said comparator circuit and a D/A converter for performing digital-to-analog conversion on an output of said up-down counter.

24. A semiconductor integrated circuit system as claimed in claim 20, wherein each of said at least two slave circuits includes a variable delay line for outputting said timing signal by delaying said internal signal in accordance with said control signal from said master circuit.

25. A semiconductor integrated circuit system as claimed in claim 20, wherein each of said at least two slave circuits includes an amplifier circuit whose response speed varies in accordance with a signal from said master circuit, and generates a signal of sinusoidal waveform as said timing signal.

26. A semiconductor integrated circuit system as claimed in claim 20, wherein each of said at least two slave circuits is used to generate a timing signal for controlling the timing of one-bit or multiple-bit input or output signals, and said timing signal generating circuit includes timing signal adjusting means, provided common to each of said at least two slave circuits, for adjusting said timing signal so as to increase the S/N ratio of a transmitted and received signal.

27. A semiconductor integrated circuit system as claimed in claim 26, wherein said timing signal adjusting means includes selecting means for selecting an input or output signal of a circuit controlled by said timing signal from each of said at least two slave circuits, and timing signal generating means for controlling output timing of said timing signal by detecting the level of said input or output signal of said circuit selected by said selecting means.

28. A semiconductor integrated circuit system as claimed in claim 20, wherein each of said at least two slave circuits is used to generate a timing signal for controlling the timing of one-bit or multiple-bit input or output signals, and each of said at least two slave circuits includes timing signal adjusting means for adjusting said timing signal so as to increase the S/N ratio of a transmitted and received signal.

* * * * *